US012688868B2

(12) United States Patent　　(10) Patent No.:　US 12,688,868 B2
Yanagisawa　　(45) Date of Patent:　Jul. 21, 2026

(54) MANUFACTURING METHOD OF CONDUCTIVE PROBE

(71) Applicant: Resonac Hard Disk Corporation, Chiba (JP)

(72) Inventor: Masaaki Yanagisawa, Tokyo (JP)

(73) Assignee: Resonac Hard Disk Corporation, Chiba (JP)

( * ) Notice: Subject to any disclaimer, the term of this patent is extended or adjusted under 35 U.S.C. 154(b) by 0 days.

(21) Appl. No.: 19/197,291

(22) Filed: May 2, 2025

(65) Prior Publication Data

US 2025/0266060 A1　　Aug. 21, 2025

Related U.S. Application Data

(60) Division of application No. 18/636,662, filed on Apr. 16, 2024, now Pat. No. 12,322,427, which is a
(Continued)

(30) Foreign Application Priority Data

Dec. 28, 2020　(JP) ................................. 2020-219654
Dec. 28, 2020　(JP) ................................. 2020-219655
(Continued)

(51) Int. Cl.
　*G11B 5/31*　　(2006.01)
　*G11B 9/02*　　(2006.01)
(Continued)

(52) U.S. Cl.
　CPC .............. *G11B 5/3163* (2013.01); *G11B 9/02* (2013.01); *G11C 11/22* (2013.01); *G11C 11/221* (2013.01);
(Continued)

(58) Field of Classification Search
None
See application file for complete search history.

(56) References Cited

U.S. PATENT DOCUMENTS 11,705,157 B2　7/2023　Yanagisawa
2001/0006435 A1　7/2001　Ichihara et al.
(Continued)

FOREIGN PATENT DOCUMENTS

JP　H09-198729　7/1997
JP　H09-307073　11/1997
(Continued)

OTHER PUBLICATIONS

Onaya Takashi et al: "Ferroelectricity of HfxZr1-xO2 thin films fabricated by 300° C. low temperature process with plasma-enhanced atomic layer deposition", Microelectronic Engineering, Elsevier Publishers BV., Amsterdam, NL, vol. 215, May 29, 2019 (May 29, 2019), XP085739086, ISSN : 0167-9317, DOI : 10. 1016/J.MEE.2019. 111013 [retrieved on May 29, 2019].
(Continued)

*Primary Examiner* — Craig A. Renner
(74) *Attorney, Agent, or Firm* — IPUSA, PLLC

(57)　　　　ABSTRACT

A manufacturing method of a conductive probe that is configured to write information to and read information from a ferroelectric recording medium is provided. The manufacturing method includes: forming, on a conductive material, an insulating layer by oxidizing the conductive material; forming an isolation layer on the insulating layer; applying a photoresist on the isolation layer; forming a hole in the photoresist; etching in the hole to the conductive material; depositing metal on a surface of the conductive material in the hole, thereby obtaining a needle-shaped
(Continued)

electrode; and removing the isolation layer. A portion of the needle-shaped electrode protrudes from the surface of the insulating layer.

2 Claims, 24 Drawing Sheets

Related U.S. Application Data continuation of application No. 18/316,641, filed on May 12, 2023, now Pat. No. 11,990,166, which is a division of application No. 17/557,537, filed on Dec. 21, 2021, now Pat. No. 11,705,157.

(30) Foreign Application Priority Data

| | | |
|---|---|---|
| Dec. 28, 2020 | (JP) | 2020-219656 |
| Dec. 28, 2020 | (JP) | 2020-219657 |
| Dec. 28, 2020 | (JP) | 2020-219658 |
| Dec. 28, 2020 | (JP) | 2020-219659 |
| Dec. 28, 2020 | (JP) | 2020-219660 |
| Dec. 28, 2020 | (JP) | 2020-219661 |
| Dec. 28, 2020 | (JP) | 2020-219662 |
| Dec. 28, 2020 | (JP) | 2020-219663 |
| Dec. 28, 2020 | (JP) | 2020-219664 |
| Dec. 28, 2020 | (JP) | 2020-219665 |
| Mar. 24, 2021 | (JP) | 2021-050640 |
| Mar. 24, 2021 | (JP) | 2021-050641 |
| Apr. 14, 2021 | (JP) | 2021-068376 |
| Jun. 14, 2021 | (JP) | 2021-098592 |
| Jun. 17, 2021 | (JP) | 2021-101046 |
| Jul. 16, 2021 | (JP) | 2021-117508 |
| Sep. 29, 2021 | (JP) | 2021-160168 |

(51) Int. Cl.
*G11C 11/22* (2006.01)
*G11C 11/56* (2006.01)
*G11B 5/00* (2006.01)

(52) U.S. Cl.
CPC .. *G11C 11/5657* (2013.01); *G11B 2005/0002* (2013.01); *Y10T 29/49032* (2015.01)

(56) References Cited

U.S. PATENT DOCUMENTS

| | | | |
|---|---|---|---|
| 2003/0099054 A1 | 5/2003 | Kamijima | |
| 2004/0027935 A1 | 2/2004 | Cho et al. | |
| 2004/0042351 A1 | 3/2004 | Onoe et al. | |
| 2004/0105373 A1 | 6/2004 | Maeda et al. | |
| 2004/0105380 A1 | 6/2004 | Cho et al. | |
| 2004/0215644 A1 | 10/2004 | Edwards, Jr. et al. | |
| 2005/0122886 A1 | 6/2005 | Takahashi et al. | |
| 2005/0128886 A1* | 6/2005 | Ogawa et al. | G11B 9/14 369/126 |
| 2006/0044661 A1 | 3/2006 | Ogawa et al. | |
| 2007/0274193 A1 | 11/2007 | Akiyama et al. | |
| 2008/0068937 A1 | 3/2008 | Ogawa et al. | |
| 2008/0279062 A1 | 11/2008 | Jeon et al. | |
| 2009/0021975 A1 | 1/2009 | Rao et al. | |
| 2009/0155931 A1 | 6/2009 | Ma et al. | |
| 2009/0168238 A1 | 7/2009 | Kim et al. | |
| 2010/0002563 A1 | 1/2010 | Kim et al. | |
| 2015/0370827 A1 | 12/2015 | Parkison et al. | |
| 2018/0366547 A1 | 12/2018 | Liu | |
| 2019/0138893 A1 | 5/2019 | Sharma et al. | |
| 2022/0178012 A1 | 6/2022 | Funakubo et al. | |

FOREIGN PATENT DOCUMENTS

| | | |
|---|---|---|
| JP | 2001-208069 | 8/2001 |
| JP | 2003-168274 | 6/2003 |
| JP | 2004-014016 | 1/2004 |
| JP | 2004-171622 | 6/2004 |
| JP | 2004-178750 | 6/2004 |
| JP | 2005-149647 | 6/2005 |
| JP | 2005-158117 | 6/2005 |
| JP | 2007-272961 | 10/2007 |
| JP | 2009-004054 | 1/2009 |
| JP | 2014-013645 | 1/2014 |
| WO | 2016/031986 | 3/2016 |
| WO | 2020/218617 | 10/2020 |

OTHER PUBLICATIONS

Onaya Takashi et al: "Improvement in ferroelectricity of HfxZr1-xO2 thin films using ZrO2 seed layer", Applied Physics Express, [Online] vol. 10, No. 8, Jul. 13, 2017 (Jul. 13, 2017), pp. 081501-1-081501-4, XP055913780, JP ISSN : 1882-0778, DOI : 10.7567/APEX. 10.081501 Retrieved from the Internet : URL:http://stacks.iop.org/1882-0786/10/i=8/a=081501?key=crossref.14447345a24d2624f43d706a6cc25330> [retrieved on Apr. 20, 2022].

* cited by examiner

FIG.1

CURVATURE RADIUS r OF CONDUCTIVE PROBE 17 [mm]

L12    L11

23

28C

27B(27)

28B-1

28A-2

27A(27)

28A-1

26

271

X ◄——⊗Y

Z

L22    L21

23

28C

27B(27)

28B-2

28A-2

27A(27)

28A-1

26

271

Y⊙——►X

Z (a)

(b)

(c)

(d)

(a)

(b)

(c)

(d)

(e)

STORAGE AREA

STORAGE AREA

STORAGE AREA

STORAGE AREA

STORAGE AREA

STORAGE AREA

STORAGE AREA

MANUFACTURING METHOD OF CONDUCTIVE PROBE

CROSS-REFERENCE TO RELATED APPLICATIONS

This application is a divisional application of and claims the benefit of priority under 35 U.S.C. 120 of U.S. patent application Ser. No. 18/636,662 filed on Apr. 16, 2024, which is a continuation application of and claims the benefit of priority under 35 U.S.C. 120 of U.S. patent application Ser. No. 18/316,641 filed on May 12, 2023, which is a divisional application of U.S. patent application Ser. No. 17/557,537 filed on Dec. 21, 2021, which claims priority to Japanese Patent Application No. 2020-219654 filed on Dec. 28, 2020, Japanese Patent Application No. 2020-219655 filed on Dec. 28, 2020, Japanese Patent Application No. 2020-219656 filed on Dec. 28, 2020, Japanese Patent Application No. 2020-219657 filed on Dec. 28, 2020, Japanese Patent Application No. 2020-219658 filed on Dec. 28, 2020, Japanese Patent Application No. 2020-219659 filed on Dec. 28, 2020, Japanese Patent Application No. 2020-219660 filed on Dec. 28, 2020, Japanese Patent Application No. 2020-219661 filed on Dec. 28, 2020, Japanese Patent Application No. 2020-219662 filed on Dec. 28, 2020, Japanese Patent Application No. 2020-219663 filed on Dec. 28, 2020, Japanese Patent Application No. 2020-219664 filed on Dec. 28, 2020, Japanese Patent Application No. 2020-219665 filed on Dec. 28, 2020, Japanese Patent Application No. 2021-050640 filed on Mar. 24, 2021, Japanese Patent Application No. 2021-050641 filed on Mar. 24, 2021, Japanese Patent Application No. 2021-068376 filed on Apr. 14, 2021, Japanese Patent Application No. 2021-098592 filed on Jun. 14, 2021, Japanese Patent Application No. 2021-101046 filed on Jun. 17, 2021, Japanese Patent Application No. 2021-117508 filed on Jul. 16, 2021, and Japanese Patent Application No. 2021-160168 filed on Sep. 29, 2021. The entire contents of all of the aforementioned applications are incorporated herein by reference.

BACKGROUND

Field

The present invention relates to a manufacturing method of a conductive probe.

Related Art

As a recording medium for a hard disk drive and various recording media, there is a ferroelectric recording medium that can repeatedly record information by changing the polarization of a ferroelectric. The ferroelectric recording medium is an ultra-high-density recording medium that includes a ferroelectric layer and that achieves a high recording capacity by using the spontaneous polarization of the ferroelectric caused by the application of an external electric field. Because the capacity of the ferroelectric recording medium can be increased, the development of a ferroelectric storage apparatus including the ferroelectric recording medium is being studied.

Patent Document 1 discloses a dielectric recording-and-reproduction apparatus that applies an alternating current electric field to the dielectric material constituting a dielectric recording medium and that reproduces information recorded in the dielectric recording medium with non-linear dielectric property of the dielectric material.

Patent Document 2 discloses an information storage apparatus that includes a recording medium, including an electrode layer and a ferroelectric layer provided on an insulating substrate, attached to a spindle and that records information to the recording medium and reproduces information from the recording medium by holding a header slider attached to a header assembly above the surface of the recording medium by a predetermined distance, and also indicates that a semiconductor sensor is used to read information. Also, Patent Document 2 discloses, as the material of the ferroelectric layer, materials having Perovskite structures such as lead titanate, barium titanate, strontium titanate, and strontium barium titanate; lithium tantalate; lithium niobate; and the like.

Patent Document 3 discloses an information recording reading header that includes a circular guard surrounding the portion around the tip portion to prevent dust from coming into contact with and colliding with the probe and that moves the probe in a direction substantially orthogonal to the recording surface by using a piezoelectric material as movement means.

Patent Document 4 discloses a recording-and-reproduction header that includes a protruding portion vertically provided on a support such that the tip faces the dielectric recording medium, wherein the protruding portion has a ridge line at the tip, and the protruding portion is formed using a mold formed by anisotropic etching.

Patent Document 5 discloses a memory apparatus including a dielectric laminate body formed by laminating a ferroelectric and a paraelectric.

Patent Document 6 discloses a dielectric recording-and-reproduction header that forms, with a probe and bias electrodes, a polarized domain having a polarization direction parallel to the surface of a dielectric recording medium by applying a voltage, corresponding to data, across the probe and the bias electrodes, so that four types of data are recorded to a predetermined portion of the dielectric recording medium, and multi-value information is recorded.

RELATED-ART DOCUMENTS

Patent Document

Patent Document 1: Japanese Patent Laid-Open No. 2004-14016

Patent Document 2: Japanese Patent Laid-Open No. 2007-272961

Patent Document 3: Japanese Patent Laid-Open No. 2004-171622

Patent Document 4: Japanese Patent Laid-Open No. 2005-158117

Patent Document 5: Japanese Patent Laid-Open No. H9-307073

Patent Document 6: Japanese Patent Laid-Open No. 2004-178750

Problems to be Solved by the Invention

Progress is being made in storage services that use ultra-high-speed communication techniques. In the storage services, various devices such as computers and communication terminals are connected to the storage via the Internet, and various kinds of information are shared. Optical fibers are commonly used for these communications, and the communication speeds exceed 10 Gbps (gigabits per second).

In environments where it is difficult to provide optical fibers and in mobiles, wireless and mobile communication over 10 Gbps, which is termed as 5G, is studied, and application to 6G communication over 100 Gbps is also studied.

In these storage services, recording media such as a hard disk drive (HDD) and a flash memory (such as a solid state drive, SSD) are mainly used as storage. The transfer speed of the HDD is generally about 1 Gbps, and the transfer speed of the SSD is generally about 3 Gbps. Therefore, it is difficult for a single storage to satisfy the strict input-and-output requirements for ultra-high-speed communication. In addition, the capacity required for the storage has been constantly increasing.

In addition, as global warming becomes a major social problem, there is concern that electricity consumption will increase as the use of storage services expands. Therefore, there is a demand for an efficient storage that consumes less energy with respect to the unit storage capacity and can reduce the environmental load.

Ferroelectric storage apparatuses can achieve a high transfer speed and a high storage capacity by laminating a large number of ferroelectric recording media with a high recording density and rotating them at a high speed. For that purpose, it is necessary to manufacture a sharp probe with good reproducibility, bring the probe close to the surface of the recording medium in an order of nanometers, and read and write information.

However, in the dielectric recording-and-reproduction apparatus of Patent Document 1, when an external electric field is applied to the ferroelectric layer, an alternating current electric field is used. Therefore, when information stored in the ferroelectric layer of the ferroelectric recording medium is read with the probe, the read speed is limited by the frequency of the alternating current electric field, and therefore, there is a problem in that information cannot be read at a frequency equal to or more than the frequency of the alternating current electric field. Furthermore, dielectric materials with non-linear dielectric properties that can be read at a high speed are limited. Still furthermore, it used to be difficult to manufacture a probe of a header that can perform reading and writing stably, and it used to be difficult to control the distance between the probe and the ferroelectric layer at a high speed with a high accuracy.

In the reading method of information described in Patent Document 2, there is a problem in that the electric field obtained from the ferroelectric layer is weak and accordingly the sensitivity of the semiconductor sensor is low. In addition, it used to be difficult to form a ferroelectric single-crystal thin film used as a ferroelectric layer. Furthermore, it used to be difficult to obtain a needle-shaped electrode with the tip portion sharpened that is used to write information.

In the memory apparatus described in Patent Document 5, it used to be difficult to detect a weak tunnel current flowing between the probe and the ferroelectric layer.

In the techniques described in Patent Documents 3, 4, and 6, it has not been studied to read, at a high speed, information stored in the ferroelectric layer with a high record density.

Therefore, in the conventional techniques, a storage apparatus capable of reading, at a high speed, information stored in the ferroelectric layer with a high record density cannot be obtained.

SUMMARY

It is an object of one aspect of the present invention to provide a ferroelectric recording medium capable of reading, at a high speed, information stored in a ferroelectric recording medium with a high record density, capable of reducing the size with respect to the unit storage capacity, and capable of alleviating the increase in the energy consumption.

Means for Solving the Problems

In an aspect of the present invention, a manufacturing method of a conductive probe that is configured to write information to and read information from a ferroelectric recording medium is provided. The manufacturing method includes: forming, on a conductive material, an insulating layer by oxidizing the conductive material; forming an isolation layer on the insulating layer; applying a photoresist on the isolation layer; forming a hole in the photoresist; etching in the hole to the conductive material; depositing metal on a surface of the conductive material in the hole, thereby obtaining a needle-shaped electrode; and removing the isolation layer. A portion of the needle-shaped electrode protrudes from the surface of the insulating layer.

Advantageous Effects of the Invention

An aspect of a ferroelectric recording medium manufactured according to the present invention is capable of reading, at a high speed, information stored in a ferroelectric recording medium with a high record density, capable of reducing the size with respect to the unit storage capacity, and capable of alleviating the increase in the energy consumption.

BRIEF DESCRIPTION OF THE DRAWINGS

FIG. 1 is a partial cross-sectional view illustrating a configuration of a ferroelectric recording medium according to an embodiment of the present invention.

DETAILED DESCRIPTION

Figure 2:
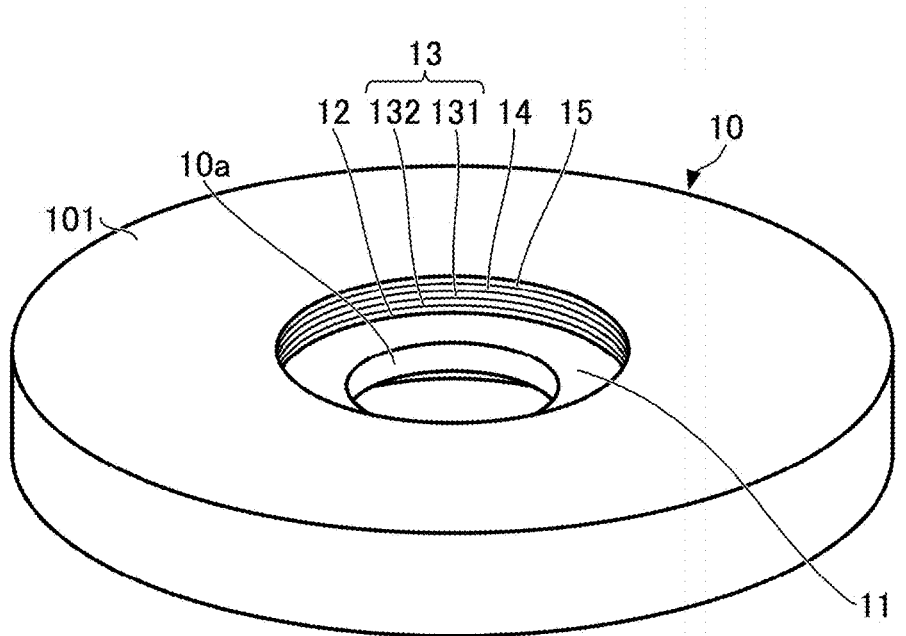
FIG. 2 is a perspective view illustrating the ferroelectric recording medium according to the embodiment of the present invention.

The embodiment of the present invention is described in detail below. In order to facilitate the understanding of the explanation, the same components in the drawings are denoted with the same reference numerals, and duplicate explanation thereabout is omitted. The scales of the components in the drawings may differ from the actual scales. In the present specification, a numerical range "A to B" is assumed to be inclusive, i.e., the numerical values A and B recited before and after the term "to" are assumed to be included, as the lower limit value and the upper limit value, respectively, of the numerical range.

<Ferroelectric Recording Medium>

Figure 1:
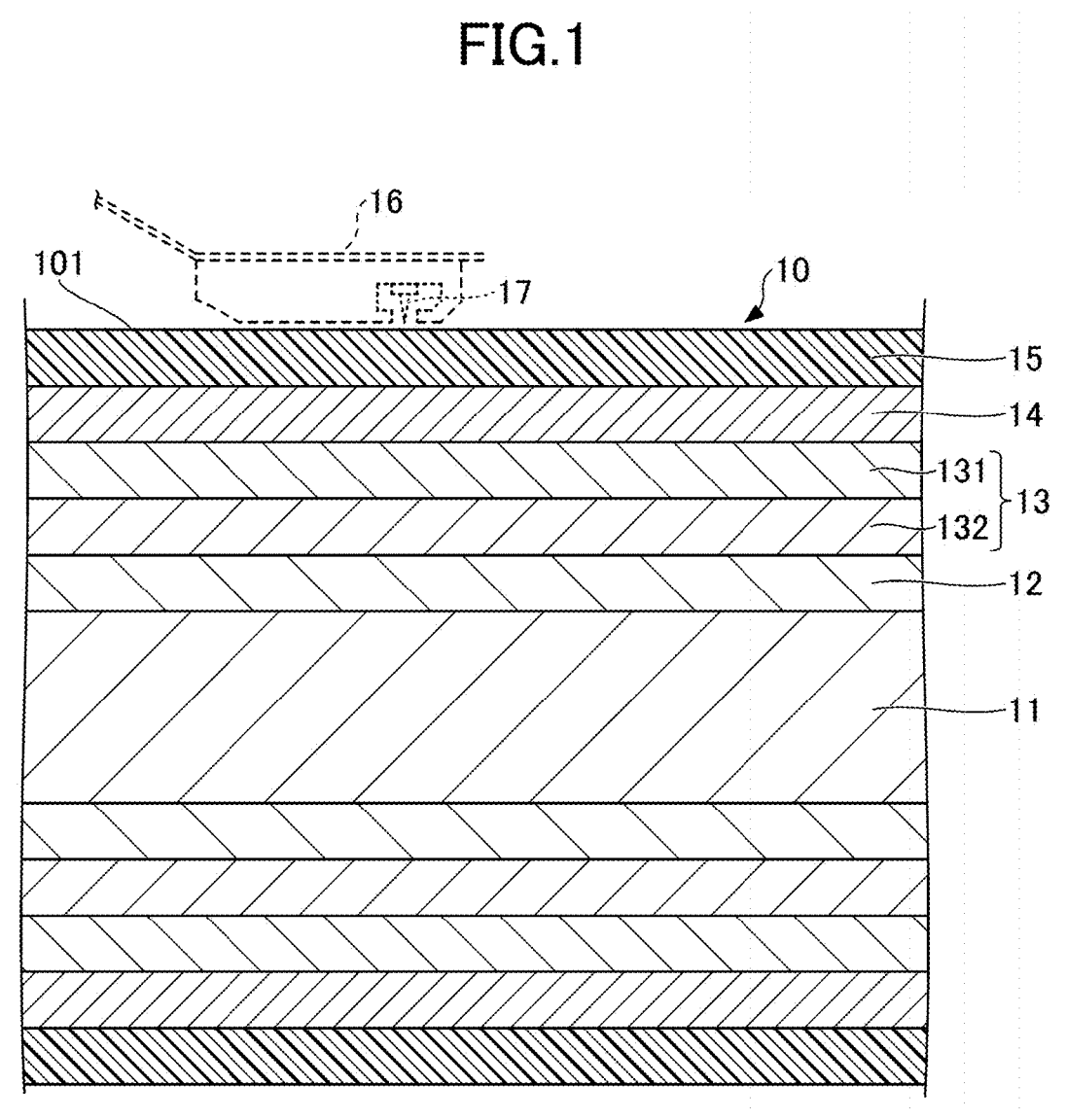
Figure 3:
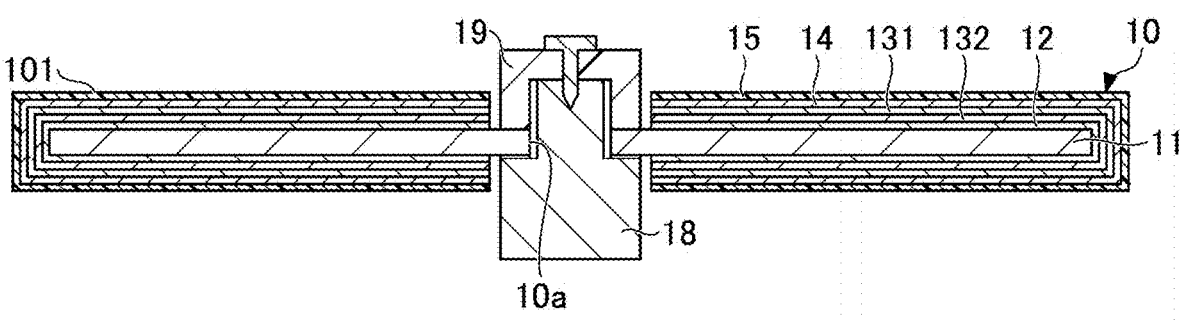
FIG. 3 is a cross-sectional view illustrating an example of the ferroelectric recording medium according to the embodiment of the present invention into which a spindle shaft of an information recording apparatus is inserted.

A ferroelectric recording medium according to an embodiment of the present invention is explained. FIG. 1 is a partial cross-sectional view illustrating a configuration of the ferroelectric recording medium according to the embodiment of the present invention. FIG. 2 is a perspective view illustrating the ferroelectric recording medium according to the embodiment of the present invention. FIG. 3 is a cross-sectional view illustrating an example of a ferroelectric recording medium according to the embodiment of the present invention into which a spindle shaft of an information recording apparatus is inserted. As illustrated in FIG. 1, a ferroelectric recording medium 10 includes a substrate 11, an electrode layer 12, a ferroelectric recording layer 13, a protection layer 14, and a lubricant layer 15, such that the electrode layer 12, the ferroelectric recording layer 13, the protection layer 14, and the lubricant layer 15 are laminated in this order on the substrate 11. In proximity to a surface (principal surface) 101 of the ferroelectric recording medium 10, a conductive probe 17 attached to a side of a probe slider 16 facing the ferroelectric recording medium 10 is provided, and the conductive probe 17 records (writes) information to and reproduces (reads) information from a ferroelectric layer 131 included in the ferroelectric recording layer 13.

As illustrated in FIG. 2, the ferroelectric recording medium 10 is formed in a disk shape including an opening portion 10a in a central portion of the principal surface. As illustrated in FIG. 3, a spindle shaft 18 of a ferroelectric recording medium driving unit for rotating the ferroelectric recording medium 10 is inserted into the opening portion 10a of the ferroelectric recording medium 10, so that the ferroelectric recording medium 10 is fixed to the spindle shaft 18.

As illustrated in FIG. 3, on both of the upper and lower surfaces of the substrate 11, the ferroelectric recording medium 10 includes ferroelectric recording layers 13 (including the ferroelectric layer 131 and the paraelectric layer 132), so that information can be recorded to both of the upper and lower surfaces of the substrate 11 (double-side recording). Alternatively, the ferroelectric recording medium 10 may include a ferroelectric recording layer 13 only on one of the upper surface or the lower surface of the substrate 11, so that information is recorded to only one side of the substrate 11 (single-side recording).

[Substrate]

The substrate 11 has a function of holding the electrode layer 12, the ferroelectric recording layer 13, the protection layer 14, and the lubricant layer 15.

The electrical property of the substrate 11 is not particularly limited, and may be either an insulator or a conductor.

Examples of the insulator include glass, silicon, magnesium oxide (MgO), sapphire, and the like.

Examples of the conductor include: metal materials such as aluminum and its alloys, chromium, platinum, gold, silver, and iron; oxides such as indium oxide ($InO_2$); and the like. Also, silicon imparted with conductivity by doping can be used.

In a case where the substrate 11 is a conductor, the substrate 11 can achieve the function of the electrode layer 12. Therefore, in a case where the electrode layer 12 is not provided on the substrate 11, the material constituting the substrate 11 is preferably a conductor.

It is preferable that the substrate 11 does not appreciably have waviness, has smoothness, and does not appreciably flutter during high-speed rotation.

The thickness of the substrate 11 is not particularly limited so long as the purpose can be achieved, and is preferably, for example, 100 μm to 1 mm.

In view of the lattice matching with the ferroelectric layer 131, the material constituting the substrate 11 is preferably such that the lattice constant of the material constituting the ferroelectric layer 131 and the lattice constant of the material constituting the substrate 11 are lattice-matched within a range of ±10%. Accordingly, the crystallinity of the ferroelectric layer 131 is increased, and the recording density of the ferroelectric recording medium can be increased.

The crystal system of the material constituting the substrate 11 is preferably the same as the crystal system of the material of the ferroelectric layer 131. The crystal type of the material constituting the substrate 11 is preferably the same as the crystal type of the material of the ferroelectric layer 131. The material constituting the substrate 11 and the material of the ferroelectric layer 131 may be the same as each other with respect to any one of the crystal system and the crystal type, and are, most preferably, the same as each other with respect to both of the crystal system and the crystal type. Accordingly, the crystallinity of the ferroelectric layer 131 can be increased, and the recording density of the ferroelectric recording medium can be increased.

In this case, according to the classification that determines the symmetry of the crystal, examples of crystal systems include a triclinic crystal system, a monoclinic crystal system, an orthorhombic crystal system, a tetragonal crystal system, a hexagonal crystal system, a cubic crystal system, and the like. The material constituting the substrate 11 and the material of the ferroelectric layer 131 preferably have a same crystal system.

According to the classification based on close-packed structures of crystals, examples of crystal structures include a simple cubic lattice structure, a face-centered cubic lattice structure, a body-centered cubic lattice structure, a hexagonal close-packed structure, a diamond structure, a white tin type structure, a graphite structure, an A15 type structure, a sodium chloride type structure, a cesium chloride type structure, a zincblende structure, a wurtzite type structure, a nickel arsenide type structure, a lead monoxide type structure, a fluorite type structure, a pyrite type structure, a cuprite type structure, a rutile type structure, a cadmium iodide type structure, a bismuth fluoride type structure, a rhenium oxide type structure, a $Ni_4Mo$ type structure, an $Al_4Ba$ type structure, a calcium boride type structure, a $CaCu_5$ type structure, a corundum type structure, a Perovskite type structure, a ullmannite type structure, a spinel type structure, a silver phosphate type structure, a CuAuI type structure, a K4 crystal structure, and the like. The material constituting the substrate 11 and the material of the ferroelectric layer 131 preferably have a same crystal structure.

For example, in a case where hafnium oxide is selected for the ferroelectric layer 131, hafnium oxide has the orthorhombic crystal system, has the fluorite type structure, and has lattice constants a, b, and c of 5.30 Å, 5.11 Å, and 5.10 Å, respectively. However, the crystal system of hafnium oxide is known to change from the monoclinic crystal system that is the stable phase to the tetragonal crystal system and further to the cubic crystal system. These crystal systems do not exhibit ferroelectricity, and therefore, it is important to change hafnium oxide from the cubic crystal system to the orthorhombic crystal system by thermal treatment and the like to make hafnium oxide into a ferroelectric.

Therefore, the material constituting the substrate 11 preferably has a lattice constant of 4.6 Å to 5.8 Å so as to achieve a lattice-match within a range of ±10%, and the crystal system thereof is preferably any one of the orthorhombic crystal system, the monoclinic crystal system, the tetragonal crystal system, and the cubic crystal system, and is more preferably, either the orthorhombic crystal system or the cubic crystal system. Also, it is preferable to use a material of which the crystal structure is the fluorite type structure. Examples of such materials include silicon, Ge, Pd, $CeO_2$, and the like. Silicon has lattice constants a, b, and c of 5.4 Å, and has the cubic crystal system. Ge has a lattice constant of 5.7 Å, and has the cubic crystal system. Pd has a lattice constant of 5.0 Å, and has the cubic crystal system. $CeO_2$ has a lattice constant of 5.4 Å, and has the cubic crystal system.

[Electrode Layer]

The electrode layer 12 can be provided on the substrate 11. The electrode layer 12 is provided on the lower side of the ferroelectric recording layer 13 (an opposite side from the conductive probe 17), so that the electrode layer 12 can function as a counter electrode of the conductive probe 17 that reads information from or writes information to the ferroelectric recording layer 13.

In view of the lattice match with the ferroelectric layer 131 of the ferroelectric recording layer 13, the material constituting the electrode layer 12 is preferably the same as the ferroelectric layer 131 in any one of or both of the crystal system and the crystal type. Accordingly, the crystallinity of the ferroelectric layer 131 can be increased, and the recording density of the ferroelectric recording medium can be increased.

The lattice constant of the material constituting the electrode layer 12 is preferably lattice-matched within a range of ±10% with respect to the lattice constant of the material of the ferroelectric layer 131. Accordingly, the crystallinity of the ferroelectric layer 131 can be increased, and the recording density of the ferroelectric recording medium can be increased.

The ferroelectric layer 131 is preferably a single-crystal film.

The material constituting the electrode layer 12 can be appropriately selected according to the material of the ferroelectric layer 131, and may be constituted by, for example, metal materials such as aluminum, chromium, platinum, gold, silver, and iron; oxides such as $InO_2$; and the like.

For example, as described above, in a case where hafnium oxide is selected for the ferroelectric layer 131, the material constituting the electrode layer 12 has a lattice constant of 4.6 Å to 5.8 Å so that the lattice constant achieves a lattice-matched within a range of ±10%, and the crystal system thereof is preferably any one of the orthorhombic crystal system, the monoclinic crystal system, the tetragonal crystal system, and the cubic crystal system, and is more preferably, either the orthorhombic crystal system or the cubic crystal system. Also, it is preferable to use a material of which the crystal structure is the fluorite type structure. Examples of such materials include silicon, Ge, Pd, and the like. Ge has a lattice constant of 5.7 Å, and has the cubic crystal system. Pd has a lattice constant of 5.0 Å, and has the cubic crystal system.

In this case, because metal materials are more likely to alleviate the lattice strain than oxides, even if the metal materials are different from the ferroelectric layer 131 in the crystal system, the crystal type, or the lattice constant, the metal materials are likely to alleviate the lattice strain caused by the difference. From this perspective, the substrate 11 has a higher effect of enhancing the crystallinity of the ferroelectric layer 131 than the electrode layer 12.

Using the material of the electrode layer 12, the electrode layer 12 can be manufactured by forming a conductive thin film on the substrate 11 by any forming method such as sputtering or thin film deposition.

The thickness of the electrode layer 12 is not particularly limited so long as the electrode layer 12 achieves the purpose, and is preferably, for example, 10 nm to 500 nm.

[Ferroelectric Recording Layer]

The ferroelectric recording layer 13 is provided on the upper surface of the electrode layer 12, and has a function of recording information. The ferroelectric recording layer 13 includes the ferroelectric layer 131, and may include other layers.

The ferroelectric layer 131 has a function of recording information. The ferroelectric layer 131 is not particularly limited so long as it is a ferroelectric exhibiting ferroelectricity, and is preferably a ferroelectric oxide in view of the electrical property.

Examples of ferroelectric oxides include lead titanate ($PbTiO_3$), lead zirconate ($PbZrO_3$), barium titanate ($BaTiO_3$), lithium niobate ($LiNbO_3$), lithium tantalate ($LiTaO_3$), hafnium oxide ($HfO_2$), and the like. Among them, in particular, it is preferable to use hafnium oxide. Ferroelectric oxides such as lead titanate, lead zirconate, barium titanate, lithium niobate, lithium tantalate, and the like have Perovskite-type crystal structures having the tetragonal crystal system with complicated crystal structures and high deposition temperatures. In contrast, hafnium oxide has a fluorite type structure having the orthorhombic crystal system, and is a binary compound that has a simpler structure than the Perovskite-type crystal structure, so that hafnium oxide can be deposited at a low temperature.

In a case where the ferroelectric layer 131 includes hafnium oxide, the ferroelectric layer 131 preferably includes an additive, or a mixed crystal ($Hf_xZr_{1-x}O_2$) including hafnium oxide and zirconium dioxide ($ZrO_2$).

In a case where the ferroelectric layer 131 includes hafnium oxide and an additive, the additive may be silicon (Si), aluminum (Al), gadolinium (Gd), yttrium (Y), lanthanum (La), strontium (Sr), or the like. One type of an additive may be used alone, or two or more types of additives may be used together.

The content of the additive is preferably in a range of 1 atom % to 20 atom %, more preferably in a range of 3 atom % to 17 atom %, and still more preferably in a range of 5 atom % to 15 atom %. When the content of the additive is in the above-described preferred range, the temperature of the deposition during formation of the ferroelectric layer 131 can be reduced, and the amount of use of the additive can be reduced.

The method of adding the additive to hafnium oxide is not particularly limited, and any method can be used as appropriate.

In a case where the ferroelectric layer 131 includes a mixed crystal ($Hf_xZr_{1-x}O_2$) including hafnium oxide and zirconium dioxide, x in $Hf_xZr_{1-x}O_2$ is preferably 0.3 to 0.6.

The ferroelectric layer 131 is preferably constituted by single-crystal, but may include an amorphous structure with short-range order. The ferroelectric layer 131 may be constituted by only the amorphous structure with short-range order, or may include single-crystal areas. The short-range order is an order of atoms constituting the amorphous structure over a short distance, and specifically, the short-range order means a property in which the number of nearest atoms, a bond distance between atoms, and a bond angle between atoms, and the like are orderly. The long-range order is an order of atoms, constituting the crystal, that are located away from one another, and specifically, the long-range order means that the number of nearest atoms, the bond distance, the bond angle, and the like are in order over a range greatly beyond the interatomic distance, and a generic term indicating a material having such a structure is single-crystal. When the ferroelectric layer 131 includes the amorphous structure with short-range order, the polarization is inverted by the crystal lattice strain in an area including the amorphous structure, so that information can be recorded. The area including the amorphous structure does not include a grain boundary and a lattice defect, and accordingly, the recording area of the ferroelectric layer 131 increases in accordance with an increase in the area in which the amorphous structure is formed.

The distance of the short-range order of the ferroelectric layer 131 is preferably equal to or less than 2 nm. The distance of the short-range order is a length of an area in which there is an order between atoms over a short distance, and means a distance in the lengthwise direction and a distance in the widthwise direction between atoms with reference to the ferroelectric recording medium surface. The distance of the short-range order is also referred to as a length, a width, and a height of the short-range order. The bit size of a currently available hard disk drive (HDD) has a length and a width of about 10 nm on the magnetic recording medium surface, and the area thereof is constituted by about several magnetic particles. In order for a ferroelectric recording medium to achieve a higher recording density than a magnetic recording medium, the bit size of the ferroelectric recording medium needs to be smaller than the bit size of the magnetic recording medium. In order to provide several recording areas in a single bit area of the ferroelectric layer 131, the length of the area having the short-range order (i.e., the length corresponding to a magnetic particle included in the magnetic recording medium) is preferably equal to or less than 2 nm.

The amorphous structure with short-range order of which the distance is equal to or less than 2 nm can be observed with X-ray diffraction, electron microscope observation, electron diffraction, and the like. Specifically, in such a structure, a clear crystal cannot be observed with the electron microscope observation, and a blurred intensity distribution that is referred to as a halo pattern can be obtained with the electron diffraction. In the X-ray diffraction, a halo pattern is obtained at a crystal plane position having the short-range order. When the ferroelectric layer 131 is heated to a deposition temperature or higher (i.e., a temperature higher than deposition temperature by +200° C.), the halo pattern changes to a signal having a sharp peak. This is because the short-range order that occurred in the ferroelectric layer 131 changes into the long-range order due to heating of the substrate.

The lattice constant of the short-range order of the amorphous structure and the lattice constant of the material constituting the substrate 11 are preferably lattice-matched within a range of ±10%. Accordingly, the short-range order of the ferroelectric layer 131 is increased, and the recording density of the ferroelectric recording medium 10 is increased.

The film thickness of the ferroelectric layer 131 can be selected from a range of 1 nm to 1000 nm in total. When the film thickness of the ferroelectric layer 131 is in the above-described range, a polarization inversion can be caused in the ferroelectric layer 131, and the voltage required to cause polarization inversion in the ferroelectric layer 131 can be reduced.

Also, in order to reduce, as much as possible, the voltage required to cause the polarization inversion of the ferroelectric layer 131 while causing the polarization inversion in the ferroelectric layer 131, the film thickness of the ferroelectric layer 131 is preferably 1 nm to 30 nm, more preferably 3 nm to 25 nm, and still more preferably 5 nm to 20 nm in total.

The actual film thickness of the ferroelectric layer 131 is preferably determined by comprehensively considering the following points.

With respect to the recording density of the ferroelectric recording medium, in a case where the bit length in the track direction is, for example, 10 nm, the film thickness of the ferroelectric layer 131 is preferably 10 nm to 50 nm that is one to five times the bit length, and in a case where the bit length is 1 nm, the film thickness is preferably 1 nm to 5 nm. One bit of the ferroelectric layer 131 is constituted by a solid, and therefore, based on experiment, it is stabilized when the ratio of the length, the width, and the height is within a range of one to five times.

With respect to read sensitivity with the conductive probe, in a case where a tunnel current is used for reading, the film thickness of the ferroelectric layer 131 is increased when the read sensitivity is desired to be increased, and the film thickness of the ferroelectric layer 131 is decreased when the read sensitivity is desired to be decreased. Specifically, a ferroelectric is an insulator and has a large band gap, and therefore, as the film thickness of the ferroelectric layer 131 increases, the barrier of the energy band increases, and accordingly, the tunnel current is less likely to flow. Therefore, it is necessary to increase the sensitivity of the conductive probe detecting the tunnel current. Conversely, when the film thickness of the ferroelectric layer 131 decreases, the tunnel current is more likely to flow, and accordingly, the sensitivity of the conductive probe may be reduced.

In a case where an atomic force is used for reading, the amount of charge in the ferroelectric layer 131 increases as the film thickness of the ferroelectric layer 131 increases, and therefore, the read sensitivity of the conductive probe detecting the amount of charge may be reduced. Conversely, when the film thickness of the ferroelectric layer 131 decreases, the amount of charge in the ferroelectric layer 131 also decreases, and therefore, it is necessary to increase the sensitivity of the conductive probe.

With respect to the leak current of the ferroelectric layer 131, as the film thickness of the ferroelectric layer 131 increases, the amount of charge in the ferroelectric layer 131 also increases, and accordingly, the influence of the leak current can be reduced. Therefore, the frequency of the refresh (rewrite) can be reduced. Conversely, when the film thickness of the ferroelectric layer 131 decreases, the amount of charge also decreases, and accordingly, the influence of the leak current also increases, and the frequency of refresh increases.

With respect to the crystallinity of the ferroelectric layer 131, as the film thickness of the ferroelectric layer 131 increases, the crystallinity tends to increase.

With respect to the smoothness of the growth surface of the ferroelectric layer 131, the smoothness tends to increase as the film thickness of the ferroelectric layer 131 decreases.

As a method for forming the ferroelectric layer 131, conventional methods can be used. For example, a sputtering method, a chemical vapor deposition (CVD) method, a sol-gel method, a laser ablation method, and the like may be used. Among them, the sputtering method and the CVD method are preferable.

In order to increase the crystallinity of the ferroelectric recording layer 13, it is preferable to increase the deposition temperature to about 500° C. However, when the deposition temperature exceeds 500° C., the ferroelectric layer 131 is likely to be polycrystallized, and also, the growth surface is also likely to be roughened. Also, the type of the substrate 11 that can be used is limited. When the sputtering method and the CVD method are used as the deposition method, the deposition temperature can be reduced, the polycrystallization of the ferroelectric layer 131 can be alleviated, and furthermore, roughening of the growth surface can be alleviated.

In a case where a sputtering method is used, the method for forming the ferroelectric layer 131 is preferably, among sputtering methods, a radio frequency sputtering method and a reactive sputtering method using plasma assist in order to increase the electron temperature while reducing the gas temperature of the deposition area. In a case where the CVD method is used, the method for forming the ferroelectric layer 131 is particularly preferably a plasma CVD method, an electron-assisted chemical vapor deposition (EACVD) method, and a metal organic chemical vapor deposition (MOCVD) method. Accordingly, hafnium oxide is likely to be changed from the cubic crystal system to the orthorhombic crystal system.

As described above, information is recorded in the ferroelectric layer 131. The principle for recording and holding information in the ferroelectric layer 131 is as follows. Specifically, the ferroelectric constituting the ferroelectric layer 131 has such a property that the polarization direction changes in response to an application of an electric field that exceeds the coercive electric field thereof. Also, the ferroelectric has such a property that, once the polarization direction is changed in response to an application of an electric field, the polarization direction is maintained even after the application of the electric field is stopped (spontaneous polarization). By making use of this property, information can be recorded and maintained in the ferroelectric layer 131. For example, the polarization direction of the entirety of the ferroelectric layer 131 is aligned in a single direction perpendicular to the surface of the ferroelectric recording medium 10. Further, an electric field exceeding the coercive electric field is locally applied to the ferroelectric layer 131 in the direction perpendicular to the surface of the ferroelectric recording medium 10. Accordingly, when the polarization direction of the portion to which the electric field has been applied is inverted and thereafter the application of the electric field is stopped, the polarization direction is maintained as being inverted.

For example, when information to be recorded is digital data of two values constituted by "0" and "1", a bit state "0" is associated with a downward polarization direction, and a bit state "1" is associated with an upward polarization direction. In this case, only when the bit state "1" is recorded, an electric field may be applied to the ferroelectric layer 131. In this manner, information can be recorded and held in the ferroelectric layer 131.

A method for reproducing information recorded in the ferroelectric layer 131 as the polarization direction is explained later.

The ferroelectric recording layer 13 may be made into a multi-layer configuration by laminating multiple ferroelectric layers 131.

The ferroelectric recording layer 13 preferably includes a single recording area of the smallest size in which recording of multi-value information including three or more values (multi-value recording) is performed in the ferroelectric layer 131 by a ferroelectric storage apparatus explained later (which may be hereinafter simply referred to as a "recording area"). The multi-value recording in the recording area is reproduced by the ferroelectric storage apparatus. Information recorded in the recording area is made into multi-value, so that the recording density of the ferroelectric layer 131 can be enhanced.

The multi-value recording is a method for recording information of three or more values in the recording area of the smallest size. For example, in a magnetic recording layer of a magnetic recording medium such as an HDD, the recording area of the smallest size is constituted by magnetic poles of two values, i.e., a north pole and a south pole. In contrast, the recording area of the smallest size of the ferroelectric recording layer 13 is preferably constituted by three or more values.

In the ferroelectric layer 131, information is recorded by polarization. For example, it is assumed that the front surface side of the ferroelectric layer 131 is spontaneously polarized as positive, and the back surface side of the ferroelectric layer 131 is spontaneously polarized as negative. In this case, when a positive electric field of a certain strength or higher is generated at the tip of the conductive probe 17 provided to face this portion, the polarization of this portion can be inverted such that the front surface side is made into negative and the back surface side is made into positive.

Figure 4:
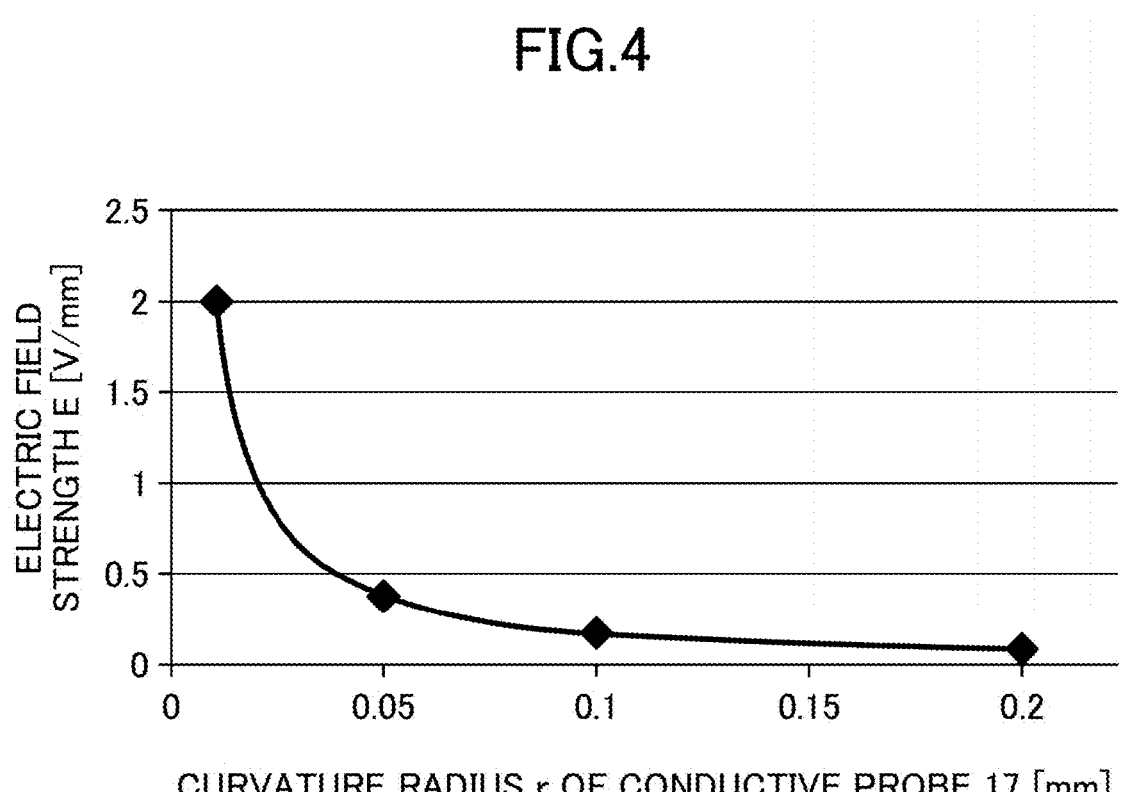
FIG. 4 is a drawing illustrating an example of a relationship between a curvature radius of a conductive probe and an electric field strength.
Figure 5D:
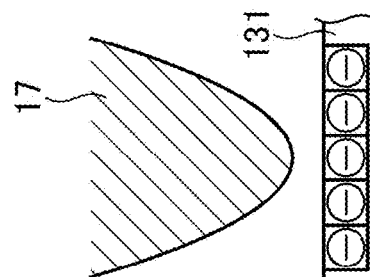
FIGS. 5A to 5D are explanatory diagrams schematically illustrating a process as to how polarization inversion of a ferroelectric layer spreads from a central portion directly under the conductive probe to a peripheral portion.
Figure 5C:
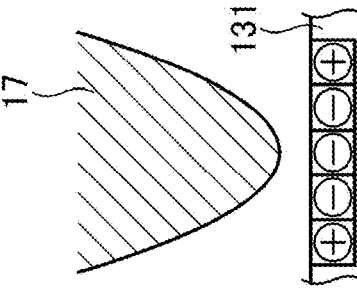
Figure 5B:
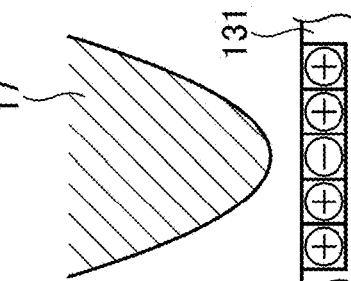
Figure 5A:
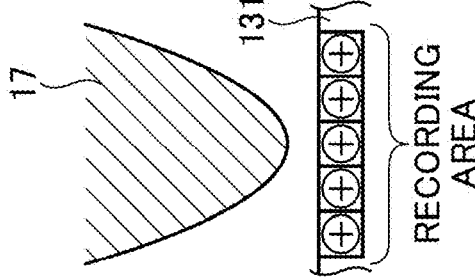

In general, a conductive electrode with a sharpened needle shape is used as the conductive probe 17. FIG. 4 illustrates an example of a relationship between a curvature radius r of the tip portion of the needle-shaped electrode and an electric field strength E that occurs in the space of the tip. As illustrated in FIG. 4, the curvature radius r of the tip portion of the needle-shaped electrode and the electric field strength E that occurs in the space of the tip are inverse proportional to each other, and the electric field strength E increases in accordance with a decrease in the curvature radius r. The conductive probe 17 has a cone shape in normal circumstances and its tip portion is spherical from a microscopic perspective, with the radius r at the end of the tip portion being the smallest and the radius r increasing gradually away from the end of the tip portion, and accordingly, the electric field strength E is the highest at the position of the conductive probe 17 directly under the tip portion, and the electric field strength E decreases away from the position directly under the tip portion. Therefore, when the voltage applied to the conductive probe 17 is gradually increased, the polarization inversion of the ferroelectric layer 131 expands from the central portion directly under the conductive probe 17 to the peripheral portion.

FIG. 5A to FIG. 5D are explanatory diagrams schematically illustrating a process for inverting the polarization of the ferroelectric recording layer. As illustrated in FIG. 5A to FIG. 5D, the conductive probe 17 is caused to face, in a non-contact state, the surface of the ferroelectric layer 131 spontaneously polarized to the positive (see FIG. 5A). When a positive voltage is applied to the conductive probe 17, and the electric field strength that occurs in the space at the tip portion due to the applied voltage exceeds the polarization inversion potential of the ferroelectric layer 131, first, the polarization of the position directly under the conductive probe 17 is inverted to the negative (see FIG. 5B). Then, when the applied voltage is further increased, the polarization inversion to the negative expands from the position directly under the conductive probe 17 to the peripheral portion (see FIG. 5C and FIG. 5D).

In this case, five consecutive charging positions as illustrated in FIG. 5A to FIG. 5D are assumed to be a recording area of the smallest size. In this case, the number of positive charges in a single recording area is five in FIG. 5A, four in FIG. 5B, two in FIG. 5C, and zero in FIG. 5D. According to the number of positive charges, multi-value information of four values is recorded. Write of multi-value information to the recording area of the smallest size is performed by a simplest single write operation by the ferroelectric storage apparatus.

Information multi-value recorded in the ferroelectric layer 131 (multi-value information) is read and reproduced by the ferroelectric storage apparatus. The reproduction (read) of the multi-value information is performed by a simplest single read operation by the ferroelectric storage apparatus.

Examples of methods for reproducing information recorded in the ferroelectric layer 131 include a method using a difference in the dielectric constant of the ferroelectric layer 131 caused by the polarization direction of the ferroelectric layer 131, a method for detecting a weak tunnel current flowing between the conductive probe 17 and the electrode layer 12, and a method for detecting an atomic force between the conductive probe 17 and the ferroelectric layer 131, and the like. In any of the methods, multi-value recorded information can be reproduced from the amount of charge in the recording area of the smallest size of the ferroelectric layer 131.

Specifically, in a case where the using a difference in the dielectric constant of the ferroelectric layer 131 caused by the polarization direction of the ferroelectric layer 131 is employed, the difference in the dielectric constants also increases in accordance with an increase in the difference between the amount of positive charge and the amount of negative charge in a single recording area.

In a case where the method for detecting a weak tunnel current flowing between the conductive probe 17 and the electrode layer 12 is employed, the tunnel barrier of the ferroelectric layer 131 changes according to the polarization direction and the amount of polarization. The tunnel current injected from the electrode layer 12 also changes, and the information multi-value recorded in the ferroelectric recording medium 10 can be reproduced by detecting the amount of change.

In a case where the method for detecting an atomic force between the conductive probe 17 and the ferroelectric layer 131 is employed, the electric force (Maxwell stress) between the ferroelectric layer 131 and the conductive probe 17 changes according to the polarization direction and the amount of polarization of the ferroelectric layer 131. The information multi-value recorded in the ferroelectric recording medium 10 can be reproduced by detecting the amount of change as well as the atomic force.

In the ferroelectric storage apparatus, position information (also referred to as "servo information") for detecting a relative position between the conductive probe 17 and the ferroelectric recording medium 10 in the track direction of the ferroelectric recording medium 10 is preferably recorded in the ferroelectric layer 131. In this case, in the ferroelectric layer 131, servo information areas recorded with the servo information and areas for recording and reproducing data are preferably arranged alternately with regular intervals in the circumferential direction of the track. Accordingly, the conductive probe 17 can detect the position of the conductive probe 17 according to the servo information during reproduction of recorded data.

Figure 6A:
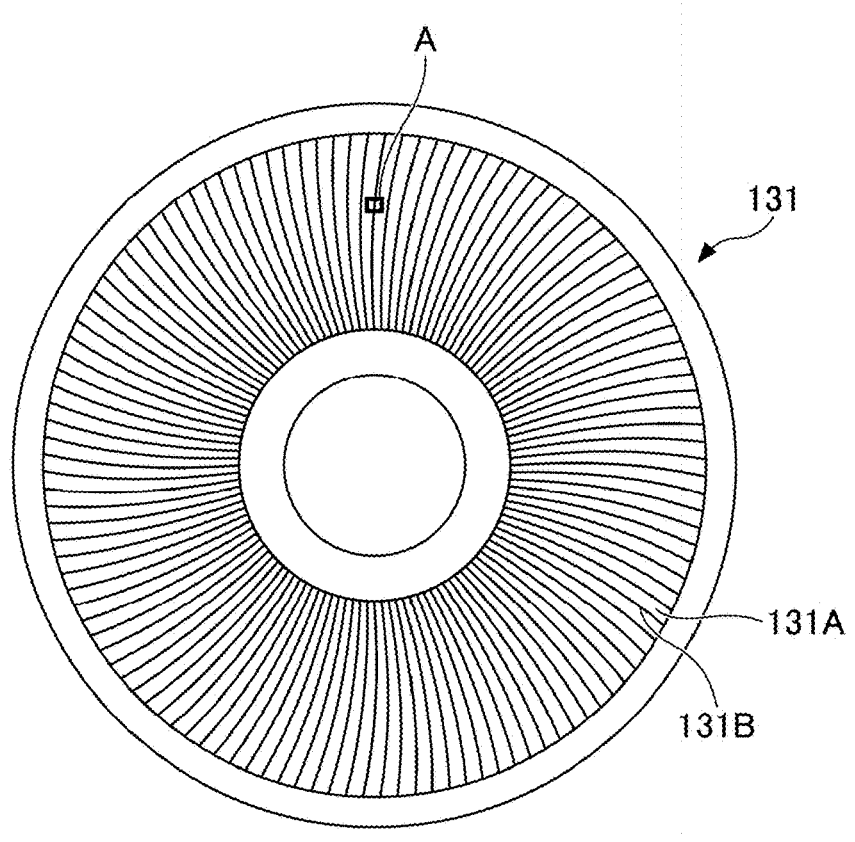
FIGS. 6A and 6B are drawings illustrating data areas and servo information areas of the ferroelectric recording medium.
Figure 6B:
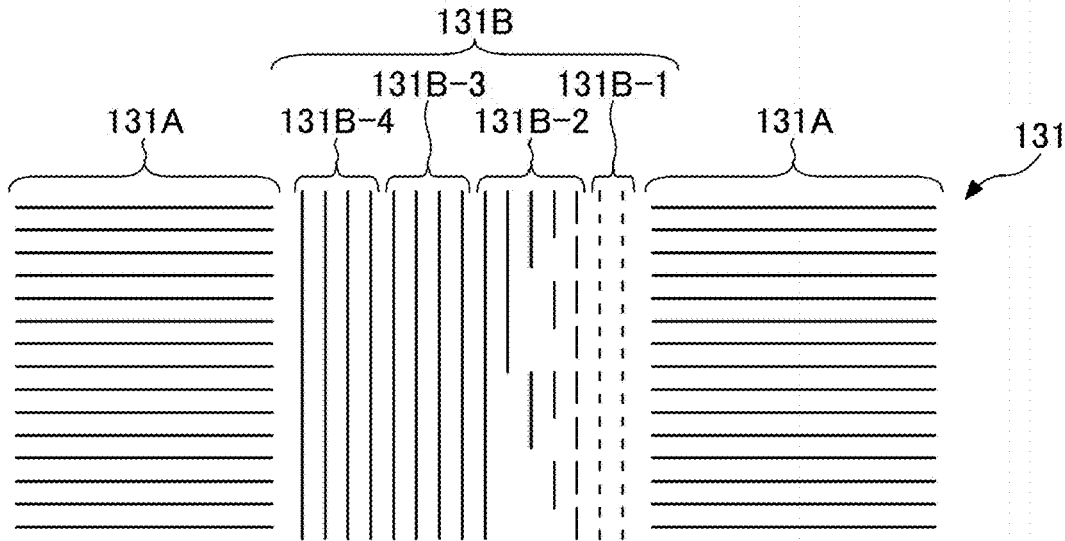

FIGS. 6A and 6B are drawings illustrating data areas and servo information areas of the ferroelectric layer 131. FIG. 6A is a plan view illustrating the ferroelectric layer 131. FIG. 6B is an enlarged view of a rectangular area A of FIG. 6A. As illustrated in FIG. 6A and FIG. 6B, on one of the surfaces of the electrode layer 12 in the disk shape, the ferroelectric layer 131 may include data areas 131A and servo information areas 131B. In FIG. 6A, areas indicated by lines extending radially from the center are the servo information areas 131B, and areas between radial lines are data areas 131A. As illustrated in FIG. 6B, the data areas 131A have annular-like regular shapes.

As illustrated in FIG. 6B, the servo information area 131B includes a burst information area 131B-1, an address information area 131B-2, preamble information area 131B-3, and reference signal information 131B-4. In FIG. 6B, for example, the conductive probe 17 travels from left to right, but the order for arranging the burst information area 131B-1, the address information area 131B-2, the preamble information area 131B-3, and the reference signal information 131B-4 may be changed as necessary.

The burst information area 131B-1 is recorded with burst information and the like for positioning the conductive probe 17 at the center of the recording track.

The address information area 131B-2 is recorded with address information including track information (information in the radius direction) and sector information (information in the circumferential direction) indicating an address of the data area 131A.

The preamble information area 131B-3 and the reference signal information 131B-4 are recorded with preamble information used for identifying a position for transitioning from the data area 131A to the servo information area 131B in the recording track.

In the ferroelectric layer 131 as illustrated in FIG. 6A, the conductive probe 17 moving in the circumferential direction on the surface prepares to read address information by reading the preamble information of the preamble information area 131B-3. Then, the conductive probe 17 reads the address information of the data area 131A from the address information area 131B-2, and reads the burst information from the burst information area 131B-1, thereby fine-adjusting the track position (the radius position). Thereafter, the conductive probe 17 can record information to and read information from the data area 131A.

The servo information area 131B preferably includes the reference signal information 131B-4 indicating the reference of the signal level of the multi-value recorded information. For example, in the four-value recording of FIG. 5, the reference signal information 131B-4 may include recording of four types of amounts of charges corresponding to FIG. 5A, FIG. 5B, FIG. 5C, and FIG. 5D. Alternatively, the reference signal information 131B-4 may include recording of two types of amounts of charges corresponding to FIG. 5A and FIG. 5D, and FIG. 5B and FIG. 5C may be obtained as $\frac{1}{3}$ and $\frac{2}{3}$, respectively, of the difference of signal levels between FIG. 5A and FIG. 5D.

The conductive probe 17 reads the reference signal information 131B-4 from the servo information area 131B, so that the signal levels of multi-value recording are recognized, and the multi-value information recorded in the data area 131A is reproduced by using the recognized signal levels.

As illustrated in FIG. 1, the ferroelectric recording layer 13 preferably includes the paraelectric layer 132.

The paraelectric layer 132 is preferably provided on a side of the ferroelectric recording layer 13 facing the electrode layer 12, and provided between the ferroelectric layer 131 and the electrode layer 12.

In a case where the ferroelectric recording layer 13 is constituted by a single layer including only the ferroelectric layer 131, the ferroelectric layer 131 is provided to be in contact with the electrode layer 12, but in this case, charge of the polarized ferroelectric layer 131 leaks to the electrode layer 12, and information recorded in the ferroelectric layer 131 may be lost.

In particular, in an initial growth area of the ferroelectric layer 131, i.e., an area in proximity to the interface with the electrode layer 12, the crystallinity may be reduced during deposition, and for example, a polycrystal or amorphous structure is likely to be formed. For this reason, charge is likely to be leaked from this polycrystal or amorphous structure portion to the electrode layer 12. Specifically, this is because the amorphous structure portion formed at the interface of the ferroelectric layer 131 is completely amorphous without any long-range order or short-range order, and accordingly, leakage of charge is likely to occur similarly to the grain boundary portion of a polycrystal.

Because the insulating paraelectric layer 132 is provided between the ferroelectric layer 131 and the electrode layer 12, leakage of charge from the ferroelectric layer 131 can be reduced.

In addition, because the insulating paraelectric layer 132 is provided between the ferroelectric layer 131 and the electrode layer 12, there is an effect of increasing the tunnel current from the ferroelectric layer 131.

A ferroelectric is an insulator with a large band gap, and therefore, a tunnel current is less likely to flow. However, when a ferroelectric is made into a thin film, the tunnel barrier can be reduced, and a bonding structure with the electrode layer that is a conductor can be formed, so that a weak tunnel current can be passed from the electron state at the bonding portion. Furthermore, when a paraelectric layer is added to the bonding portion, and accordingly, the bonding structure includes the ferroelectric, the paraelectric, and the conductor which are bonded in this order, band bending in a direction to reduce the tunnel barrier occurs due to charge at the interface portion between the ferroelectric and the paraelectric, and the tunnel current is more likely to flow.

In the paraelectric layer 132, a conventional material can be used as the paraelectric. For example, oxide, nitride, carbide, boride, and silicide are preferably used as the paraelectric. One of the above-described materials may be used alone, or two or more may be used together.

Examples of oxides include alumina, zirconia, yttria-stabilized zirconia, silicon oxide, titanium oxide, cerium oxide, titanium oxide, lead oxide, yttrium oxide, barium oxide, chromium oxide, iron oxide, lanthanum oxide, and the like.

Examples of nitrides include titanium nitride, silicon nitride, chromium nitride, aluminum nitride, and the like.

Examples of the carbides include titanium carbide, tungsten carbide, boron carbide, silicon carbide, chromium carbide, and the like.

Examples of borides include titanium boride, iron tetraboride, neodymium boride, and the like.

Examples of silicides include molybdenum silicate and the like.

Similar to the substrate 11 and the electrode layer 12, the paraelectric constituting the paraelectric layer 132 is preferably a material having any one of or both of the same crystal system and the same crystal structure as the crystal system and the crystal structure of the ferroelectric layer 131, in view of lattice match with the ferroelectric layer 131.

Similar to the substrate 11 and the electrode layer 12, the lattice constant of the paraelectric constituting the paraelectric layer 132 is preferably lattice-matched within a range of ±10% with respect to the lattice constant of the ferroelectric constituting the ferroelectric layer 131. Accordingly, the ferroelectric layer 131 is likely to grow on the paraelectric layer 132, and the crystallinity of the ferroelectric layer 131 can be increased.

For example, as described above, in a case where hafnium oxide is selected for the ferroelectric layer 131, the material constituting the paraelectric layer 132 has a lattice constant of 4.6 Å to 5.8 Å so that the lattice constant achieves lattice matching within a range of ±10%, and the crystal system thereof is preferably any one of the orthorhombic crystal system, the monoclinic crystal system, the tetragonal crystal system, and the cubic crystal system, and is more preferably, either the orthorhombic crystal system or the cubic crystal system. Also, it is preferable to use a material of which the crystal structure is the fluorite type structure.

Examples of such materials include cerium oxide (cubic crystal system, fluorite type structure, lattice constant 5.4 Å), silicon (cubic crystal system, diamond type structure, lattice constant 5.4 Å), $10(Y_2O_3)$-$90(ZrO_2)$ (cubic crystal system, fluorite type structure, lattice constant 5.1 Å), aluminum oxide (trigonal system, corundum type structure, lattice constant 4.8 Å), titanium oxide (tetragonal crystal system, rutile type structure, lattice constant 4.6 Å), and the like.

The effect of the paraelectric layer 132 for increasing the crystallinity of the ferroelectric layer 131 by lattice match with the ferroelectric layer 131 is almost as high as the effect achieved by the substrate 11 and is higher than the effect achieved by the electrode layer 12. Also, as described above, at the interface portion between the ferroelectric layer 131 and the paraelectric layer 132, band bending in a direction for reducing the tunnel barrier occurs, but this band bending is strongly affected by the lattice strain at the interface portion. Specifically, the lattice strain increases the energy at the interface portion, and accordingly, this increased energy may hide the energy state due to the above-described band bending. Therefore, in order to detect a weak current flowing between the conductive probe 26 and the ferroelectric layer 131, it is important to increase the lattice match between the paraelectric layer 132 and the ferroelectric layer 131, and reduce the energy increase due to the lattice strain.

The film thickness of the paraelectric layer 132 is preferably 1 nm to 100 nm, and more preferably, 5 nm to 50 nm in view of reduction of leakage of charge from the ferroelectric layer 131.

When the film thickness of the paraelectric layer 132 is within the above-described preferred range, polarization inversion can be caused in the ferroelectric layer 131, leakage of charge from the ferroelectric layer 131 can be reduced, and leakage of charge from the ferroelectric layer 131 to the outside can be reduced. Furthermore, when the film thickness of the paraelectric layer 132 is within the above-described preferred range, the tunnel current is more likely to flow, and accordingly, the tunnel current can be increased.

In addition, the increase in the distance between the ferroelectric layer 131 and the electrode layer 12 can be alleviated, so that the voltage required to invert the polarization of the ferroelectric layer 131 can be reduced. Therefore, while the increase in the film thickness of the ferroelectric recording layer 13 is alleviated, an increase in the voltage required to invert the polarization of the ferroelectric layer 131 can be alleviated.

In order to increase the tunnel current from the ferroelectric layer 131, the film thickness of the paraelectric layer 132 is preferably 1 nm to 30 nm, and more preferably, about the same as the film thickness of the ferroelectric layer 131. In this case, the film thickness of the ferroelectric layer 131 is also preferably 1 nm to 30 nm in total. The film thickness of the paraelectric layer 132 is preferably the same as the total film thickness of the ferroelectric layer 131. In a case where there is difference between the film thickness of the paraelectric layer 132 and the total film thickness of the ferroelectric layer 131, the paraelectric layer 132 is preferably thinner than the total film thickness of the ferroelectric layer 131, and the difference between the film thickness of the paraelectric layer 132 and the total film thickness of the ferroelectric layer 131 is preferably equal to or less than 10 nm.

[Protection Layer]

The protection layer 14 is provided on the upper surface of the ferroelectric recording layer 13. The protection layer 14 has a function of protecting the ferroelectric recording layer 13 from the outside, and even if, e.g., the ferroelectric recording medium 10 comes into contact with the conductive probe 17, damage to the ferroelectric recording layer 13 can be alleviated.

The protection layer 14 is preferably an insulating material with a low dielectric constant, in order not to impair the function of the ferroelectric recording layer 13 for recording and reproducing information.

The protection layer 14 may be constituted by: oxides such as silica, alumina, zirconia, titania, magnesium oxide, aluminum oxide, and the like; nitrides such as silicon nitride, aluminum nitride, titanium nitride, boron nitride, and the like; carbides such as silicon carbide, boron carbide, and the like; a diamond-like carbon film; a polymer insulating material; or the like. In order to protect the ferroelectric recording layer and alleviate the reduction of its durability, the protection layer 14 is preferably made of a material with a high degree of hardness.

The thickness of the protection layer 14 is preferably equal to or more than 0.5 nm. In view of the voltage required for polarization inversion of the ferroelectric of the ferroelectric layer 131, the thickness of the protection layer 14 is preferably equal to or less than 50 nm, more preferably equal to or less than 30 nm, and still more preferably equal to or less than 20 nm.

As illustrated in FIG. 3, the ferroelectric recording medium 10 preferably does not include the ferroelectric recording layer 13 (the ferroelectric layer 131 and the paraelectric layer 132) and the protection layer 14 around the opening portion 10a. Specifically, the ferroelectric recording layer 13 and the protection layer 14 are preferably provided in an area other than the opening portion 10a and an area therearound at the center of the ferroelectric recording medium 10. The area around the opening portion 10a means a range of a distance of about 10 mm from the inner circumference of the opening portion 10a, although it depends on the size of the substrate 11, the size of the opening portion 10a, and the like. The ferroelectric recording layer 13 and the protection layer 14 are provided in the area other than the opening portion 10a and the area therearound, so that the ferroelectric recording layer 13 and the protection layer 14 do not come into contact with the spindle shaft 18, and leakage of charge of the ferroelectric layer 131 through the protection layer 14 to the spindle shaft 18 can be alleviated.

The ferroelectric recording medium 10 has a structure obtained by laminating the ferroelectric recording layer 13, the protection layer 14, and the lubricant layer 15 over the substrate 11 and both of the surfaces of the electrode layer 12. The spindle shaft 18, to which the ferroelectric recording medium 10 is attached, is formed with a step in a cylindrical shape made by reducing the diameter at the upper portion, and the ferroelectric recording medium 10 is fixed to the spindle shaft 18 by placing the ferroelectric recording medium 10 on the step, placing an attachment metal fitting 19 thereon, and screwing the attachment metal fitting 19 to the spindle shaft 18. At the portion where the ferroelectric recording medium 10 is fixed to the spindle shaft 18, the ferroelectric recording layer 13, the protection layer 14, and the lubricant layer 15 are not provided, and the substrate 11 and the spindle shaft 18 are directly in contact with each other. The spindle shaft 18 is connected via the substrate 11 to the ferroelectric layer 131, and constitutes a part of a circuit for reading information from and writing information to the ferroelectric layer 131.

Figure 7:
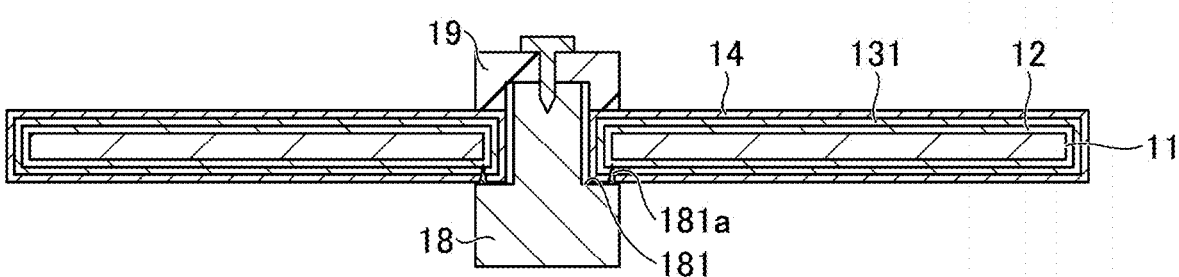
FIG. 7 is a cross-sectional view illustrating an example of a conventional ferroelectric recording medium into which a spindle shaft of an information recording apparatus is inserted.

For example, as illustrated in FIG. 7, in a case where a ferroelectric recording medium of which the entire surface of the substrate 11 is provided with the electrode layer 12, the ferroelectric layer 131, and the protection layer 14 is attached to the spindle shaft 18, the ferroelectric layer 131 has an insulating property, and therefore, even if the ferroelectric layer 131 is in contact with the spindle shaft 18, it is impossible to read information from and write information to the ferroelectric recording medium 10. However, because the ferroelectric recording layer 13 and the protection layer 14 are thin, a conduction with the substrate 11 can be achieved by making a conduction between the substrate 11 and the spindle shaft 18 by causing a protruding portion 181a of an attachment surface 181 of the spindle shaft 18 to penetrate the ferroelectric layer 131 and the protection layer 14 and bite into the electrode layer 12.

When the ferroelectric recording medium 10 is set in the ferroelectric storage apparatus and used over a long period of time, the protection layer 14 deteriorates due to moisture and contamination in the ferroelectric storage apparatus, and the insulating property of the protection layer 14 decreases, so that charge of the ferroelectric layer 131 of the ferroelectric recording layer 13 may leak. Even though the deterioration of the ferroelectric recording layer 13 is less severe because the ferroelectric recording layer 13 is covered with the protection layer 14, the ferroelectric recording layer 13 may also deteriorate similar to the protection layer 14, and charge may leak from the ferroelectric layer 131. In the present embodiment, as illustrated in FIG. 3, the ferroelectric recording layer 13 and the protection layer 14 are formed in an area other than the opening portion 10a of the ferroelectric recording medium 10 and the area therearound, so that charge of the ferroelectric recording layer 13 can be prevented from leaking from the protection layer 14 to the spindle shaft 18.

As illustrated in FIG. 1, the lubricant layer 15 may be provided on the surface of the protection layer 14 in order to alleviate abrasion caused by contact with the conductive probe 17.

The lubricant used for the lubricant layer 15 is preferably saturated fatty acid such as stearic acid, dye such as phthalocyanine, fluorine resin such as perfluoropolyether (PFPE), and is particularly preferably fluorine resin such as PFPE, because the lubricity is high.

The lubricant layer 15 is preferably an insulating material with a low dielectric constant, in order not to impair the function of the ferroelectric recording layer 13 for recording and reproducing information.

In this manner, in the ferroelectric recording medium 10 according to the present embodiment, the lattice constant of the material of the ferroelectric layer 131 and the lattice constant of the material constituting the electrode layer 12 are lattice-matched within a range of ±10%. Accordingly, the crystallinity of the ferroelectric constituting the ferroelectric layer 131 can be increased. Furthermore, the ferroelectric included in the ferroelectric layer 131 is made into single-crystal, and the grain boundary is eliminated, so that the influence of the grain boundary can be reduced. The polarization inversion of the ferroelectric included in the ferroelectric layer 131 is caused by the crystal lattice strain, and accordingly, the area of the ferroelectric layer 131 where the polarization of the ferroelectric is inverted can be increased by making the ferroelectric included in the ferroelectric layer 131 into single-crystal. Therefore, the ferroelectric recording medium 10 can achieve a high recording density.

In a case where the substrate 11 is a conductor, the substrate 11 is conductive, and therefore, the ferroelectric recording medium 10 can also serve as an electrode. In this case, the substrate 11 can achieve the function as the electrode layer 12, and the electrode layer 12 is unnecessary. Therefore, even though the ferroelectric recording medium 10 does not have the electrode layer 12 on the substrate 11, the lattice constant of the material of the ferroelectric layer 131 and the lattice constant of the material constituting the substrate 11 can be lattice-matched within a range of ±10%. Therefore, as described above, the ferroelectric recording medium 10 can increase the area where the polarization of the ferroelectric is inverted in the ferroelectric layer 131, and therefore, the ferroelectric recording medium 10 can achieve a high recording density.

In the ferroelectric recording medium 10, the ferroelectric layer 131 may be a single-crystal film. Accordingly, the grain boundary of the ferroelectric layer 131 can be eliminated, so that the recording capacity of the ferroelectric recording medium 10 can be further increased.

The ferroelectric recording medium 10 includes the ferroelectric layer 131, the ferroelectric layer 131 includes the amorphous structure with short-range order, and the distance of the short-range order is set to 2 nm or less, so that the lattice constant of the amorphous structure and the lattice constant of the material constituting the substrate 11 can be lattice-matched within a range of ±10%. Because the ferroelectric layer 131 has the amorphous structure with the short-range order, polarization inversion due to crystal lattice strain can be caused in the area having the short-range order, and the grain boundary can be reduced. Therefore, in the ferroelectric recording medium 10, a large area of the ferroelectric layer 131 can be made into a recording area. Furthermore, because the distance of the short-range order of the ferroelectric layer 131 is set to 2 nm or less, the storage area can be increased, and accordingly, the recording density can be increased. Therefore, the ferroelectric recording medium 10 can achieve a high recording density.

In a case where the ferroelectric layer 131 has the amorphous structure with short-range order, as compared with a case where the ferroelectric layer 131 is formed by a single-crystal film, the deposition temperature of the ferroelectric layer 131 can be further reduced. Accordingly, the growth surface of the ferroelectric layer 131 becomes smooth, so that the surface of the ferroelectric recording medium 10 can be made smooth. Therefore, in the ferroelectric recording medium 10, the spacing loss with respect to the conductive probe 17 can be reduced, and accordingly, the recording density can be further increased.

In the ferroelectric recording medium 10, the ferroelectric layer 131 has the amorphous structure with short-range order, and accordingly, the deposition temperature of the ferroelectric layer 131 can be further reduced, so that a larger number of types of substrates are available for the substrate 11.

In the ferroelectric recording medium 10, the ferroelectric layer 131 has the amorphous structure with short-range order, and accordingly, the ferroelectric layer 131 can be readily made into a thin film, so that a smooth surface can be readily formed on the ferroelectric layer 131. Therefore, the smoothness of the ferroelectric recording medium 10 can be increased.

Further, in the ferroelectric recording medium 10, the ferroelectric layer 131 includes the amorphous structure with short-range order, and accordingly, the grain boundary of the ferroelectric layer 131 can be reduced, so that the recording capacity with respect to the single ferroelectric recording medium 10 can be increased.

In the ferroelectric recording medium 10, the substrate 11 can have silicon, and the ferroelectric layer 131 can have hafnium oxide. The lattice match property between the substrate 11 and the ferroelectric layer 131 can be increased, and the crystallinity of the ferroelectric layer 131 can be increased. Therefore, the ferroelectric recording medium 10 can reliably achieve a higher recording density.

In the ferroelectric recording medium 10, the ferroelectric layer 131 may be constituted by a mixture including hafnium oxide and at least one additive selected from the group comprising silicon, aluminum, gadolinium, yttrium, lanthanum, and strontium, or may be constituted by mixed crystal ($Hf_xZr_{1-x}O_2$) (x is 0.3 to 0.6) including hafnium oxide and zirconium dioxide. Accordingly, when the ferroelectric layer 131 is made into the above-described mixture or mixed crystal including hafnium oxide, the deposition temperature can be reduced during formation of the ferroelectric layer 131 on the substrate 11, so that the ferroelectric layer 131 can be formed on the substrate 11 at a low temperature. In general, the higher the temperature is during formation of the ferroelectric layer 131, the more readily the ferroelectric layer 131 can be polycrystallized. In the present embodiment, the ferroelectric enables increase of the single-crystal area, so that the single-crystal area of the ferroelectric layer 131 can be increased more significantly. Therefore, the ferroelectric recording medium 10 can achieve a higher recording capacity.

In the ferroelectric recording medium 10, the single-crystal area of the ferroelectric layer 131 is increased, and accordingly, the ferroelectric recording medium 10 can be readily made into a thin film, and a smooth surface can be formed over a wider range in the ferroelectric layer 131, so that the smoothness of the ferroelectric layer 131 can be further increased.

In the ferroelectric recording medium 10, the content of the additive can be made into a range of 1 atom % to 20 atom %. Accordingly, in the ferroelectric recording medium 10, the ferroelectricity of the ferroelectric layer 131 can be increased.

In the ferroelectric recording medium 10, the film thickness of the ferroelectric layer 131 can be made into 5 nm to 1000 nm. Accordingly, in the ferroelectric recording medium 10, the polarization of the ferroelectric included in the ferroelectric layer 131 can be inverted, and the voltage required for inverting the polarization of the ferroelectric can be reduced, so that the burden imposed on the ferroelectric layer 131 can be alleviated.

The ferroelectric recording medium 10 may have the paraelectric layer 132 between the ferroelectric recording layer 13 and the electrode layer 12, and the paraelectric layer 132 may include at least one paraelectric selected from the group comprising oxide, nitride, carbide, boride, and silicide. During formation of the ferroelectric layer 131, the initial growth area, i.e., an area in proximity to the interface with the electrode layer 12, is polycrystal or amorphous, the crystallinity increases toward the growth direction of the film thickness, and ultimately, the surface is made into single-crystal. Therefore, charge of the ferroelectric layer 131 is likely to leak from the polycrystal or amorphous area in proximity to the interface to the side of the substrate 11. The paraelectric layer 132 can alleviate leakage of the charge of the ferroelectric layer 131 to the substrate 11. Therefore, in the ferroelectric recording medium 10, the leakage of the charge from the ferroelectric layer 131 can be alleviated, so that loss of information recorded in the ferroelectric layer 131 can be alleviated.

In addition, in the ferroelectric recording medium 10, the lattice constant of the material constituting the paraelectric layer 132 and the lattice constant of the material of the ferroelectric layer 131 can be lattice-matched within a range of ±10%. Accordingly, the crystallinity of the ferroelectric layer 131 can be increased more greatly, and the leakage of the charge from the ferroelectric layer 131 can be alleviated more significantly.

Furthermore, in the ferroelectric recording medium 10, the film thickness of the paraelectric layer 132 can be made into 1 nm to 100 nm. Accordingly, in the ferroelectric recording medium 10, while the polarization of the ferroelectric layer 131 is inverted, the effect of alleviating the leakage of the charge from the ferroelectric layer 131 can be further enhanced.

In the ferroelectric recording medium 10, the film thickness of the paraelectric layer 132 can be made into 1 nm to 30 nm, the film thickness of the ferroelectric layer 131 can be made into 1 nm to 30 nm, the film thickness of the paraelectric layer 132 and the film thickness of the ferroelectric layer 131 can be made substantially the same as each other or the film thickness of the paraelectric layer 132 can be made smaller than the total film thickness of the ferroelectric layer 131, and the difference in the film thickness between the paraelectric layer 132 and the ferroelectric layer 131 can be made 10 nm or less. Accordingly, when the ferroelectric recording medium 10 is applied to the ferroelectric storage apparatus, a weak tunnel current flowing between the conductive probe 17 and the ferroelectric layer 131 can be increased.

The ferroelectric recording medium 10 can have the opening portion 10a at the central portion of the substrate 11, and the protection layer 14 can be provided in the area other than the opening portion 10a and the area therearound. The protection layer 14 does not come into contact with the spindle shaft 18, and therefore, even if the protection layer 14 deteriorates over an elapse of time, leakage of the charge of the ferroelectric layer 131 through the protection layer 14 to the spindle shaft 18 can be alleviated in the ferroelectric recording medium 10. Therefore, in the ferroelectric recording medium 10, the leakage of the charge from the ferroelectric layer 131 can be alleviated, so that loss of information recorded in the ferroelectric layer 131 can be alleviated, and the adverse effect caused by the deterioration of the protection layer 14 over an elapse of time can be alleviated.

In the ferroelectric recording medium 10, the ferroelectric recording layer 13 can be provided in the area other than the opening portion 10a and the area therearound. Accordingly, the ferroelectric recording layer 13 does not come into contact with the spindle shaft 18, so that even if the ferroelectric recording layer 13 and the protection layer 14 deteriorate over an elapse of time, leakage of the charge of the ferroelectric layer 131 through the ferroelectric recording layer 13 and the protection layer 14 to the spindle shaft 18 can be alleviated in the ferroelectric recording medium 10. Therefore, in the ferroelectric recording medium 10, the leakage of the charge from the ferroelectric layer 131 can be alleviated more reliably, so that loss of information recorded in the ferroelectric layer 131 can be alleviated in a more stable manner, and the adverse effect caused by deterioration of the ferroelectric recording layer 13 and the protection layer 14 over an elapse of time can be alleviated in a more effective manner.

<Ferroelectric Storage Apparatus>

Figure 8:
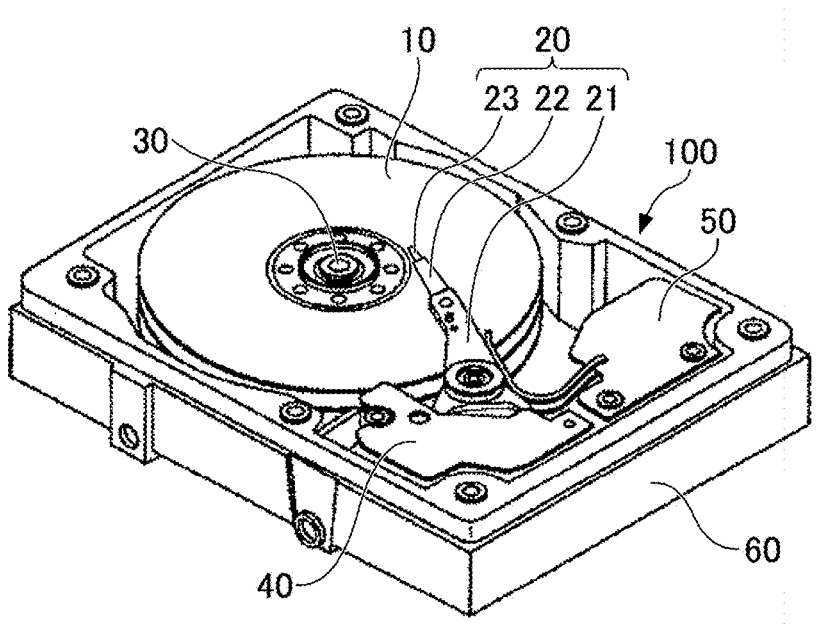
FIG. 8 is a perspective view illustrating a ferroelectric storage apparatus.

A ferroelectric storage apparatus having the ferroelectric recording medium 10 according to the present embodiment is explained. The ferroelectric storage apparatus includes, as a ferroelectric recording medium, the above-described ferroelectric recording medium 10. FIG. 8 is a perspective view illustrating the ferroelectric storage apparatus. As illustrated in FIG. 8, the ferroelectric storage apparatus 100 includes the ferroelectric recording medium 10, a header assembly 20, a ferroelectric recording medium driving unit 30, a probe driving unit 40, a control unit, not illustrated, and a recording-and-reproduction signal processing unit 50, which are provided in a housing 60. The ferroelectric storage apparatus 100 includes multiple ferroelectric recording media 10. Because the ferroelectric recording medium 10 is the above-described ferroelectric recording medium according to the present embodiment, detailed explanation thereabout is omitted.

[Header Assembly]

As illustrated in FIG. 8, the header assembly 20 is fixed to a fixed shaft in the ferroelectric storage apparatus 100, and includes an actuator arm 21, a suspension arm 22, and a probe slider 23.

Figure 9:
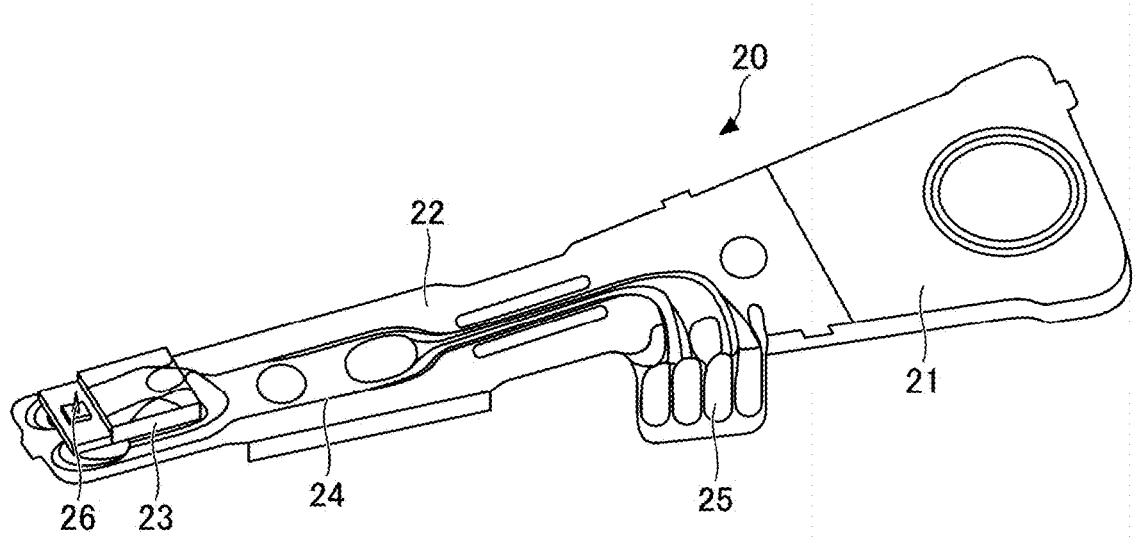
FIG. 9 is a perspective view illustrating a configuration of a header assembly as seen from the lower side.

FIG. 9 is a perspective view illustrating a configuration of the header assembly 20 as seen from the lower side. As illustrated in FIG. 9, lead wires 24 for writing and reading signals are arranged on the suspension arm 22. One end of each of the lead wires is electrically connected to the conductive probe 26 incorporated into the probe slider 23, and the other end of each of the lead wires is electrically connected to the electrode pad 25.

As illustrated in FIG. 8, a hole for fixation with the fixed shaft of the ferroelectric storage apparatus 100 is provided on one end side of the actuator arm 21, and the suspension arm 22 is connected to the tip end side of the actuator arm 21.

As illustrated in FIG. 8, the actuator arm 21 is connected to one end side of the suspension arm 22, and the probe slider 23 is attached to the tip of the suspension arm 22.

(Probe Slider)

As illustrated in FIG. 8, the probe slider 23 is provided at the tip end of the suspension arm 22.

Figure 10:
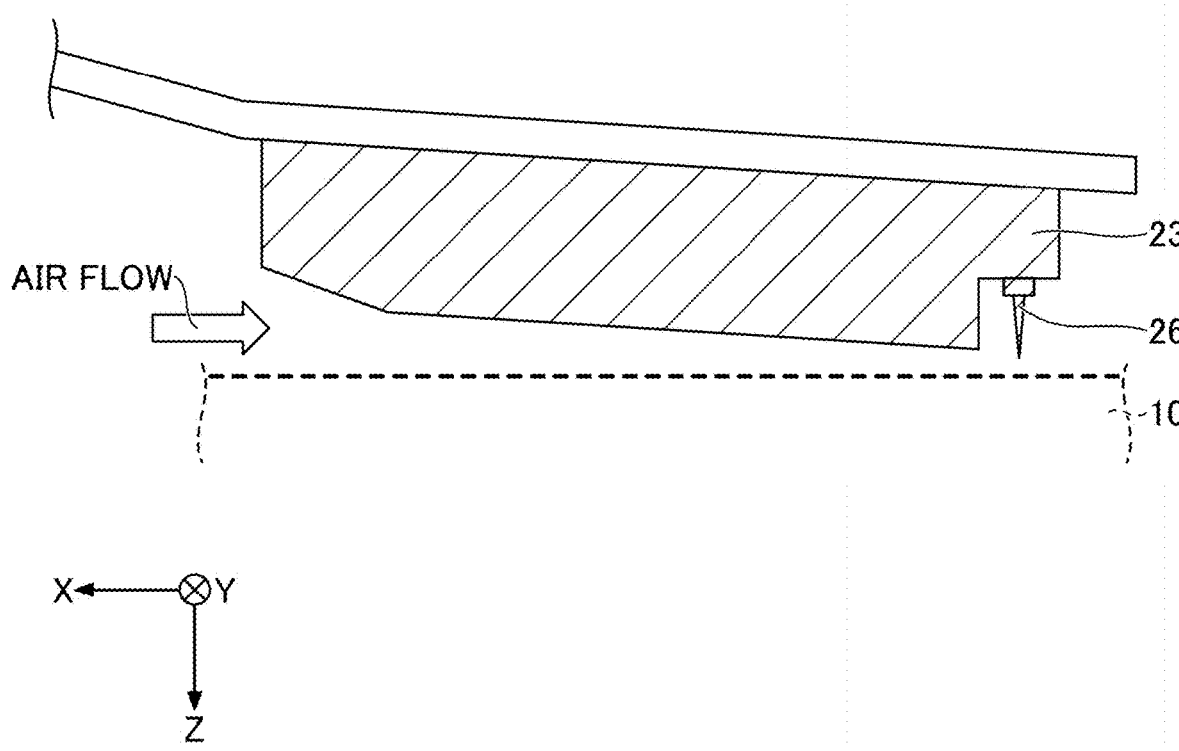
FIG. 10 is a cross-sectional view illustrating an example of configuration of a probe slider.

FIG. 10 is a cross-sectional view illustrating an example of configuration of the probe slider 23. Of the arrows in FIG. 10, a +X axis direction and a −X axis direction are sector directions of the ferroelectric recording medium 10, a +Y axis direction and a −Y axis direction are track directions of the ferroelectric recording medium 10, and a Z axis direction is a direction to face the recording surface of the ferroelectric recording medium 10. As illustrated in FIG. 10, the conductive probe 26 is provided at the tip portion of the probe slider 23.

Figure 11:
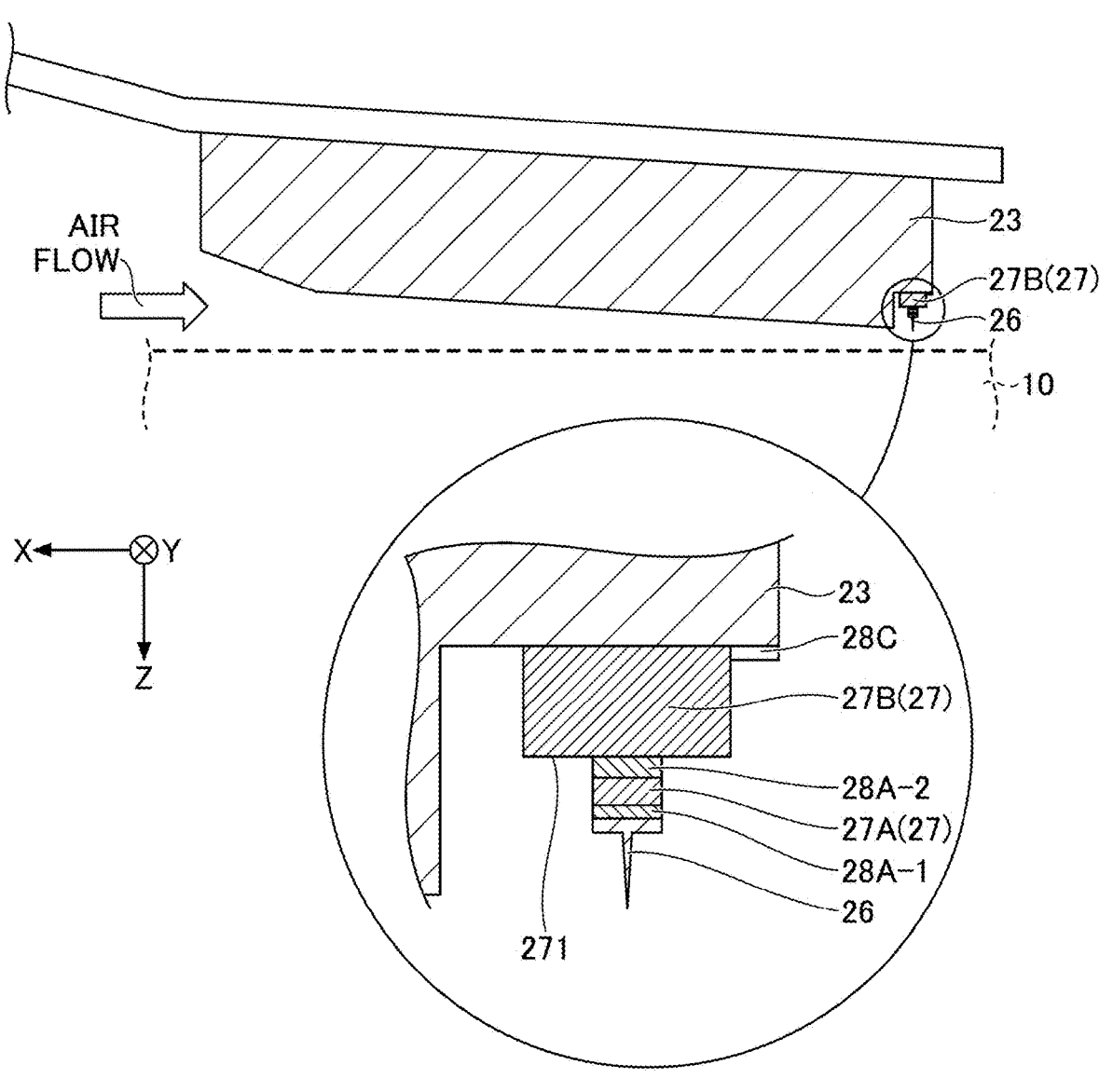
FIG. 11 is a cross-sectional view illustrating another example of configuration of the probe slider.

FIG. 11 is a cross-sectional view illustrating another example of configuration of the probe slider 23. The directions of arrows in FIG. 11 are similar to the directions of arrows in FIG. 10.

As illustrated in FIG. 11, the conductive probe 26 and a piezoelectric element 27 disposed between the probe slider 23 and the conductive probe 26 may be provided at the tip portion of the probe slider 23. The piezoelectric element 27 includes a first piezoelectric element 27A and a second piezoelectric element 27B. The first piezoelectric element 27A drives the conductive probe 26 in the +Z axis direction and the −Z axis direction, and the second piezoelectric element 27B drives the conductive probe 26 in the +Y axis direction and the −Y axis direction. The piezoelectric element 27 may include not only the first piezoelectric element 27A and the second piezoelectric element 27B but also a third piezoelectric element 27C and a fourth piezoelectric element 27D, explained later.

Figure 12:
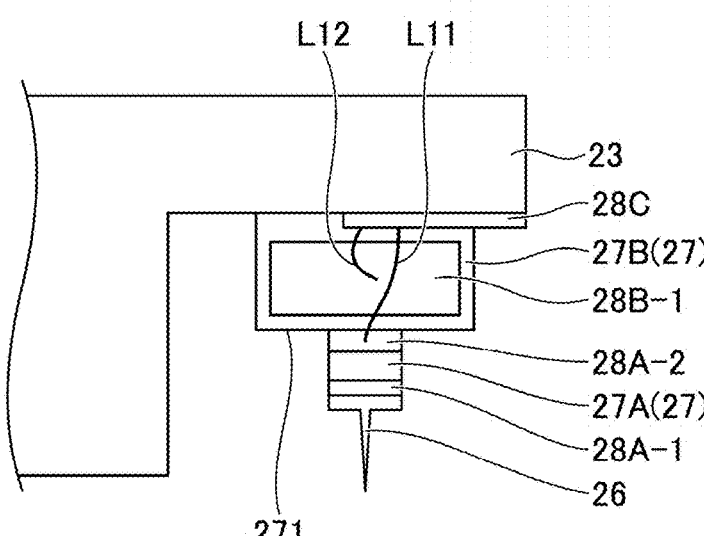
FIG. 12 is a partially enlarged cross-sectional view of FIG. 11.
Figure 12:
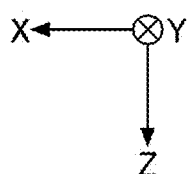
Figure 13:
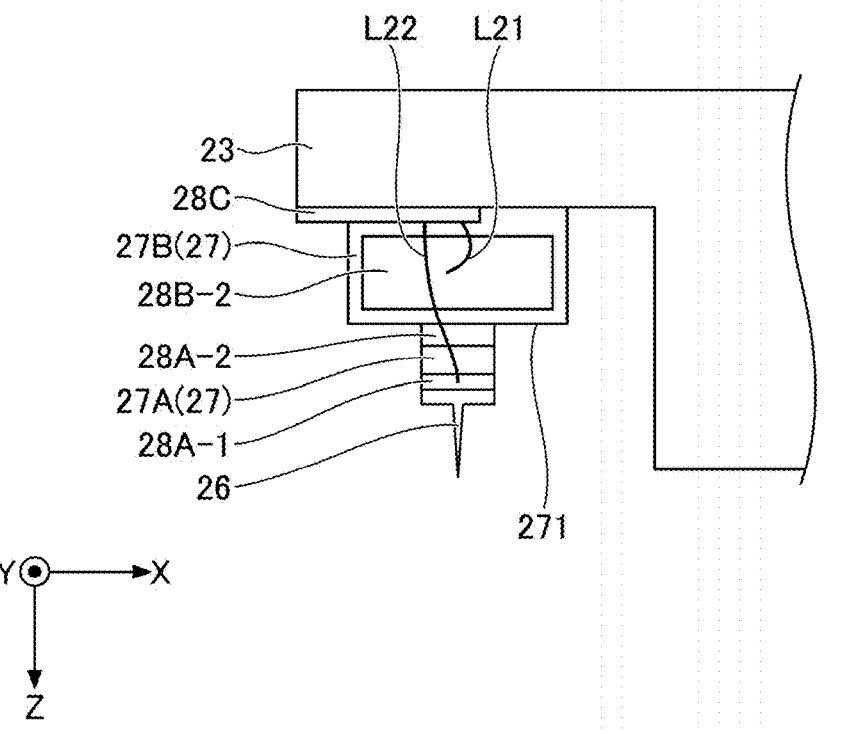
FIG. 13 is a partially enlarged cross-sectional view of FIG. 11 as seen from another direction.
Figure 14:
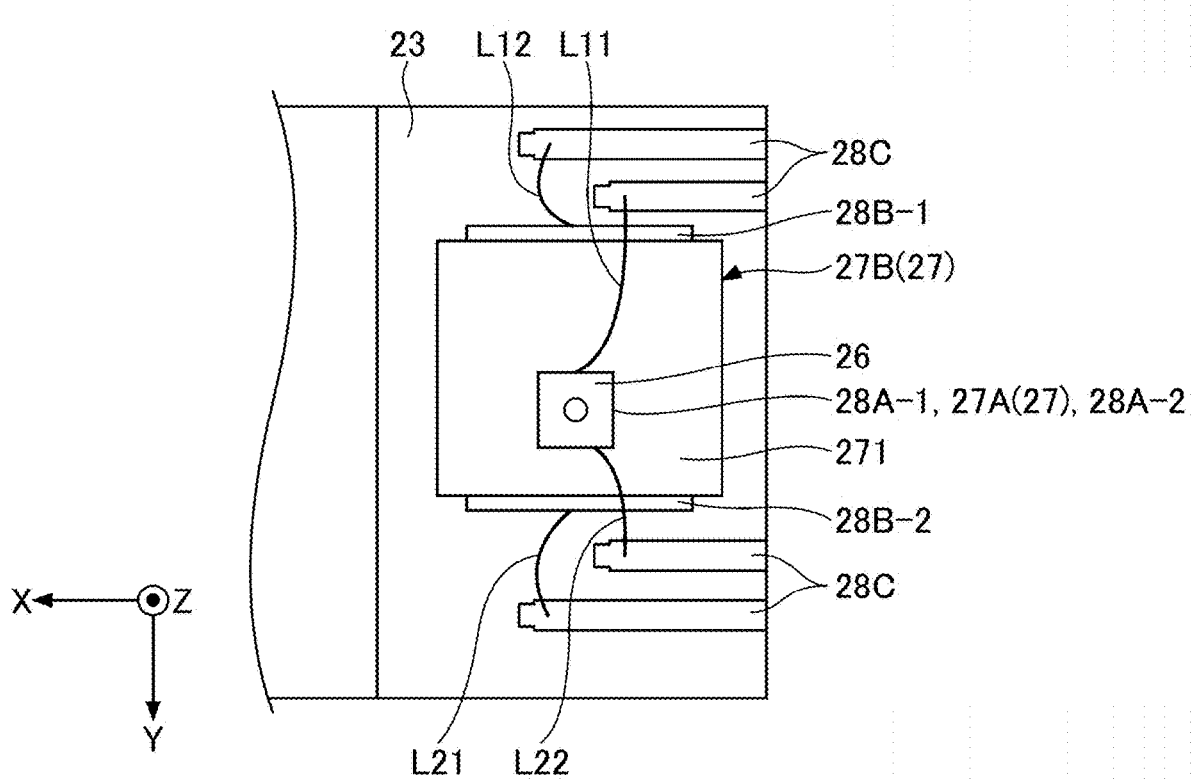
FIG. 14 is a partially enlarged view as seen from the lower side of FIG. 11.

FIG. 12 is a partially enlarged cross-sectional view of FIG. 11. FIG. 13 is a partially enlarged cross-sectional view of FIG. 11 as seen from another direction. FIG. 14 is a partially enlarged view as seen from the lower side of FIG. 11. As illustrated in FIG. 12 to FIG. 14, an electrode 28A-1 is provided between the conductive probe 26 and the first piezoelectric element 27A, and an electrode 28A-2 is provided between the first piezoelectric element 27A and the second piezoelectric element 27B. The electrode 28A-1 and the electrode 28A-2 disposed on the upper and lower surfaces of the first piezoelectric element 27A in the Z axis direction constitute a pair to sandwich the first piezoelectric element 27A.

The second piezoelectric element 27B is provided between the probe slider 23 and the electrode 28A-2, and an electrode 28B-1 and an electrode 28B-2 are provided on side surfaces of the second piezoelectric element 27B in the Y axis direction. The electrode 28B-1 is provided on a surface of the second piezoelectric element 27B on the +Y axis direction side, the electrode 28B-2 is provided on a surface of the second piezoelectric element 27B on the −Y axis direction side, and the electrode 28B-1 and the electrode 28B-2 constitute a pair to sandwich the second piezoelectric element 27B.

A wire L11 is connected to the electrode 28A-2, a wire L12 is connected to the electrode 28B-1, a wire L21 is connected to the electrode 28B-2, and a wire L22 is connected to the electrode 28A-1. The electrodes 28A-1, 28A-2, 28B-1, and 28B-2 are connected via wires to an electrode pad 28C provided on the lower surface of the probe slider 23, the electrode pad 28C being provided on the outer side of the electrode 28A-2 in the Y axis direction.

In this case, the electrode 28A-2 is used to polarize the first piezoelectric element 27A, but, on the other hand, the electrode 28A-2 is also in contact with the second piezoelectric element 27B, and therefore, the electrode 28A-2 may polarize the second piezoelectric element 27B. In order to prevent this, an insulating layer of a low dielectric constant is preferably provided between the electrode 28A-2 and the second piezoelectric element 27B, and the dielectric constant in this case is preferably equal to or less than $\frac{1}{100}$ of the dielectric constant of the second piezoelectric element 27B.

The piezoelectric effect includes a piezoelectric vertical effect, a piezoelectric horizontal effect, and a piezoelectric thickness-shear effect. At the electrode position as illustrated in FIG. 12 and FIG. 13, the piezoelectric vertical effect is used with respect to the first piezoelectric element 27A and the second piezoelectric element 27B, but in a case where other effects are used, electrodes may be provided on other surfaces of the piezoelectric element.

When the first piezoelectric element 27A is driven in the +Z axis direction or the −Z axis direction, the first piezoelectric element 27A is also displaced by the piezoelectric horizontal effect in the +Y axis direction or the −Y axis direction. The displacement of the first piezoelectric element 27A in the +Y axis direction or the −Y axis direction is preferably compensated by driving the second piezoelectric element 27B in the +Y axis direction or the −Y axis direction.

(Conductive Probe)

The conductive probe 26 has a function of recording information to and reproducing information from the ferroelectric recording layer 13 of the ferroelectric recording medium 10. The conductive probe 26 is a needle-shaped conductive electrode used for a scanning probe microscope such as a scanning tunneling microscope (STM), an atomic force microscope (AFM), and the like.

As illustrated in FIG. 11, the conductive probe 26 is provided on the lower surface of the second piezoelectric element 27B via the electrode 28A-1, and is preferably provided at a position shifted in the track direction of the ferroelectric recording medium 10 (the +Y axis direction or the −Y axis direction) with reference to the center of the lower surface of the second piezoelectric element 27B. For example, as illustrated in FIG. 14, the conductive probe 26 is preferably provided on the side of the electrode 28B-2 located on the +Y axis direction with reference to the center of the lower surface of the second piezoelectric element 27B. Alternatively, conversely to FIG. 14, the conductive probe 26 may be provided on the side of the electrode 28B-1 located on the −Y axis direction side with reference to the center of the lower surface of the second piezoelectric element 27B.

The conductive probe 26 travels by floating above the surface of the ferroelectric recording medium 10. In recording of information to and reproducing of information from the ferroelectric recording medium 10, it is preferable that the recording medium is rotated at a high speed similar to an HDD, and the probe slider 23 is caused to float by an air flow caused on the recording medium surface due to the rotation, so that information is recorded and reproduced with the conductive probe 26 attached to the probe slider 23. Specifically, the conductive probe 26 in the needle shape is attached to the probe slider 23, and this probe slider 23 is caused to travel by floating above the surface of the ferroelectric recording medium 10 in an order of nanometers, so that information is recorded and reproduced by bringing the conductive probe 26 in the needle shape to a position extremely close to the surface of the ferroelectric recording medium 10.

Examples of materials constituting the conductive probe 26 include metals such as tungsten, molybdenum, and platinum.

Figure 15:
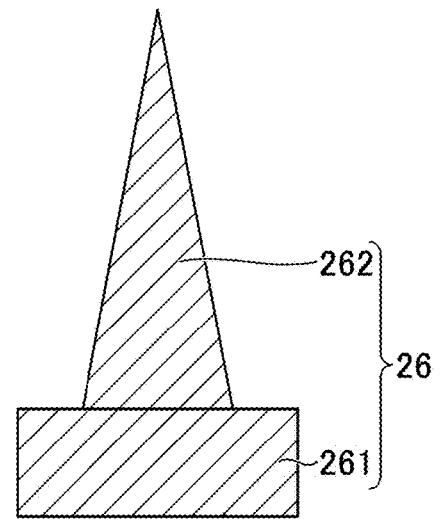
FIG. 15 is a cross-sectional view illustrating a configuration of a conductive probe.

FIG. 15 is a cross-sectional view illustrating a configuration of the conductive probe 26. As illustrated in FIG. 15 for example, the conductive probe 26 includes: a base body 261 provided on the piezoelectric element 27; and a needle-shaped electrode 262 formed on the base body 261 and made into a sharp shape. The base body 261 and the needle-shaped electrode 262 may be integrally formed of the same material, or may be formed of different materials.

Instead of the piezoelectric element 27, an electrostrictive element may be used. Both of the piezoelectric element and the electrostrictive element have the same function in that a displacement occurs in response to an electric field applied, but are different in that the direction of displacement of the piezoelectric element changes depending on the direction of the electric field, whereas the electrostrictive element only extends and does not shrink. Furthermore, they are different in that the piezoelectric element generates a charge according to the stress, whereas the electrostrictive element does not generate a charge in response to stress applied. Because both of the piezoelectric element and the electrostrictive element have the same function in that a displacement occurs in response to an electric field applied, both of the piezoelectric element and the electrostrictive element can be used for the ferroelectric storage apparatus in a similar manner.

The needle-shaped electrode 262 is an electrode formed in a cone shape, and a width direction and a height of the needle-shaped electrode 262 is, for example, several nanometers to millimeters.

When the curvature of the tip of the needle-shaped electrode 262 decreases, the electric field strength at the tip increases, and the voltage applied to the needle-shaped electrode 262 can be decreased, which is advantageous during recording of information to the ferroelectric recording medium 10. Furthermore, this makes it easier to bring the tip of the needle-shaped electrode 262 into proximity to the ferroelectric recording medium 10, which is advantageous during reading of information. The curvature radius of the tip of the needle-shaped electrode 262 is preferably several nanometers or less.

The conductive probe 26 scans on the surface of the ferroelectric recording medium 10 (the recording surface). The conductive probe 26 is brought to a position extremely close to the surface of the ferroelectric recording medium 10 (the recording surface). Then, an electric field that exceeds the coercive electric field of the ferroelectric layer 131 is applied from the conductive probe 26, and the polarization direction of the ferroelectric layer 131 located directly under the conductive probe 26 is inverted. The applied voltage is made into a pulse signal of which the level changes according to information to be recorded, and while the voltage is applied via the conductive probe 26 to the ferroelectric recording medium 10, the position of the conductive probe 26 with reference to the ferroelectric recording medium 10 is moved in a direction parallel to the surface of the ferroelectric recording medium 10. Accordingly, information can be recorded by polarizing the ferroelectric of the ferroelectric layer 131 of the ferroelectric recording medium 10.

A method for reproducing information recorded in the ferroelectric recording medium 10 is explained later.

The conductive probe 26 can be manufactured by using any given manufacturing method. For example, a manufacturing method of the conductive probe 26 may include a step of forming a mask in a dot shape on the surface of the conductive material, a step of obtaining a needle-shaped electrode formed in a cone shape by etching the conductive material, and a step of removing the mask. Accordingly, the conductive probe 26 is formed so that the conductive probe 26 is formed in a cone shape on the base body 261 made of the etched conductive material, and includes the needle-shaped electrode 262 that is made into a sharp shape.

Figure 16:
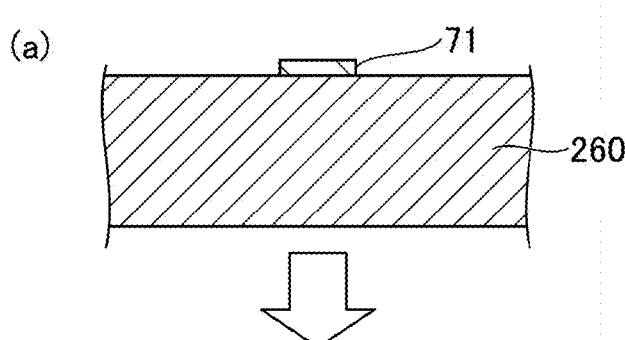
FIG. 16 is a drawing illustrating an example of a manufacturing method of a conductive probe.
Figure 16:
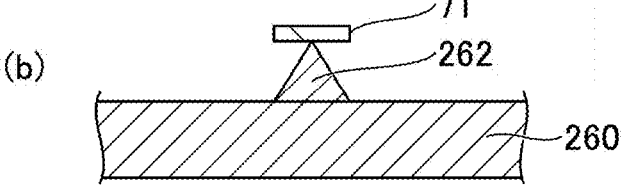
Figure 16:
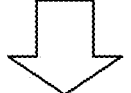
Figure 16:
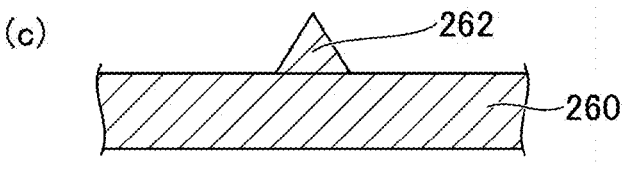
Figure 16:
Figure 16:
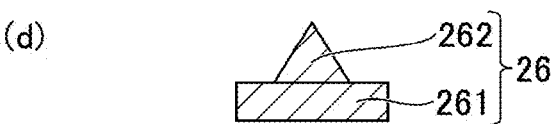

An example of the manufacturing method of the conductive probe 26 is explained. FIG. 16 is a drawing illustrating an example of the manufacturing method of the conductive probe 26. As illustrated in FIG. 16, after the mask 71 in the dot shape is formed on the surface of the conductive material 260 (see FIG. 16 (*a*)), the conductive material 260 is etched (see FIG. 16 (*b*)). Etching is delayed in the portion of the conductive material 260 where the mask 71 is provided, and accordingly, as a result of lift off of the mask 71, the needle-shaped electrode 262 in a substantially cone shape is formed under the mask 71 (see FIG. 16 (*c*)). Thereafter, the conductive material 260 around the needle-shaped electrode 262 is cut off, so that the conductive probe 26 including the needle-shaped electrode 262 formed in a cone shape on the base body 261 is formed (see FIG. 16 (*d*)).

In a case where a step of cutting out the needle-shaped electrode 262 is performed by machine processing, the needle-shaped electrode 262 may be damaged. In this case, it is preferable to etch the conductive material 260, after the location where the needle-shaped electrode is to be formed is cut out.

In a case where the conductive material 260 used in the above-described step is an insulator or a semiconductor material, the conductive film may be formed by coating the surface of the manufactured needle-shaped electrode with Au (gold) or the like by a sputtering method, so that conductivity is imparted to the needle-shaped electrode.

Figure 17:
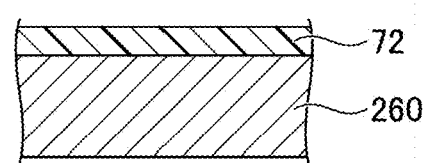
FIG. 17 is a drawing illustrating an example of another manufacturing method of a conductive probe.
Figure 17:
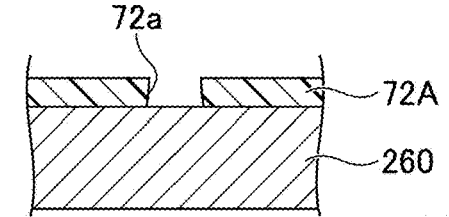
Figure 17:
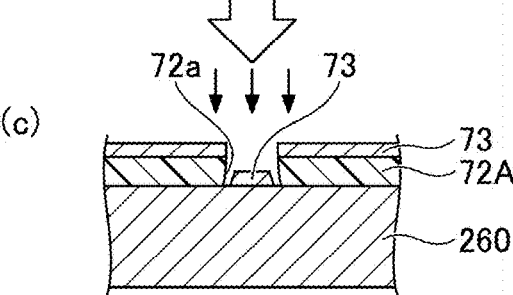
Figure 17:
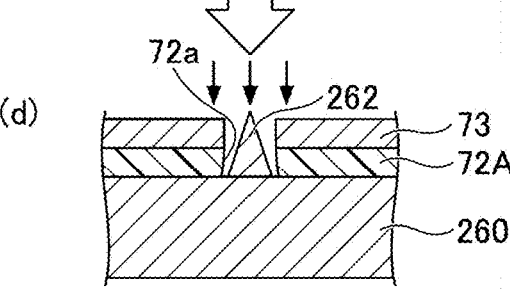
Figure 17:
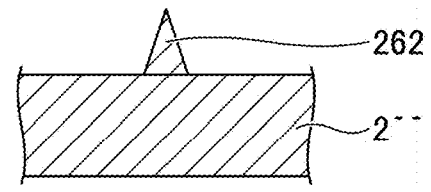

Alternatively, the conductive probe 26 may be manufactured by using other manufacturing methods. FIG. 17 is a drawing illustrating an example of another manufacturing method of the conductive probe 26. As illustrated in FIG. 17, a photoresist 72 is applied to the surface of the conductive material 260 (a photoresist application step (see FIG. 17 (*a*))).

Next, the photoresist 72 is etched in a circular shape, and a mask 72A having a very small through hole (hole) 72*a* in a circular shape is formed in the photoresist 72 (a mask formation step (see FIG. 17 (*b*))).

Next, a metal 73 is deposited onto the surface of the conductive material 260 in a through hole 72*a* and onto the mask 72A to form the needle-shaped electrode 262 formed in the substantially cone shape (a formation step of the needle-shaped electrode (see FIG. 17 (*c*) and (*d*))).

In this case, when the amount of deposited metal 73 that is formed by deposition on the mask 72A increases, the through hole 72*a* is closed and the width of the through hole 72*a* decreases. Accordingly, the metal 73 deposited on the bottom portion in the through hole 72*a* of the mask 72A is widely deposited on the bottom portion, and the deposition range gradually decreases toward the upper side. Ultimately, the needle-shaped electrode 262 deposited in the substantially cone shape is formed (see FIG. 17 (*d*)).

Next, the conductive probe 26 including the needle-shaped electrode 262 is obtained by removing the mask 72A (a production step of the conductive probe (see FIG. 17 (*e*))). The conductive probe 26 including the needle-shaped electrode 262 formed in the cone shape on the base body 261 is obtained by removing the mask 72A and cutting off the conductive material 260 around the needle-shaped electrode 262.

The conductive probe 26 can be used in various aspects. Aspects of the conductive probe 26 are explained.

((First Aspect))

Figure 18:
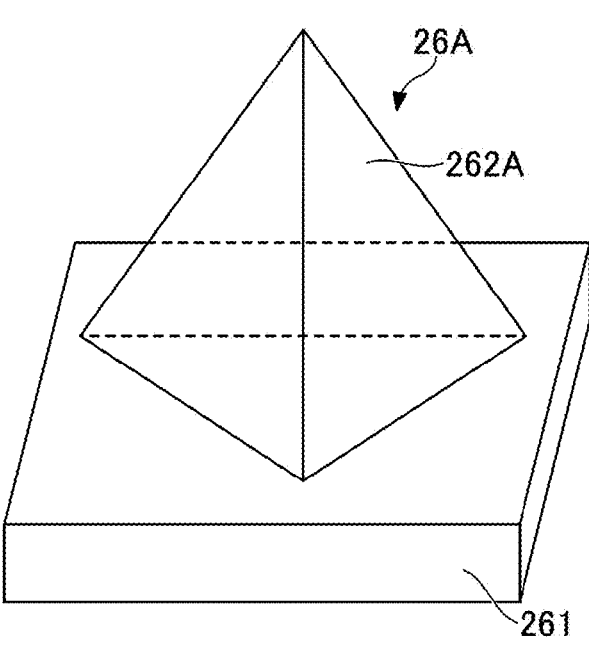
FIG. 18 is a perspective view illustrating another configuration of a conductive probe.
Figure 19:
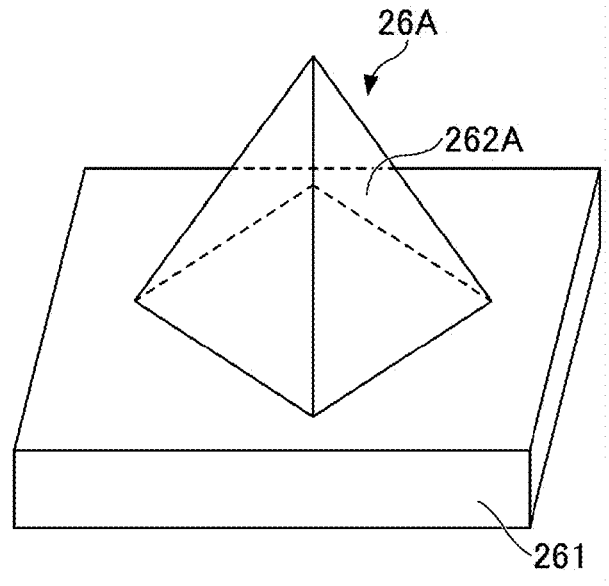
FIG. 19 is a perspective view illustrating another configuration of a conductive probe.

As illustrated in FIG. 18 and FIG. 19, a conductive probe 26A is preferably formed in a triangular or quadrangular pyramid. When anisotropic etching is performed on the conductive material using single-crystal, a top portion formed by any given crystal plane (a textured surface) can be readily formed.

For example, in a case where the conductive material 260 uses a (100) plane of single-crystal having a diamond structure such as Si, the (100) plane is processed as the crystal plane, so that the conductive probe 26A can be readily formed in a quadrangular pyramid that includes four (111) equivalent planes and that includes a sharp top portion. Therefore, in a case where the conductive probe 26A is in a substantially triangular pyramid or substantially quadrangular pyramid shape, the conductive probe 26A may be made into a conductive probe having a sharp top portion, as compared with the case where the conductive probe 26A is in a substantially cone shape.

In a case where the conductive probe 26A is in a substantially triangular pyramid or substantially quadrangular pyramid shape, the conductive probe 26A can have a sharper top portion, as compared with the case where the conductive probe 26A is in a substantially cone shape similar to the conductive probe 26.

Furthermore, in order to uniformize the electric field distribution that occurs at the tip of the conductive probe 26A during writing and to stabilize the tunnel current flowing between the conductive probe 26A and the ferroelectric layer 131 during reading, the conductive probe 26A is preferably rotationally symmetric about the axis that passes the tip thereof.

The conductive probe 26A can be manufactured using any given manufacturing method. A manufacturing method of the conductive probe 26A may be such that, for example, the shape of the mask 71 formed on the surface of the conductive material 260 is a triangular or quadrangular shape in the manufacturing method of the conductive probe as illustrated in FIG. 16 explained above. Accordingly, as illustrated in FIG. 18 and FIG. 19, the conductive probe 26A including the needle-shaped electrode 262A in a triangular pyramid or quadrangular pyramid shape on the base body 261 can be formed.

It is preferable to perform anisotropic etching on the conductive material 260 using single-crystal, and use a method for forming the top portion formed by any given crystal plane (textured surface). For example, in a case where the conductive material 260 uses the (100) plane of single-crystal having a diamond structure such as Si, the conductive probe 26A can form, with a high reproducibility, the quadrangular pyramid that is constituted by four (111) equivalent planes and that includes a sharp top portion.

In this case, for the anisotropic etching, it is preferable to use reactive ion etching (RIE) using an etching gas such as $SF_6$, wet etching using KOH as an etchant, and the like.

Alternatively, the conductive probe 26A can be manufactured using other manufacturing methods. Another manufacturing method of the conductive probe 26A may be such that, for example, the shape of the through hole 72*a* formed in the photoresist 72 is a triangular or quadrangular shape, and the mask 72A including the through hole 72*a* in the triangular or quadrangular shape in the photoresist 72 is formed, in the mask formation step in the manufacturing method of the conductive probe as illustrated in FIG. 17 explained above. The shape of the through hole 72*a* is formed in the triangular or quadrangular shape, so that the needle-shaped electrode 262 in the substantially triangular pyramid or quadrangular pyramid shape is formed on the conductive material 260. Accordingly, as illustrated in FIG. 18 and FIG. 19, the conductive probe 26A having the needle-shaped electrode 262A in the triangular pyramid or quadrangular pyramid shape on the base body 261 is obtained.

((Second Aspect))

Figure 20:
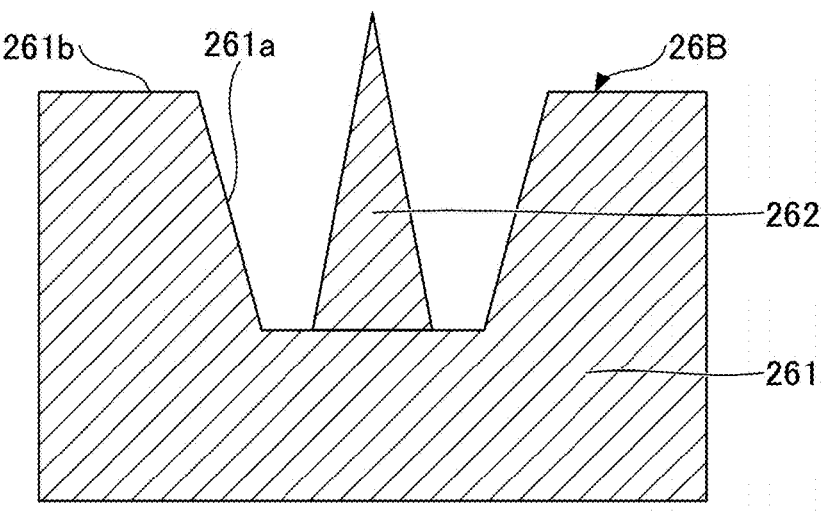
FIG. 20 is a cross-sectional view illustrating another configuration of a conductive probe.

FIG. 20 illustrates a cross-sectional view of another configuration of the conductive probe 26. As illustrated in FIG. 20, a conductive probe 26B preferably includes a base body 261 constituted by a conductive material, a recessed portion 261*a* formed in the base body 261, and a needle-shaped electrode 262 formed in a cone shape in the recessed portion 261*a*, wherein a portion of the needle-shaped electrode 262 preferably protrudes from a surface (principal surface) 261*b* of the base body 261. The surface 261*b* of the base body 261 refers to a surface of the principal surface of the base body 261 that is other than the recessed portion 261*a*.

In the conductive probe 26B, most of the needle-shaped electrode 262 is surrounded by and covered with the base body 261, and therefore, when the conductive probe 26B accidentally comes into contact with ferroelectric recording medium 10, damage to the needle-shaped electrode 262 can be alleviated. Furthermore, due to air flow caused by rotation of the ferroelectric recording medium 10, occurrence of vibration and deformation of the needle-shaped electrode 262 can be alleviated.

Figure 21:
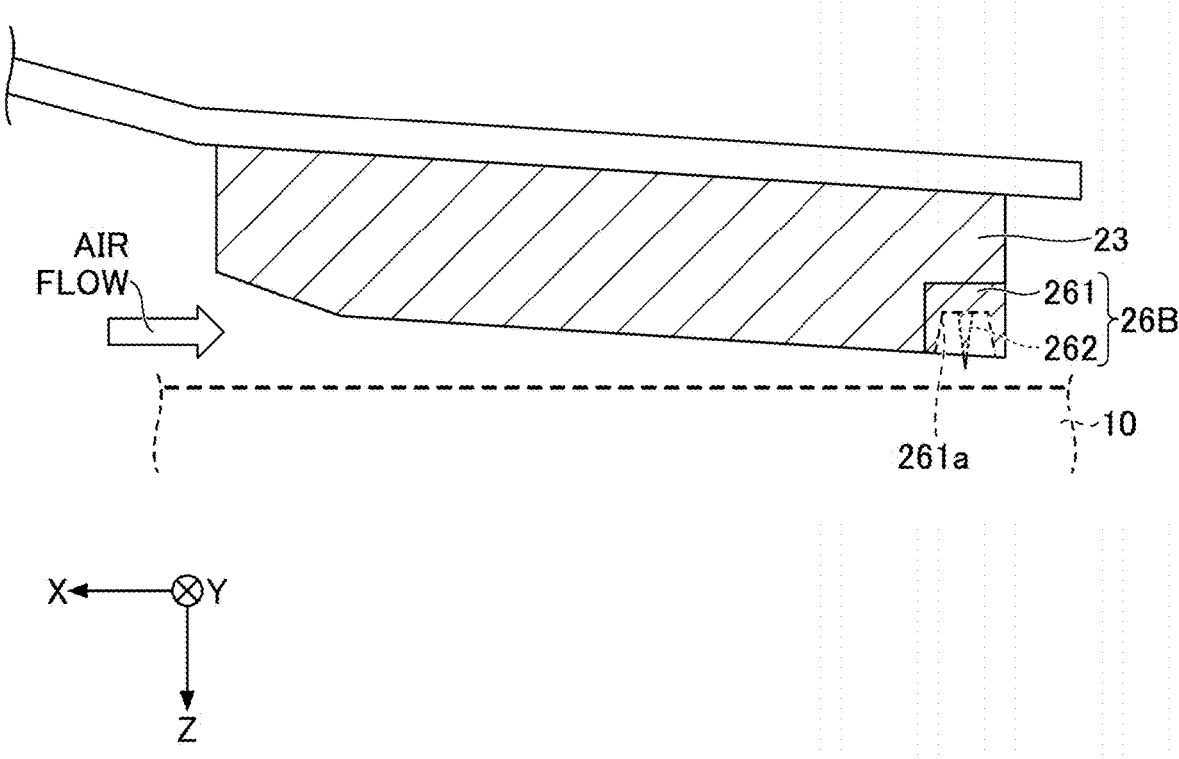
FIG. 21 is a cross-sectional view illustrating an example of configuration of a probe slider.

FIG. 21 is a cross-sectional view illustrating an example of configuration of the probe slider 23 on which the conductive probe 26B is provided.

A manufacturing method of the conductive probe 26B is explained. The manufacturing method of the conductive probe 26B includes a step of applying a photoresist to the surface of the conductive material, a step of forming a mask having a very small through hole (hole) by patterning a photoresist, a step of forming a recessed portion in the surface of the conductive material by etching the conductive material in the hole, a step of depositing a metal film on a bottom portion of the recessed portion of the conductive material formed in the through hole, and a step of obtaining a needle-shaped electrode formed in a cone shape on the bottom portion of the recessed portion of the conductive material by removing the photoresist, wherein a portion of the needle-shaped electrode 262 is caused to protrude from the conductive material. According to the above, the conductive probe 26B is obtained.

Figure 22:
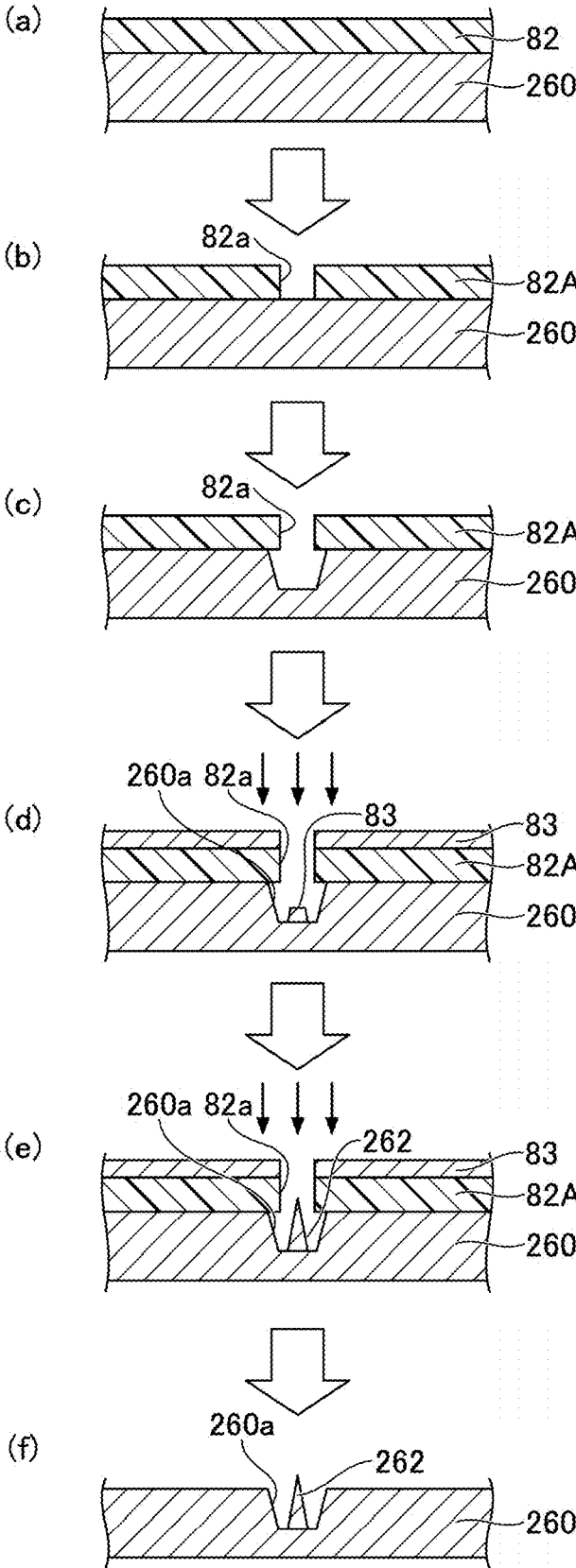
FIG. 22 is an explanatory diagram illustrating an example of another manufacturing method of a conductive probe.

FIG. 22 is an explanatory diagram illustrating an example of the manufacturing method of the conductive probe 26B. As illustrated in FIG. 22, after a photoresist 82 is applied to the surface of the conductive material 260 (see FIG. 22 (a)) and patterning is performed, a mask 82A including a very small through hole (hole) 82a in the photoresist 82 is formed (see FIG. 22 (b)). Thereafter, a recessed portion 260a is formed in the surface of the conductive material 260 by etching the through hole 82a using any given etching method as appropriate (see FIG. 22 (c)). After the etching, a metal 83 is deposited onto the bottom portion of the recessed portion 260a of the conductive material 260 formed in the through hole 82a and onto the photoresist 82 (see FIG. 22 (d)). In this case, when the amount of deposited metal 83 that is formed by deposition on the photoresist 82 increases, the through hole 82a is closed and the width of the through hole 82a decreases. Accordingly, the metal 83 deposited on the bottom portion in the recessed portion 260a of the conductive material 260 is widely deposited on the bottom portion, and the deposition range gradually decreases toward the upper side. Ultimately, the needle-shaped electrode 262 deposited in the cone shape is formed (see FIG. 22 (e)).

Thereafter, by removing the mask 82A (see FIG. 22 (f)), a portion including the top portion of the needle-shaped electrode 262 in the cone shape is caused to slightly protrude from the conductive material 260.

By cutting off the conductive material 260 around the needle-shaped electrode 262, the conductive probe 26B including the needle-shaped electrode 262 formed in the cone shape is formed in the recessed portion 261a of the base body 261 as illustrated in FIG. 20.

According to this manufacturing method, the needle-shaped electrode 262 is formed in the recessed portion 261a, and is surrounded by and covered with the base body 261, and therefore, when the conductive probe 26B accidentally comes into contact with the ferroelectric recording medium 10, damage to the needle-shaped electrode 262 can be alleviated. Furthermore, due to air flow caused by rotation of the ferroelectric recording medium 10, occurrence of vibration and deformation of the needle-shaped electrode 262 can be alleviated.

When the shape of the through hole 82a is made into a triangular or quadrangular shape, the conductive probe 26B can be formed in a triangular pyramid or quadrangular pyramid shape.

((Third Aspect))

Figure 23:
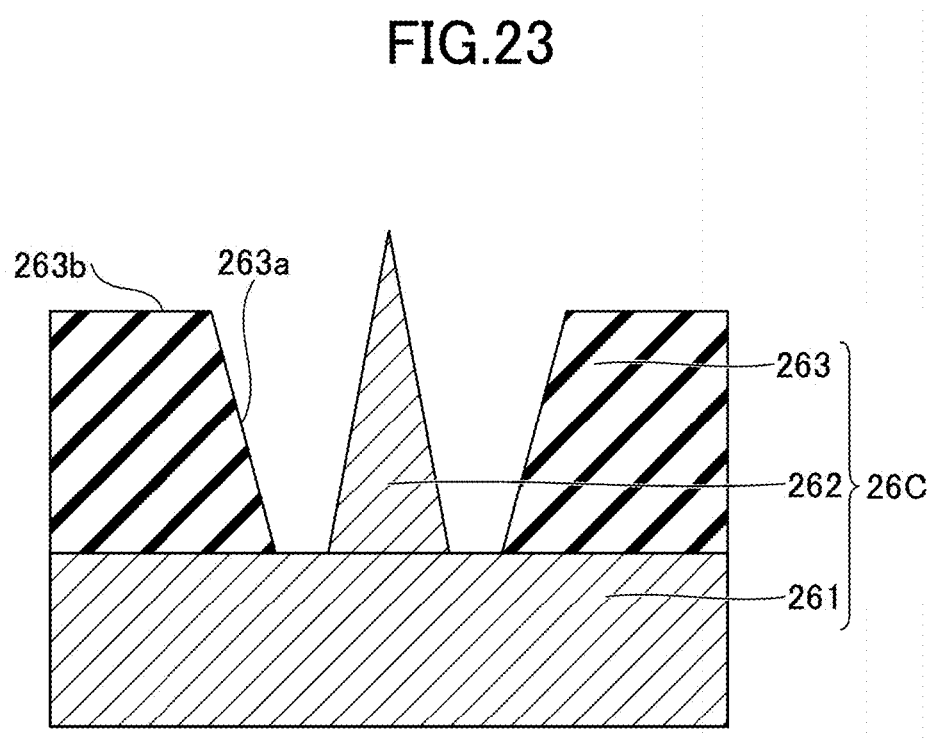
FIG. 23 is a cross-sectional view illustrating another configuration of a conductive probe.

FIG. 23 illustrates an example of configuration of the conductive probe 26. As illustrated in FIG. 23, a conductive probe 26C preferably includes an insulating layer 263, formed by oxidizing the conductive material 260 through heating, on the base body 261 constituted by the conductive material, wherein the needle-shaped electrode 262 is provided on the base body 261 in a through hole 263a of the insulating layer 263, and a portion of the needle-shaped electrode 262 protrudes from a surface (principal surface) 263b of the insulating layer 263. The surface 263b of the insulating layer 263 refers to a surface of the principal surface of the base body 261 that is other than the through hole 263a.

The needle-shaped electrode 262 is formed on the surface of the base body 261 in the through hole 263a, and is surrounded by and covered with the insulating layer 263, and therefore, when the needle-shaped electrode 262 accidentally comes into contact with the ferroelectric recording medium 10, damage to the needle-shaped electrode 262 can be alleviated. Furthermore, due to air flow caused by rotation of the ferroelectric recording medium 10, occurrence of vibration and deformation of the needle-shaped electrode 262 can be alleviated. Still furthermore, because the insulating layer 263 is provided around the needle-shaped electrode 262, the needle-shaped electrode 262 is shielded, so that the influence caused by charge around the needle-shaped electrode 262 and leakage of the charge in the needle-shaped electrode 262 to the outside can be alleviated.

A manufacturing method of the conductive probe 26C is explained. The manufacturing method of the conductive probe 26C includes a step of forming, on the conductive material 260, the insulating layer by oxidizing the conductive material 260 and a step of forming an isolation layer on the insulating layer, wherein a portion of the needle-shaped electrode is caused to protrude from the insulating layer. As a result, the conductive probe 26C is obtained.

Figure 24:
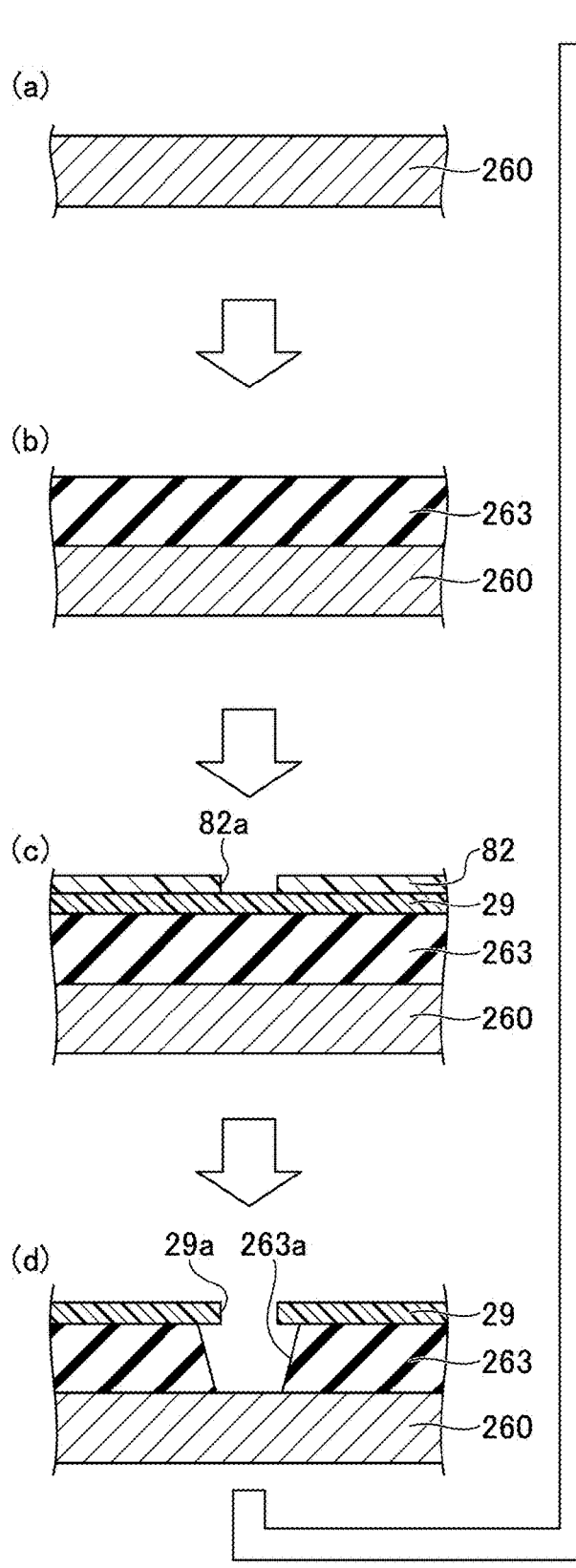
FIG. 24 is an explanatory diagram illustrating an example of another manufacturing method of a conductive probe.
Figure 24:
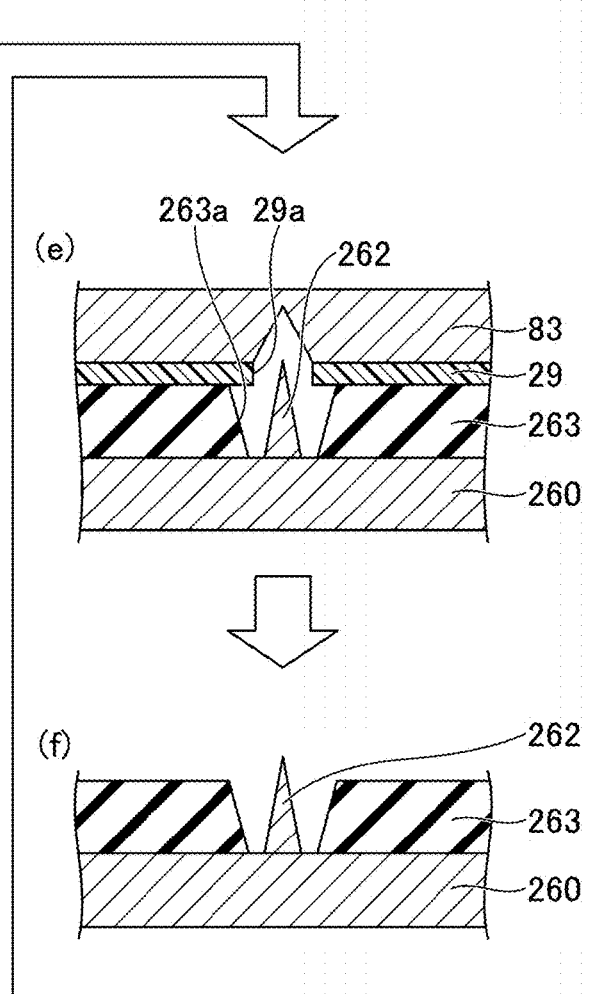

FIG. 24 is an explanatory diagram illustrating an example of the manufacturing method of the conductive probe 26C. As illustrated in FIG. 24, the insulating layer 263 is formed by heating and oxidizing the conductive material 260 (see FIG. 24 (a) and (b)). Thereafter, the isolation layer 29 is formed on the insulating layer 263, the photoresist 82 is applied to the surface of the isolation layer 29 and patterning is performed, and a very small through hole 82a in a circular shape is formed in the photoresist 82 (see FIG. 24 (c)). Thereafter, the insulating layer 263 and the isolation layer 29 of the through hole 82a are etched using any given etching method as appropriate (see FIG. 24 (d)). In FIG. 24 (d), the photoresist 82 is removed after the insulating layer 263 and the isolation layer 29 are etched, but at least a portion of the photoresist 82 may be preserved.

After the etching, the metal 83 is deposited onto the surface of the conductive material 260 in the through holes 263a and 29a of the insulating layer 263 and the isolation layer 29, respectively, and onto the isolation layer 29 (see FIG. 24 (e)). In this case, when the amount of deposited metal 83 that is formed by deposition on the photoresist 82 increases, the through hole 29a is closed and the width of the through hole 29a decreases. Accordingly, the metal 83 deposited on the surface of the conductive material 260 in the through hole 29a is widely deposited on the surface, and the deposition range gradually decreases toward the upper side. Ultimately, the metal 83 is deposited in the cone shape. Accordingly, the needle-shaped electrode 262 deposited in the cone shape is formed.

Thereafter, by etching the isolation layer 29, a portion including the top portion of the needle-shaped electrode 262 in the cone shape is caused to slightly protrude from the principal surface of the insulating layer 263 (see FIG. 24 (f)).

By cutting off the conductive material 260 around the needle-shaped electrode 262, the conductive probe 26C including the needle-shaped electrode 262 formed in the cone shape is formed in the through hole 263a of the insulating layer 263 on the base body 261 as illustrated in FIG. 23.

According to this manufacturing method, the needle-shaped electrode 262 is formed on the surface of the base body 261 in the through hole 263a, and is surrounded by and covered with the insulating layer 263, and therefore, when the conductive probe 26C accidentally comes into contact with the ferroelectric recording medium 10, damage to the needle-shaped electrode 262 can be alleviated. Furthermore, due to air flow caused by rotation of the ferroelectric recording medium 10, occurrence of vibration and deformation of the needle-shaped electrode 262 can be alleviated. Still furthermore, because the insulating layer 263 is provided around the needle-shaped electrode 262 in the conductive probe 26C, the needle-shaped electrode 262 is shielded, so that the influence caused by charge around the needle-shaped electrode 262 and leakage of the charge in the needle-shaped electrode 262 can be alleviated by shielding the needle-shaped electrode 262.

(First Piezoelectric Element and Second Piezoelectric Element)

As illustrated in FIG. 11, in the probe slider 23 having the configuration as illustrated in FIG. 11, the first piezoelectric element 27A is provided, at the tip portion of the probe slider 23, between the probe slider 23 and the conductive probe 26, so that the first piezoelectric element 27A is sandwiched between the electrode 28A-1 and the electrode 28A-2. Also, the second piezoelectric element 27B is provided between the tip portion of the probe slider 23 and the electrode 28A-2, and the electrode 28B-1 and the electrode 28B-2 are provided on the side surface of the second piezoelectric element 27B on the +Y axis direction side and the side surface of the second piezoelectric element 27B on the −Y axis direction side, respectively. The first piezoelectric element 27A can be used to adjust the height of floating of the header (dynamic fly height (DFH)) of the conductive probe 26, and the second piezoelectric element 27B has a function of moving the conductive probe 26 in the track direction of the ferroelectric recording medium 10.

In the present embodiment, electrostrictive elements may be used in place of the first piezoelectric element 27A and the second piezoelectric element 27B. Both of the first piezoelectric element 27A and the second piezoelectric element 27B and the electrostrictive element have the same function in that a displacement occurs in response to an electric field applied, but are different in that the direction of displacement of the first piezoelectric element 27A and the second piezoelectric element 27B change depending on the direction of the electric field, whereas the electrostrictive element only extends and does not shrink. Furthermore, they are different in that the first piezoelectric element 27A and the second piezoelectric element 27B generate charge according to the stress, whereas the electrostrictive element does not generate a charge in response to stress applied. Because both of the first piezoelectric element 27A and the second piezoelectric element 27B and the electrostrictive element have the same function in that a displacement occurs in response to an electric field applied, both of the first piezoelectric element 27A and the second piezoelectric element 27B and the electrostrictive element can be used for the ferroelectric storage apparatus in a similar manner.

As illustrated in FIG. 11, the first piezoelectric element 27A is provided on the surface of the lower end side at the tip of the probe slider 23, and can be used for adjustment of the height of floating of the header (dynamic fly height (DFH)) of the conductive probe 26. Specifically, the first piezoelectric element 27A is provided between the probe slider 23 and the conductive probe 26, and the distance between the ferroelectric recording medium 10 and the conductive probe 26 is adjusted, so that the probe slider 23 can be caused to travel by floating above the surface of the ferroelectric recording medium 10 by a distance in an order of nanometers. The amount of displacement of the first piezoelectric element 27A can be controlled in an order of nanometers, and the responsiveness thereof is 10 microseconds or less. Therefore, the distance between the conductive probe 26 and the ferroelectric recording medium 10 can be controlled at a high speed with a high degree of accuracy.

The first piezoelectric element 27A and the second piezoelectric element 27B may be constituted by, for example, quartz, lithium niobate ($LiNbO_3$), barium titanate ($BaTiO_3$), titanate lead zirconate (PZT), zinc oxide (ZnO), aluminum nitride (AlN), lithium tantalate ($LiTaO_3$), lead titanate (PT), and the like. In a case where electrostrictive elements are used in place of the first piezoelectric element 27A and the second piezoelectric element 27B, the electrostrictive elements may be constituted by materials listed above.

The first piezoelectric element 27A is provided at the tip portion of the probe slider 23, so that the DFH control of the conductive probe 26 can be performed at a high speed with a high degree of accuracy, and the distance between the conductive probe 26 and the ferroelectric recording medium 10 can be controlled at a high speed with a high degree of accuracy. Therefore, the ferroelectric storage apparatus 100 can further enhance the recording and reproduction sensitivity of the conductive probe 26.

Furthermore, because the first piezoelectric element 27A is provided at the tip portion of the probe slider 23, the probe slider 23 can have an automatic gain control (AGC) function between tracks and between sectors of the ferroelectric recording medium 10.

For example, as explained later, a voice coil motor can be used as the probe driving unit 40 (see FIG. 8) that moves the conductive probe 26 in the track direction of the ferroelectric recording medium 10. However, in a case where a voice coil motor is used, the accuracy of positioning of the conductive probe 26 is about 10 nm. Furthermore, it takes several milliseconds for moving time to another track (seek time), which becomes an obstacle in increasing the capacity and speed of the ferroelectric storage apparatus 100.

In the present embodiment, the second piezoelectric element 27B is used to move the conductive probe 26 in the track direction of the ferroelectric recording medium 10, and therefore, the accuracy of positioning in the track direction of the ferroelectric recording medium 10 can be 1 nm or less, and a correcting operation in a same track and a moving operation to another track can be performed in several micro seconds or less. Accordingly, the capacity and the speed of the ferroelectric storage apparatus 100 can be increased.

As illustrated in FIG. 12 and FIG. 13, the first piezoelectric element 27A and the second piezoelectric element 27B are provided between the probe slider 23 and the conductive probe 26. Because the first piezoelectric element 27A and the second piezoelectric element 27B are provided stably between the probe slider 23 and the conductive probe 26, the first piezoelectric element 27A and the second piezoelectric element 27B are preferably formed as a columnar body such as a cube, a rectangular parallelepiped, a cylinder, and the like. The pair of electrodes 28A-1 and 28A-2 are provided on the surface of the first piezoelectric element 27A on the +Z axis direction side and the surface of the first piezoelectric element 27A on the −Z axis direction side. The electrode 28A-1 is provided between the conductive probe 26 and the first piezoelectric element 27A. The electrode 28A-2 is provided between the first piezoelectric element 27A and the second piezoelectric element 27B.

As illustrated in FIG. 14, the pair of electrodes 28B-1 and 28B-2 is provided on the second piezoelectric element 27B. The electrode 28B-1 is provided on the −Y axis direction side of the second piezoelectric element 27B. The electrode 28B-2 is provided on the +Y axis direction side of the second piezoelectric element 27B.

The electrodes 28A-1 and 28A-2 cause the first piezoelectric element 27A to expand and contract in the +Z axis direction and the −Z axis direction, and are used to apply a voltage for adjusting the distance between the conductive probe 26 and the ferroelectric recording medium 10. This feature is explained later.

Figure 25:
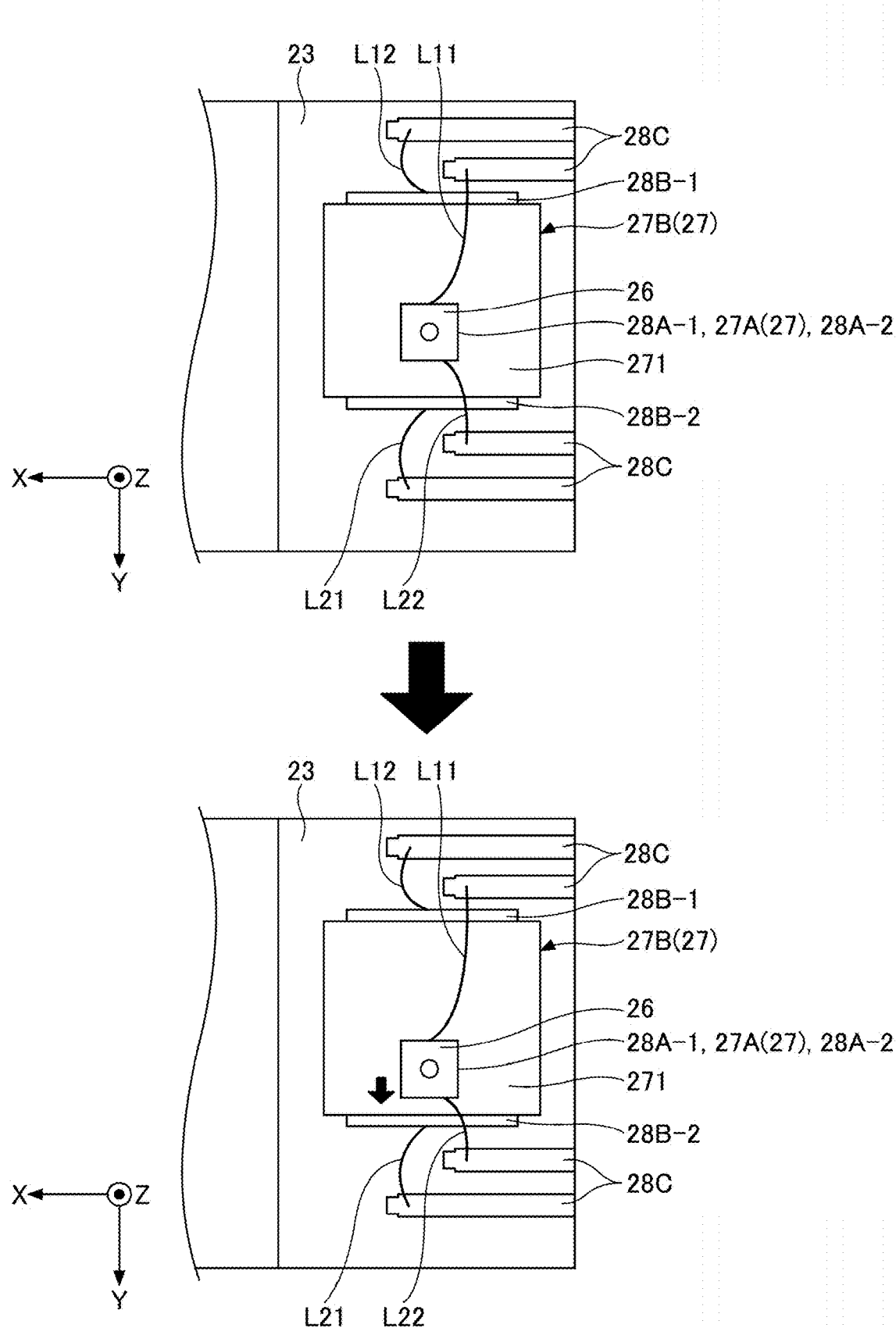
FIG. 25 is an explanatory diagram illustrating displacement of a conductive probe.

The electrodes 28B-1 and 28B-2 cause the second piezoelectric element 27B to expand and shrink in the +Y axis direction and the −Y axis direction, and are used to move the conductive probe 26 provided on the probe slider 23 in the track direction of the ferroelectric recording medium 10. The surface of the second piezoelectric element 27B on the −Z axis direction side is fixed to the probe slider 23, and the surface of the second piezoelectric element 27B on the +Z axis direction is not fixed. Accordingly, when a voltage is applied to the electrodes 28B-1 and 28B-2, a surface 271 of the second piezoelectric element 27B on the +Z axis direction side expands and shrinks in the +Y axis direction and the −Y axis direction. In this case, the surface 271 of the second piezoelectric element 27B on the +Z axis direction side expands and shrinks uniformly in the +Y axis direction and the −Y axis direction, and accordingly, the center of the surface is not displaced in the Y axis direction, but the conductive probe 26 is provided with a shift in position from the center of the surface 271 of the second piezoelectric element 27B on the +Z axis direction side, and accordingly, the conductive probe 26 is displaced in the +Y axis direction or the −Y axis direction that is the track direction of the ferroelectric recording medium 10. For example, as illustrated in FIG. 25, in a case where the second piezoelectric element 27B expands in the +Y axis direction and in the −Y axis direction, the conductive probe 26 is displaced in the +Y axis direction indicated by the arrow.

In moving the conductive probe 26 in the track direction of the ferroelectric recording medium 10, it is preferable to move the conductive probe 26 by expanding and shrinking the second piezoelectric element 27B by using the probe driving unit 40 such as a voice coil motor, a pulse motor, and the like in a rough operation in which the movement distance of the conductive probe 26 is equal to or more than 10 nm and by using the second piezoelectric element 27B provided on the probe slider 23 in a fine operation in which the movement distance of the conductive probe 26 is less than 10 nm.

[Ferroelectric Recording Medium Driving Unit]

Figure 26:
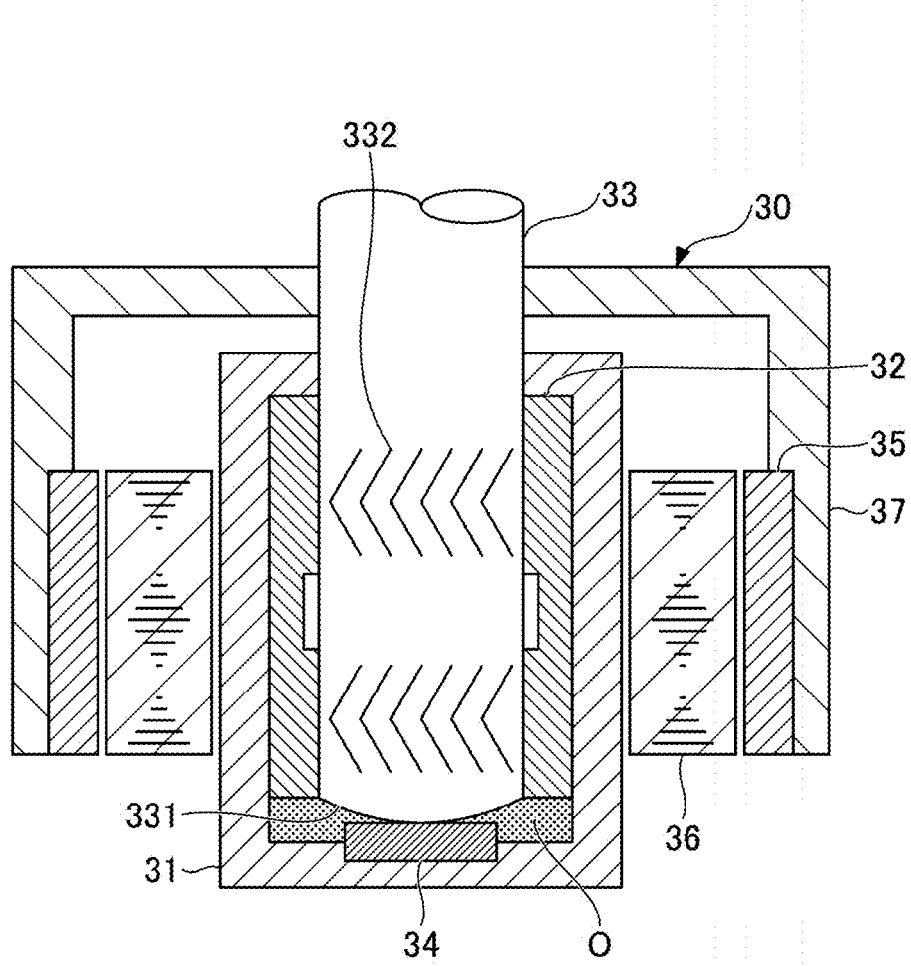
FIG. 26 is a cross-sectional view illustrating a configuration of a ferroelectric recording medium driving unit.

As illustrated in FIG. 8, the ferroelectric recording medium driving unit 30 drives and rotates the ferroelectric recording medium 10. FIG. 26 is a cross-sectional view illustrating a configuration of the ferroelectric recording medium driving unit 30. As illustrated in FIG. 26, the ferroelectric recording medium driving unit 30 includes a housing (bearing cylinder) 31, a bearing sleeve 32, a shaft member (spindle shaft) 33, a housing bottom portion 34, permanent magnets 35, a stator 36, and lubricant oil O. The ferroelectric recording medium driving unit 30 supports, in a housing 31, the spindle shaft 33 in the radial direction of the spindle shaft 33 (the direction orthogonal to the spindle shaft 33) in a non-contact state, with the pressure generated by a dynamic pressure action of the lubricant oil O.

The housing 31 is a container for containing a portion of the spindle shaft 33, and is formed so that the spindle shaft 33 can be inserted thereto.

The bearing sleeve 32 is provided in the housing 31.

The spindle shaft 33 is a stick-shaped member inserted to the inner circumferential surface of the bearing sleeve 32, and has a conductivity. The spindle shaft 33 can be formed by a conductive material such as metal and the like. The spindle shaft 33 is inserted into the opening portion 10a of the ferroelectric recording medium 10 (see FIG. 3), so that the spindle shaft 33 is connected via the substrate 11 and the electrode layer 12 to the ferroelectric recording layer 13 (see FIG. 3). Because the spindle shaft 33 has conductivity, information can be read from and information can be written to the ferroelectric recording layer 13 with the conductive probe 26.

The shaft end portion 331 of the spindle shaft 33 preferably has a curved surface formed in a convex shape. A curvature radius of the curved surface of the shaft end portion 331 is preferably 2 mm or more and is more preferably 5 mm or more. Note that the curved surface of the shaft end portion 331 may be formed in a concave shape.

Groove portions 332 in a V shape can be provided on the outer circumference of the spindle shaft 33. The spindle shaft 33 includes the groove portions 332, so that when the spindle shaft 33 rotates, a flow occurs in the lubricant oil O, and the lubricant oil O can be readily collected at the vertices of the V shapes of the groove portions 332. Therefore, a pressure is generated, and the spindle shaft 33 is supported.

The housing bottom portion 34 is provided in the housing 31 to face the shaft end portion 331 of the spindle shaft 33, and has conductivity.

Similar to the shaft end portion 331, the housing bottom portion 34 also preferably includes a curved surface formed in a convex shape or a concave shape. A curvature radius of the curved surface of the housing bottom portion 34 is preferably 2 mm or more and is more preferably 5 mm or more.

The multiple permanent magnets 35 are provided on the inner circumferential surface of the cover 37 along the circumferential direction.

The stator 36 is provided between the housing 31 and the permanent magnet 35.

The lubricant oil O fills the gap between the inner circumferential surface of the bearing sleeve 32 and the outer circumference surface of the spindle shaft 33. The lubricant oil O supports the spindle shaft 33 in the radial direction thereof in a non-contact state by generating a pressure with a dynamic pressure action.

The lubricant oil O preferably includes conductive powder of an inorganic matter. When the lubricant oil O includes the conductive powder of the inorganic matter, the housing 31 and the spindle shaft 33 can be brought into conduction with each other.

The conductive powder of the inorganic matter is preferably metallic powder such as silver, copper, nickel, tin, silver-plated copper, stainless steel, aluminum, brass, iron, and zinc; carbon-based powder such as carbon, carbon black, graphite, carbon nanotube, and the like; metal oxide-based powder such as tin oxide, indium oxide, zinc oxide, and the like; and a metal-plated material by forming a coating layer on a surface of glass, mica powder, glass fiber, carbon fiber, and the like.

The form of the metallic powder is preferably a powder form, a spherical form, a fibrous form, or a foil piece.

The form of the carbon-based powder is preferably a spherical form or a fibrous form.

The form of the metal oxide-based powder is preferably a powder form or a spherical form.

The form of the metal-plated material-based powder is preferably a powder form or a spherical form.

These materials have a high heat resistance and volatility resistance, and do not increase the viscosity of the lubricant oil O even when the materials are contained in the lubricant oil O.

In a case where the conductive powder is a particle shape, the particle diameter of the conductive powder is preferably 0.1 μm to 10 μm. In a case where the conductive powder is the foil piece, one side of the conductive powder is preferably 0.1 μm to 100 μm. In a case where the conductive powder is fiber, the length of the fiber is preferably 0.1 μm to 100 μm. In a case where the conductive powder is a particle shape, a foil piece, or fiber, where the particle diameter of the conductive powder is in the above-described preferred range, the conductive powder can be distributed in the lubricant oil O without increasing the viscosity of the lubricant oil O.

In the electric recording medium driving unit 30, the spindle shaft 33 is rotated by the attraction between the permanent magnet 35 and the electromagnet of the stator 36. A thrust toward the lower side in FIG. 26 is applied to the spindle shaft 33 by a method using magnetic attraction with the electromagnet of the stator 36, a method using the weight, or other methods, and this thrust is supported by the housing bottom portion 34.

[Probe Driving Unit]

As illustrated in FIG. 8, the probe driving unit 40 drives the probe slider 23.

[Control Unit]

As illustrated in FIG. 11, in a case where the first piezoelectric element 27A and the second piezoelectric element 27B are provided, between the probe slider 23 and the conductive probe 26, at the tip portion of the probe slider 23, the ferroelectric storage apparatus 100 may include a control unit, not illustrated.

A control unit, not illustrated, is attached, as a printed circuit board (PCB), on the back side of the housing 60. The control unit, not illustrated, is electrically connected to the first piezoelectric element 27A, the second piezoelectric element 27B, and the conductive probe 26. The control unit, not illustrated, has a function of controlling the voltage applied to the first piezoelectric element 27A and the second piezoelectric element 27B to cause the first piezoelectric element 27A and the second piezoelectric element 27B to expand and shrink, and adjusting the distance and relative position of the ferroelectric recording medium 10 and the conductive probe 26. The control unit, not illustrated, preferably controls the voltage applied to the first piezoelectric element 27A and the second piezoelectric element 27B to cause the first piezoelectric element 27A and the second piezoelectric element 27B to expand and shrink, on the basis of the read signal from the conductive probe 26.

When the first piezoelectric element 27A expands and shrinks in the +Z axis direction or the −Z axis direction, the first piezoelectric element 27A expands and shrinks in the +Y axis direction or the −Y axis direction. The control unit, not illustrated, preferably has a function of compensating expansion and shrinkage of the first piezoelectric element 27A in the +Y axis direction or the −Y axis direction by causing the second piezoelectric element 27B to expand and shrink in the +Y axis direction or the −Y axis direction.

In a case where the read signal level from the conductive probe 26 is low, the control unit, not illustrated, increases the signal level by reducing the distance between the conductive probe 26 and the ferroelectric recording medium 10 by increasing the voltage applied to the first piezoelectric element 27A. Conversely, in a case where the read signal level from the conductive probe 26 is high, the control unit, not illustrated, decreases the signal level by increasing the distance between the conductive probe 26 and the ferroelectric recording medium 10 by decreasing the voltage applied to the first piezoelectric element 27A. Accordingly, the distance between the ferroelectric recording medium 10 and the conductive probe 26A can be controlled with a high degree of accuracy and response. Therefore, the control unit, not illustrated, allows the ferroelectric storage apparatus 100 to have an AGC (automatic gain control) function between tracks and between sectors of the ferroelectric recording medium 10.

[Recording-and-Reproduction Signal Processing Unit]

The recording-and-reproduction signal processing unit 50 as illustrated in FIG. 8 has a function of performing processing of write and read signals of information with respect to the conductive probe 26.

The recording-and-reproduction signal processing unit 50 writes, by using the conductive probe 26, information to the ferroelectric recording layer 13 constituting the ferroelectric recording medium 10 by applying a positive or negative voltage. In addition, the recording-and-reproduction signal processing unit 50 reads, by using the conductive probe 26, information by reading positive or negative charge written in the ferroelectric recording layer 13. During writing, the recording-and-reproduction signal processing unit 50 generates a positive or negative voltage, corresponding to write information, that is to be applied to the conductive probe 26. During reading, the recording-and-reproduction signal processing unit 50 converts an electric signal from the conductive probe 26 into written information by processing the electric signal.

The recording-and-reproduction signal processing unit 50 includes a bipolar power source, not illustrated. During writing, for example, in a case where information to be written is a binary number of either 1 or 0, the recording-and-reproduction signal processing unit 50 uses the bipolar power source, not illustrated, to generate a positive voltage when the information to be written is one, and generate a negative voltage when the information to be written is zero.

The recording-and-reproduction signal processing unit 50 preferably records (writes) multi-value information to the ferroelectric layer 131 included in the ferroelectric recording layer 13 of the ferroelectric recording medium 10 and reproduces (reads) recorded multi-value information. Recording and reproduction of multi-value information are as described above, and the details thereof are omitted.

As described above, in the ferroelectric layer 131, position information (servo information) for detecting relative position between the conductive probe 26 of the probe slider 23 and the track on the ferroelectric recording medium 10 may be recorded. In the ferroelectric layer 131, servo information areas recorded with the servo information and areas for recording and reproducing data may be arranged alternately with regular intervals in the circumferential direction of the ferroelectric recording medium 10.

The servo information may be written to the ferroelectric recording medium 10 by using a servo writer, not illustrated, before the ferroelectric recording medium 10 is assembled into the ferroelectric storage apparatus 100, or may be written using the recording-and-reproduction signal processing unit 50 after the ferroelectric recording medium 10 is assembled into the ferroelectric storage apparatus 100. In the latter case, after the actuator arm 21 or the suspension arm 22 is mechanically fixed using a lever, not illustrated, from the outside of the ferroelectric storage apparatus 100, servo information may be written to the ferroelectric recording medium 10 while the conductive probe 26 is positioned on the surface of the ferroelectric recording medium 10 by slightly moving the lever, not illustrated.

In this case, servo information and data areas in which data is recorded and reproduced are preferably arranged alternately with regular intervals in the circumferential direction of the track on the ferroelectric recording medium 10. Accordingly, during reproduction of recorded data, the probe slider 23 can more appropriately detect the position of the conductive probe 26 with the servo information.

As described above, the recording-and-reproduction signal processing unit 50 preferably records multi-value information to the recording area of the smallest size with a simplest single write operation by the ferroelectric storage apparatus 100, and reproduces the information multi-value recorded in the ferroelectric recording medium 10 with a simplest single read operation by the ferroelectric storage apparatus 100.

As described above, the servo information area 131B of the ferroelectric layer 131 may include the burst information area 131B-1, the address information area 131B-2, and the preamble information area 131B-3. In this case, the conductive probe 26 moving in the circumferential direction on the surface of the ferroelectric recording medium 10 reads preamble information from the preamble information area 131B-3 to prepare for reading address information. Then, the conductive probe 26 reads the address information of the data area from the address information area 131B-2. Then, the probe slider 23 performs fine adjustment of the track position (radius position) by reading burst information from the burst information area 131B-1. Thereafter, the conductive probe 26 can record information in the data area 131A.

As described above, the servo information area 131B of the ferroelectric layer 131 may include the reference signal information 131B-4 of multi-value recording. In this case, the conductive probe 26 reads the reference signal information from the servo information area 131B, so that the recording-and-reproduction signal processing unit 50 can ascertain the signal levels of multi-value recording, and reproduce the multi-value information recorded in the data area 131A by using the ascertained signal levels.

Figure 27:
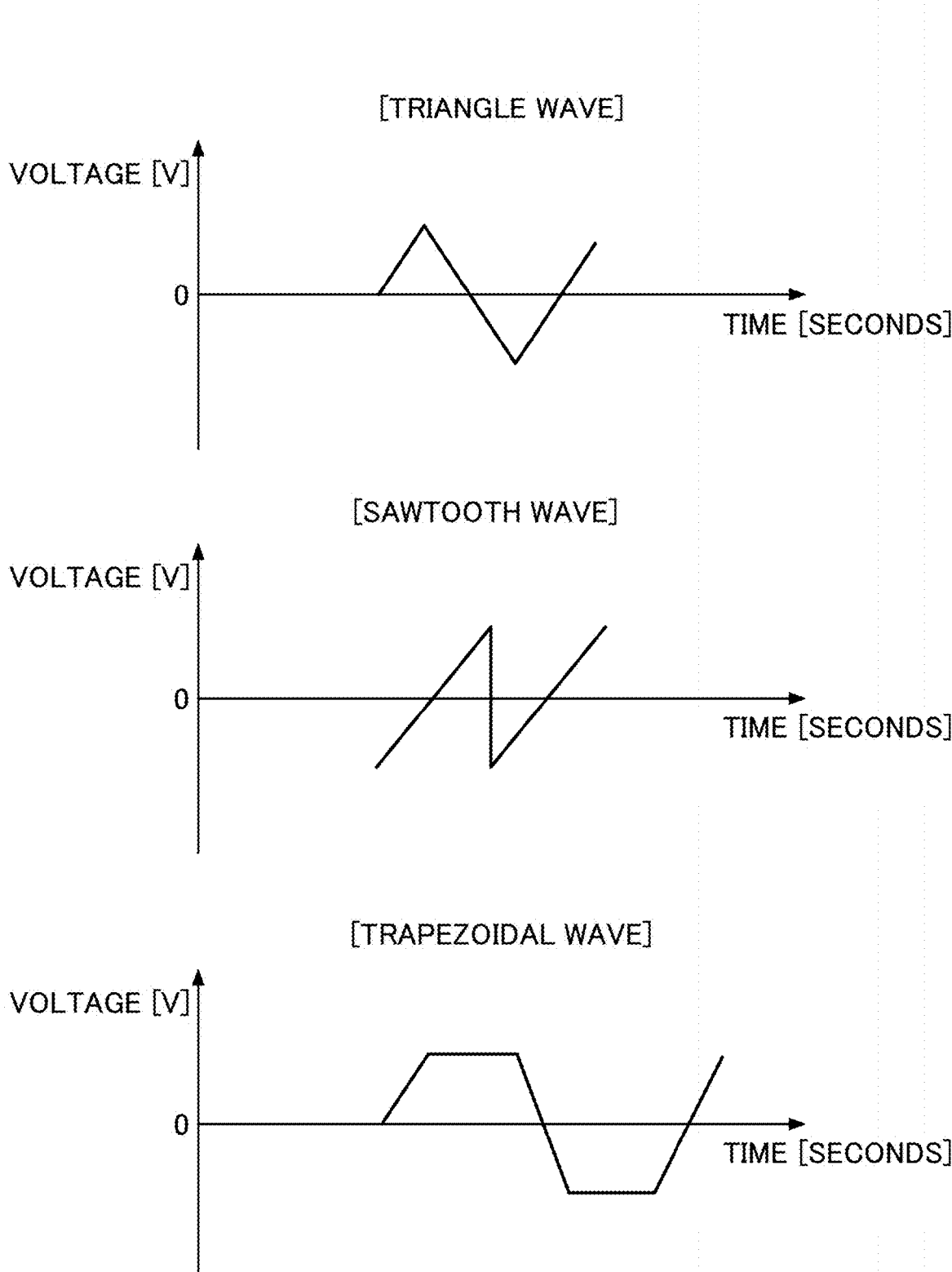
FIG. 27 is a drawing illustrating a voltage waveform.

When the recording-and-reproduction signal processing unit 50 writes information to the ferroelectric recording medium 10, the recording-and-reproduction signal processing unit 50 preferably adjusts the voltage waveform emitted from a bipolar power source, not illustrated, to be applied to the conductive probe 26, so that the voltage waveform becomes any one of a triangle wave, sawtooth wave, and trapezoidal wave, as illustrated in FIG. 27. In a case where the voltage waveform emitted from the bipolar power source, not illustrated is a square wave, a large amount of charge flows the moment the positive or negative voltage is applied, and accordingly, the sharp needle tip of the conductive probe 26 may become dull due to thermal melting and rapid electric field evaporation. In the present embodiment, the voltage waveform is any one of a triangle wave, a sawtooth wave, and a trapezoidal wave, so that the potential can be increased gradually from the zero potential, and accordingly, damage to the conductive probe 26 can be alleviated.

It is known that, during reading, information written to the ferroelectric recording medium 10 can be read as a capacitive change, for example, by reading a capacitive change of the ferroelectric layer 131 between the conductive probe 26 and the electrode layer 12 while applying, to the conductive probe 26, an alternating current electric field smaller than the coercive electric field of the ferroelectric layer 131. The principle of the above is as follows.

Where a voltage applied to the conductive probe 26 is denoted as E, an electric flux density due to charge of the ferroelectric is denoted as D, a dielectric constant is denoted as s, and a polarization voltage is denoted as P, the electric flux density D due to charge of the ferroelectric is expressed by the following expression (1).

$$D = P + \sum_{n=1}^{\infty} \frac{\varepsilon(n)}{n!} E^n \tag{1}$$

In this case, in a case where the voltage E is an alternating current, the following expression (2) is satisfied, and when the expression (2) is substituted into the above expression (1), the dielectric constants for odd-number indexes, i.e., $\varepsilon 3$, $\varepsilon 5$, . . . , become non-linear, and the sign changes according to the direction of the spontaneous polarization of the ferroelectric. Therefore, the direction of the spontaneous polarization of the ferroelectric can be determined by measuring the change of the dielectric constant.

$$E = E_p \cos \omega t,$$

where $E_p$ denotes the peak voltage of the alternating
current $\qquad (2)$

On the other hand, in this method, the read speed of information is limited by the frequency of the alternating current electric field, and therefore, information cannot be read at a bit rate that is equal to or more than the frequency of the alternating current electric field. For example, in order to achieve a read speed of 1 Gbit/second or more, it is necessary to apply an alternating current electric field of 1 GHz or more. In this case, the dielectric constant of the dielectric depends on the frequency of the alternating current electric field, and the higher the frequency is, the greater the loss becomes. Therefore, the ferroelectric that can be used in the ferroelectric rotating medium that can realize a high-speed operation is limited.

In the present embodiment, without using the alternating current electric field to read the information from the ferroelectric recording medium, charge of the ferroelectric layer 131 is detected by a weak tunnel current flowing between the conductive probe 26 and the electrode layer 12.

Specifically, because the conductive probe 26 is very close to the surface of the ferroelectric layer 131, the capacitance C, due to the ferroelectric layer 131, between the conductive probe 26 and the electrode layer 12 is expressed by the following expression (3).

$$C = \varepsilon \cdot \varepsilon_0 A / d,$$

where $A$ denotes a relative area of the conductive probe, $d$ denotes a thickness of the ferroelectric layer, $\varepsilon$ denotes a relative dielectric constant of the ferroelectric layer, and $\varepsilon_0$ denotes a dielectric constant in vacuum     (3)

Then, where charge accumulated in the ferroelectric layer 131 is denoted as Q, a voltage V occurring at the conductive probe 26 is expressed by the following expression (4). By detecting the voltage V, information written to the ferroelectric layer 131 can be read.

$$V = Q/C \qquad (4)$$

In this case, because the ferroelectric is an insulator and has a large band gap, and accordingly a tunnel current is less likely to flow, it is difficult to detect the voltage V of the above-described expression (4). However, when the ferroelectric is made into a thin film to reduce the tunnel barrier, and a bonding structure with the electrode layer that is a conductor is formed, a weak tunnel current flows from the electron state at the bonding portion. Further, when a paraelectric layer is added to the bonding portion to make a bonding structure in which the ferroelectric, the paraelectric, and the conductor are bonded in this order, band bending occurs in a direction for reducing the tunnel barrier due to charge at the interface portion between the ferroelectric and the paraelectric, and accordingly, the tunnel current is more likely to flow.

Furthermore, the tunnel barrier of the ferroelectric layer 131 changes due to the polarization direction, and therefore, the polarization direction of the ferroelectric layer 131 can be found by measuring the tunnel current between the ferroelectric layer 131 and the conductive probe 26. For example, in any given ferroelectric, when the surface layer side is positively charged, the tunnel barrier increases, and the tunnel current from the side of the ferroelectric layer 131 towards the conductive probe 26 decreases, and conversely, when the surface layer side is negatively charged, the tunnel current from the side of the ferroelectric layer 131 towards the conductive probe 26 increases.

When the recording-and-reproduction signal processing unit 50 performs reading by detecting the charge of the ferroelectric layer 131, the recording-and-reproduction signal processing unit 50 may apply a bias voltage to the conductive probe 26.

The bias voltage applied to the conductive probe 26 is used to facilitate detection of the tunnel current between the ferroelectric layer 131 and the conductive probe 26, and can reduce variation of the amount of charge accumulated in the ferroelectric layer 131 when information is read.

A positive or negative voltage, or both, can be used for the bias voltage. In a case where the bias applied to the conductive probe 26 is a constant voltage of a positive or negative voltage, the polarization direction of the ferroelectric layer 131 is detected by the magnitude of the tunnel current that occurs due to application of the bias.

For example, in a ferroelectric of which the tunnel barrier increases when the surface layer side is positively charged and the tunnel barrier decreases when the surface layer side is negatively charged, in a case where a bias voltage is applied so that a tunnel current flows from the side of the ferroelectric layer 131 (the side of the electrode layer 12) towards the conductive probe 26, the magnitude of the tunnel barrier and the magnitude of the tunnel current are in opposite relationship, based on which the direction of the charge of the ferroelectric layer 131 can be detected.

Also, in a case where the bias voltage applied to the conductive probe 26 is both of the positive and negative voltages, the polarization direction of the ferroelectric layer 131 can be detected by comparing the tunnel current that occurs when the positive bias voltage is applied and the tunnel current that occurs when the negative bias voltage is applied. The bias voltage in this case is preferably a sine wave or a square wave of which the frequency is equal to or more than N Hz (N is a number of 1 or more) where the read speed of information from the ferroelectric layer 131 is denoted as N bits/second (N is a number of 1 or more). In this manner, the polarization direction of the ferroelectric layer 131 can be detected with a more high degree of accuracy. The reason for this is as follows. The tunnel current changes according to the distance between the ferroelectric layer 131 and the conductive probe 26, and therefore, in order to detect the polarization direction of the ferroelectric layer 131, it would be necessary to distinguish the above change and a change in the tunnel current due to the polarization direction of the ferroelectric layer 131. Conversely, in a case where positive and negative bias voltages are used, the polarization direction of the ferroelectric layer 131 is determined through relative comparison of the tunnel current in the positive bias state and the negative bias state, and accordingly, variation of the tunnel current due to the distance between the ferroelectric layer 131 and the conductive probe 26 is cancelled, and therefore, the determination is less likely to be affected by the influence thereof.

Furthermore, in a case where, when charge of the ferroelectric layer 131 is detected to read information, the amount of charge accumulated in the ferroelectric layer 131 decreases in the ferroelectric storage apparatus 100, and the tunnel current obtained therefrom decreases, the recording-and-reproduction signal processing unit 50 may rewrite (i.e., perform refresh of) information that is the same as the information written in the ferroelectric recording medium 10 to the position of the ferroelectric recording medium 10 where the same information is read, in order to compensate the charge that has decreased due to reading of information from the ferroelectric recording medium 10. Note that decrease in the amount of charge accumulated in the ferroelectric layer 131 also occurs when charge is captured by a defect included in the ferroelectric layer 131.

The recording-and-reproduction signal processing unit 50 may perform rewrite on every reading of information from the ferroelectric recording medium 10, or may perform rewrite after a predetermined number of readings is performed.

The reading of information from the ferroelectric layer 131 explained above is based on a non-destructive method. Alternatively, for reading of information from the ferroelectric layer 131, a destructive method may be employed.

In a case where the non-destructive method is used for reading of information, the electric field occurring due to the bias applied to the conductive probe 26 does not exceed the coercive electric field of the ferroelectric constituting the ferroelectric layer 131, and therefore, during reading of information, the polarization direction of the ferroelectric layer 131 does not change.

In contrast, in a case where the destructive method is used, information is read by applying a bias voltage that exceeds the coercive electric field of the ferroelectric to the conductive probe 26 and detecting the tunnel current that occurs when the polarization direction of the ferroelectric layer 131 changes in response to the application of the bias voltage. For example, in a case where the side of the ferroelectric layer 131 on the side of the conductive probe 26 has a positive charge and a negative bias voltage is applied to the conductive probe 26, charge of the ferroelectric layer 131 is not inverted, and accordingly, the tunnel current flowing from the ferroelectric layer 131 to the conductive probe 26 is small. Conversely, in a case where the ferroelectric layer 131 has a negative charge, the charge of the ferroelectric layer 131 is positively inverted due to the negative bias applied to the conductive probe 26, and accordingly, the tunnel current increases. Due to this variation in the tunnel current, information recorded in the ferroelectric layer 131 can be read. Note that when the destructive method is used for reading of information, it is necessary to rewrite read information to the ferroelectric layer 131.

For reading of information from the ferroelectric recording medium 10, an atomic force between the conductive probe 26 and the ferroelectric layer 131 may be used. A method using an atomic force between the conductive probe 26 and the ferroelectric layer 131 for reading of information from the ferroelectric recording medium 10 is explained. An atomic force between the conductive probe 26 and the ferroelectric layer 131 is affected by charge of the ferroelectric layer 131, and therefore, information recorded in the ferroelectric recording medium 10 is read by measuring the atomic force therebetween. In this case, unlike the case where the tunnel current is used for reading information, the amount of charge accumulated in the ferroelectric layer 131 is less likely to flow, and therefore, it is not necessary to perform refresh. Also, it is not necessary to consider the interface electron state between the electrode layer 12 and the band gap of the ferroelectric used for the ferroelectric layer 131.

In this case, an atomic force microscope (AFM) is known as an apparatus for detecting the atomic force exerted between a probe and a surface of a sample and mapping the atomic force. In the AFM, an optical lever method is used, and while the sample is moved in the X-Y axis direction, laser light is emitted to a cantilever provided with the probe, and the interatomic force is detected from the transition of the reflected light. Because this method detects physical variation of the cantilever, it is difficult to use this method for reading information in the GHz band. Furthermore, because laser light is used for detection, it may induce an internal photoelectric effect and temperature rise of a ferroelectric used for a ferroelectric recording medium.

Figure 28:
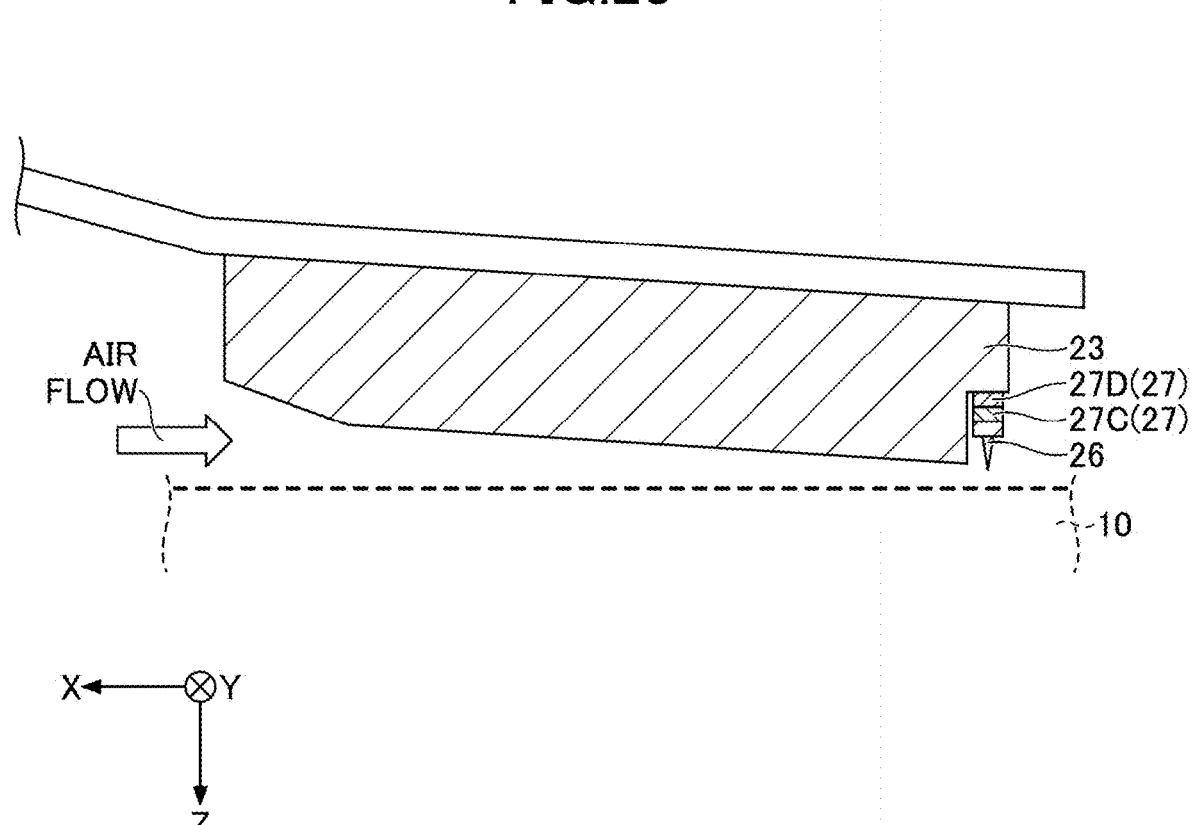
FIG. 28 is a cross-sectional view illustrating an example of another configuration of a probe slider.

Therefore, in the present embodiment, as illustrated in FIG. 28, the third piezoelectric element 27C may be provided between the probe slider 23 and the conductive probe 26. Accordingly, the third piezoelectric element 27C detects an atomic force between the conductive probe 26 and the ferroelectric layer 131, and this detected atomic force can be converted into an electric signal. In this case, the optical lever is not used for detection of the atomic force, and therefore, information can be read in the GHz band.

The third piezoelectric element 27C may be constituted by, for example, quartz, lithium niobate ($LiNbO_3$), barium titanate ($BaTiO_3$), titanate lead zirconate (PZT), zinc oxide (ZnO), aluminum nitride (AlN), lithium tantalate ($LiTaO_3$), lead titanate (PT), and the like. The third piezoelectric element 27C may be constituted by the same material as the first piezoelectric element 27A and the second piezoelectric element 27B.

In order to increase the detection performance of the atomic force, the third piezoelectric element 27C is preferably brought closer to the conductive probe 26. For this reason, as illustrated in FIG. 28, the third piezoelectric element 27C is preferably provided between the conductive probe 26 and the fourth piezoelectric element 27D. Similar to the first piezoelectric element 27A, the fourth piezoelectric element 27D is used to drive the conductive probe 26 in the +Z axis direction or the −Z axis direction and bring the conductive probe 26 into proximity with the surface of the ferroelectric recording medium 10. Note that the fourth piezoelectric element 27D may be constituted by the same material as the third piezoelectric element 27C.

[Housing]

As illustrated in FIG. 8, the housing 60 is formed in a substantially rectangular shape. The ferroelectric recording medium 10, the conductive probe 26, the probe slider 23, the ferroelectric recording medium driving unit 30, and the recording-and-reproduction signal processing unit 50 are provided in the housing 60.

In the ferroelectric storage apparatus 100, the housing 60 is preferably filled with at least one of argon gas, nitrogen gas, and helium gas. Charge occurs in friction between objects caused by movement of the ferroelectric recording medium 10, the ferroelectric recording medium driving unit 30, and the conductive probe 26 and in friction between these objects and air, i.e., what is termed as triboelectric charging occurs in the housing 60, and this charge may couple with the charge recorded in the ferroelectric recording medium 10, so that written information may be lost, and also reading and writing of information by the conductive probe 26 may be adversely affected. In the present embodiment, the housing 60 is filled with these gases, that can alleviate triboelectric charging.

The triboelectric charging in the housing 60 can be evaluated by measuring the number of charges of triboelectric charging according to a conventional measurement method.

In this manner, the ferroelectric storage apparatus 100 includes the ferroelectric recording medium 10, the conductive probe 26, the probe slider 23, the ferroelectric recording medium driving unit 30, and the recording-and-reproduction signal processing unit 50. The recording-and-reproduction signal processing unit 50 can record multi-value information to the ferroelectric recording medium 10, and reproduce recorded multi-value information. Multi-value information can be recorded to the recording area of the smallest size on the ferroelectric layer 131 of the ferroelectric recording layer 13 provided in the ferroelectric recording medium 10.

In the ferroelectric storage apparatus 100, the recording-and-reproduction signal processing unit 50 can record multi-value information to the ferroelectric recording medium 10, and accordingly, the recording density of the ferroelectric recording medium 10 can be increased. In the ferroelectric storage apparatus 100, the recording density of the ferroelectric recording medium 10 is increased, so that the size of the ferroelectric storage apparatus 100 can be reduced with respect to the unit storage capacity, and the speed (read and write speed) required for recording information to the ferroelectric layer 131 and reproducing recorded information can be increased to, for example, 10 Gbps or more.

Also, in the ferroelectric storage apparatus 100, the recording density of the ferroelectric recording medium 10 is increased, so that the increase in the power consumption with respect to the unit storage capacity required for recording information to and reproducing information from the ferroelectric recording medium 10 can be alleviated.

Therefore, the ferroelectric storage apparatus 100 can achieve an improvement of the recording density, a reduction in the size with respect to the unit storage capacity, and an increase in the read and write speed, and can alleviate an increase in the energy consumption.

In this case, in a conventional magnetic recording medium such as a HDD, while a magnetic recording medium is rotated at 5000 rpm to 10000 rpm (83 to 167 rotations per second), the read-and-write header is moved in the track direction (the radius direction) to record (write) and reproduce (read) information. The size of one bit of information is approximately 5 nm in the sector direction (circumferential direction) and 50 nm in the track direction, and this single bit includes approximately 10 magnetic particles. The read-and-write speed is approximately 1 Gbps on average. In the ferroelectric recording medium 10, information is recorded by polarization inversion due to the lattice strain of the ferroelectric crystal included in the ferroelectric layer 131. Therefore, as compared to a magnetic recording medium that records information by magnetizing the magnetic layer in units of magnetic particles, the recording density and the read-and-write speed can be significantly increased. Furthermore, in the ferroelectric storage apparatus 100, the ferroelectric recording medium 10 has the ferroelectric layer 131 that has the recording area in which multi-value recording is performed, and therefore, the recording density can be improved, the size and the processing speed can be increased, and an increase in the energy consumption can be alleviated.

The ferroelectric storage apparatus 100 has a higher recording density and a higher read-and-write speed, and is small in size, so that the ferroelectric storage apparatus 100 can achieve, for example, a storage for wireless and mobile communication of 10 Gbps or more. Furthermore, the ferroelectric storage apparatus 100 alleviates an increase in the power consumption and achieves energy saving, so that the consumption of resources can be reduced, and accordingly, the environmental load can be reduced.

In the ferroelectric storage apparatus 100, the recording-and-reproduction signal processing unit 50 can read, from the ferroelectric layer 131, position information (servo information) for detecting relative position, in the track direction of the ferroelectric recording medium 10, between the conductive probe 26 and the ferroelectric recording medium 10. Accordingly, the ferroelectric storage apparatus 100 can accurately detect the position of the conductive probe 26 according to the servo information during reproduction of data recorded in data area of the ferroelectric layer 131 provided in the ferroelectric recording medium 10, and therefore, the ferroelectric storage apparatus 100 can record information to and reproduce information from the ferroelectric layer 131 with a high degree of accuracy. Therefore, the ferroelectric storage apparatus 100 increases the processing speed during recording of information and reproduction of recorded information.

In the ferroelectric storage apparatus 100, the servo information area recorded with servo information and the data area in which information is written and read can be arranged alternately in the circumferential direction of the track on the ferroelectric recording medium 10. Accordingly, in the ferroelectric storage apparatus 100, the control unit, not illustrated, can accurately detect the position of the conductive probe 26 according to servo information for each of the data areas during reproduction of data recorded in the data area. Therefore, the ferroelectric storage apparatus 100 can increase the accuracy of writing of information to and reading of information from the ferroelectric layer 131, so that the processing speed during recording of information and reproduction of recorded information can be further increased.

In the ferroelectric storage apparatus 100, the reference signal information 131B-4 can be included in the servo information area 131B of the ferroelectric layer 131 of the ferroelectric recording medium 10. Accordingly, the ferroelectric storage apparatus 100 uses the signal levels of multi-value recording that are ascertained by reading the reference signal information 131B-4 with the conductive probe 26, so that the multi-value information recorded in the data area 131A can be reproduced. Therefore, the ferroelectric storage apparatus 100 can further reduce the energy consumption with respect to the unit storage capacity.

According to a method for writing information to and reading information from the ferroelectric storage apparatus 100 having the above-described configuration, multi-value information can be written to and recorded multi-value information can be read from the ferroelectric recording medium 10 with the simplest single operation with respect to the recording area of the smallest size. When the above-described method for writing and reading information is used, in the recording-and-reproduction signal processing unit 50, the recording density stored in the ferroelectric layer 131 can be improved, the size of the ferroelectric storage apparatus 100 with respect to the unit storage capacity can be reduced, the read-and-write speed can be increased, and an increase in the energy consumption can be alleviated.

In the ferroelectric storage apparatus 100, the first piezoelectric element 27A and the second piezoelectric element 27B can be provided on the probe slider 23. The ferroelectric storage apparatus 100 uses the pair of electrodes 28A-1 and 28A-2 to cause the first piezoelectric element 27A to expand and shrink in the height direction of the first piezoelectric element 27A, and uses the electrodes 28B-1 and 28B-2 to cause the second piezoelectric element 27B to expand and shrink in the track direction of the ferroelectric recording medium 10. Accordingly, the ferroelectric storage apparatus 100 can control the distance between the ferroelectric recording medium 10 and the conductive probe 26 in an order of nanometers, and move the conductive probe 26 in the track direction of the ferroelectric recording medium 10 in an order of nanometers. Also, a movement time within a same track and a movement time (seek time) to another track can be reduced to several microseconds or less. Therefore, the ferroelectric storage apparatus 100 can perform positioning of the conductive probe 26 in the data surface direction and the track direction of the ferroelectric recording medium 10 with a high degree of accuracy, i.e., an accuracy of 1 nm or less, and can perform a correcting operation within a same track and a moving operation to another track in several microseconds or less. Therefore, the ferroelectric storage apparatus 100 can improve the recording capacity and increase the speed required for recording and reproduction of information.

In the ferroelectric storage apparatus 100, the second piezoelectric element 27B is provided between the probe slider 23 and the conductive probe 26, and the conductive probe 26 can be provided with a shift in position in the track direction of the ferroelectric recording medium 10 with reference to the center of the attachment surface of the second piezoelectric element 27B. Accordingly, the conductive probe 26 can move in the track direction according to expansion and shrinking of the second piezoelectric element 27B. Therefore, the ferroelectric storage apparatus 100 can increase the accuracy of positioning of the conductive probe 26 in the track direction of the ferroelectric recording medium 10, and can reliably perform a correcting operation within a same track and a moving operation to another track in several microseconds or less. Therefore, the ferroelectric storage apparatus 100 can further improve the recording capacity, and can further increase the speed required for recording and reproduction of information.

In a movement of the conductive probe 26 in the track direction of the ferroelectric recording medium 10, the ferroelectric storage apparatus 100 uses the probe driving unit 40 for a coarse operation of which the movement distance is 10 nm or more, and uses the second piezoelectric element 27B for a fine movement of which the movement distance is less than 10 nm. Accordingly, the ferroelectric storage apparatus 100 can appropriately move the conductive probe 26 according to the movement distance of the conductive probe 26 in the track direction of the ferroelectric recording medium 10. Therefore, the ferroelectric storage apparatus 100 can further improve the recording density, and can further increase the speed required for recording and reproduction of information.

In the ferroelectric storage apparatus 100, in order to detect the charge of the ferroelectric layer 131, the recording-and-reproduction signal processing unit 50 applies positive and negative bias voltages to the conductive probe 26, and detects charge of the ferroelectric layer 131 by measuring a weak tunnel current flowing between the conductive probe 26 and the electrode layer 12. Accordingly, in the ferroelectric storage apparatus 100, the recording-and-reproduction signal processing unit 50 can read information without using an alternating current electric field, and accordingly, the read speed is not limited by the frequency of the alternating current electric field. Therefore, information stored in the ferroelectric recording medium 10 can be read at a high speed.

In the ferroelectric storage apparatus 100, in order to detect charge of the ferroelectric layer 131, the recording-and-reproduction signal processing unit 50 applies a positive or negative bias voltage to the conductive probe 26. By applying a voltage to the conductive probe 26, the ferroelectric storage apparatus 100 can detect charge accumulated in the ferroelectric layer 131, and therefore, the ferroelectric storage apparatus 100 can read information stored in the ferroelectric layer 131 at a high speed.

In the ferroelectric storage apparatus 100, in order to detect charge of the ferroelectric layer 131, the recording-and-reproduction signal processing unit 50 applies positive and negative bias voltages to the conductive probe. Accordingly, the ferroelectric storage apparatus 100 can detect the polarization direction of the ferroelectric layer 131 by comparing a tunnel current when a positive bias voltage is applied and a tunnel current when a negative bias voltage is applied. Therefore, by applying a voltage to the conductive probe 26, the ferroelectric storage apparatus 100 can facilitate detection of charge accumulated in the ferroelectric layer 131, and therefore, the ferroelectric storage apparatus 100 can more reliably read information stored in the ferroelectric layer 131.

The ferroelectric storage apparatus 100 can use a sine wave or a square wave as positive and negative bias voltages. Accordingly, the ferroelectric storage apparatus 100 can furthermore facilitate detection of the polarization direction of the ferroelectric layer 131. Accordingly, by applying a voltage to the conductive probe 26, the ferroelectric storage apparatus 100 can furthermore facilitate detection of charge accumulated in the ferroelectric layer 131. Therefore, information stored in the ferroelectric layer 131 can be read more reliably.

According to a method for reading information with the ferroelectric storage apparatus 100 having the above-described configuration, charge of the ferroelectric layer 131 is detected by comparing a tunnel current flowing between the conductive probe 26 and the ferroelectric layer 131 when a positive bias voltage is applied to the conductive probe 26 and a tunnel current flowing between the conductive probe 26 and the ferroelectric layer 131 when a negative bias voltage is applied to the conductive probe 26. When the above-described method for reading information is used, the recording-and-reproduction signal processing unit 50 can more easily detect charge accumulated in the ferroelectric layer 131, and can more reliably read information stored in the ferroelectric layer 131.

According to a method for reading information with the ferroelectric storage apparatus 100 having the above-described configuration, in a case where the read speed of information is N bits/second (N is a number of 1 or more), the frequency of the applied bias voltage can be set to N Hz (N is a number of 1 or more) or more. Accordingly, when the above-described method for reading information is used, the recording-and-reproduction signal processing unit 50 can furthermore facilitate detection of charge accumulated in the ferroelectric layer 131, and therefore, the recording-and-reproduction signal processing unit 50 can more reliably read information stored in the ferroelectric layer 131.

According to a method for writing information to and reading information from the ferroelectric storage apparatus 100 having the above-described configuration, information that is the same as the information written in the ferroelectric recording medium 10 is rewritten to the position of the ferroelectric recording medium 10 where the same information is read. When the above-described method for writing and reading information is used, charge that has decreased due to reading of information from the ferroelectric recording medium 10 can be compensated for, and therefore, when the recording-and-reproduction signal processing unit 50 measures a weak tunnel current flowing between the conductive probe 26 and the electrode layer 12, the recording-and-reproduction signal processing unit 50 can stably detect charge of the ferroelectric layer 131.

According to a method for writing information to and reading information from the ferroelectric storage apparatus 100 having the above-described configuration, rewriting can be performed on every reading of information from the ferroelectric recording medium 10, or can be performed after a predetermined number of reading is performed. Accordingly, charge that has decreased due to reading of information from the ferroelectric recording medium 10 can be compensated for on any given reading, and therefore, rewriting can be performed appropriately when necessary according to the amount of decrease in the charge of the ferroelectric layer 131.

The ferroelectric storage apparatus 100 can make the shape of the conductive probe 26 into a cone shape. Accordingly, the conductive probe 26 has a sharp tip, so that a higher degree of sharpening can be achieved, and therefore, the electric field strength increases, and the voltage applied to the needle-shaped electrode 262 can be reduced. Therefore, the ferroelectric storage apparatus 100 can advantageously perform recording information to the ferroelectric recording medium 10.

The ferroelectric storage apparatus 100 can make the shape of the conductive probe 26A into a triangular pyramid or quadrangular pyramid shape. Accordingly, the ferroelectric storage apparatus 100 can have the conductive probe 26 having a sharp tip.

The ferroelectric storage apparatus 100 can make the shape of the conductive probe 26A into a rotational symmetrical shape about the axis that passes through the tip thereof. Accordingly, the conductive probe 26A can uniformize the electric field distribution that occurs at the tip of the conductive probe 26A during writing, and can stabilize the tunnel current that flows between the conductive probe 26A and the ferroelectric layer 131 during reading. Therefore, the ferroelectric storage apparatus 100 can stably write information to the ferroelectric recording medium 10 and can stably read information from the ferroelectric recording medium 10.

The manufacturing method of the conductive probe 26A may include a step of forming a mask in a triangular or quadrangular shape on the surface of the conductive material 260 and a step of obtaining the needle-shaped electrode 262 formed in a triangular pyramid or quadrangular pyramid shape by etching the conductive material 260. Accordingly, the conductive probe 26A including the needle-shaped electrode 262 formed in a triangular pyramid or quadrangular pyramid shape on the base body 261 can be manufactured with a high degree of reproducibility.

Also, a manufacturing method of the conductive probe 26A may include a step of forming the mask 72A having the through hole 72a in a triangular or quadrangular shape in the surface of the conductive material 260 and a step of obtaining the needle-shaped electrode 262A formed in a triangular pyramid or quadrangular pyramid by depositing a conductive material on the surface of the conductive material 260 in the through hole 72a. Accordingly, the conductive probe 26A having the needle-shaped electrode 262A formed in a triangular pyramid or quadrangular pyramid shape on the base body 261 can be manufactured with a high degree of reproducibility.

In the ferroelectric storage apparatus 100, the conductive probe 26B may include the base body 261 constituted by the conductive material 260, the recessed portion 212, and the needle-shaped electrode 213 made into a sharpened shape, wherein a portion of the needle-shaped electrode 213 may protrude from the surface of the conductive material 260. Accordingly, the ferroelectric storage apparatus 100 can prevent damage to the needle-shaped electrode 262 made into a sharpened shape. Furthermore, the ferroelectric storage apparatus 100 can alleviate vibration and deformation of the needle-shaped electrode 262 caused by air flow that occurs due to rotation of the ferroelectric recording medium 10. Furthermore, the ferroelectric storage apparatus 100 shields the needle-shaped electrode 262 and can alleviate the influence of charge around the needle-shaped electrode 262 and leakage of charge from the needle-shaped electrode 262.

In the ferroelectric storage apparatus 100, the conductive probe 26C may include the base body 261 constituted by the conductive material 260, the insulating layer 263 provided on the base body 261 and having the through hole 263a, and the needle-shaped electrode 262 formed in a cone shape on the base body 261 in the through hole 263a, wherein a portion of the needle-shaped electrode may protrude from the surface of the insulating layer 263. Even in this case, the ferroelectric storage apparatus 100 can alleviate damage to the needle-shaped electrode 262. Also, the ferroelectric storage apparatus 100 can alleviate vibration and deformation of the needle-shaped electrode 262 caused by air flow that occurs due to rotation of the ferroelectric recording medium 10. Furthermore, the ferroelectric storage apparatus 100 shields the needle-shaped electrode 262 and can alleviate the influence of charge around the needle-shaped electrode 262 and leakage of charge from the needle-shaped electrode 262.

A manufacturing method of the conductive probe 26B may include a step of applying a photoresist to the surface of the conductive material 260, a step of forming a very small through hole (hole) in the photoresist, a step of forming a recess (recessed portion) in a concave shape by etching the surface of the conductive material 260 in the hole via the hole, a step of depositing metal on the photoresist having the hole, and a step of obtaining the needle-shaped electrode 262 formed in a cone shape by removing a photoresist, wherein a portion of the needle-shaped electrode 262 may protrude from the conductive material 260. Accordingly, the conductive probe 26B can be manufactured with a high degree of reproducibility.

The manufacturing method of the conductive probe 26C may include a step of forming the insulating layer 263, by oxidizing the conductive material 260, on the conductive material 260, a step of forming the isolation layer 29 on the insulating layer 263, a step of applying the photoresist 82 on the surface of the isolation layer 29, a step of forming the through hole 82a in the photoresist 82, a step of etching the through hole 82a to the surface of the conductive material 260, a step of obtaining the needle-shaped electrode 262 by depositing metal on the surface of the conductive material 260 in the through hole 82a, and a step of removing the photoresist 82, wherein a portion of the needle-shaped electrode 262 may protrude from the insulating layer 263. Even in this case, the conductive probe 26C can be manufactured with a high degree of reproducibility.

Also, the manufacturing method of the conductive probe 26C includes a step of forming a mask in a triangular or quadrangular shape on the surface of the conductive material 260 and a step of obtaining the needle-shaped electrode 262 formed in a triangular pyramid or quadrangular pyramid shape by etching the conductive material 260. Accordingly, the conductive probe 26C including the needle-shaped electrode 262 formed in a triangular pyramid or quadrangular pyramid shape on the base body 261 can be manufactured with a high degree of reproducibility.

Also, the manufacturing method of the conductive probe 26C may include a step of forming a mask having the through hole 72a in a triangular or quadrangular shape on the surface of the conductive material 260 and a step of forming the needle-shaped electrode 262 formed in a triangular pyramid or quadrangular pyramid shape by depositing a conductive material on the surface of the conductive material 260 in the through hole 72a. Accordingly, the conductive probe 26C including the needle-shaped electrode 262 formed in a triangular pyramid or quadrangular pyramid shape formed on the base body 261 can be manufactured with a high degree of reproducibility.

Specifically, in the manufacturing method of the conductive probe 26, the hole of the photoresist may be formed in a circular shape, a triangular shape, and a quadrangular shape, when the conductive probe 26 is manufactured using a photoresist. Accordingly, by removing the photoresist after metal is deposited on the photoresist, the conductive probe 26 including the needle-shaped electrode 262 formed in a cone shape, triangular pyramid, or quadrangular pyramid on the base body 261 can be manufactured with a high degree of reproducibility.

In the ferroelectric storage apparatus 100, the recording-and-reproduction signal processing unit 50 can detect a signal generated by an atomic force between the conductive probe 26 and ferroelectric recording medium 10. Accordingly, in the ferroelectric storage apparatus 100, the recording-and-reproduction signal processing unit 50 can read information without using an alternating current electric field, and accordingly, the read speed is not limited by the frequency of the alternating current electric field. Therefore, information stored in the ferroelectric recording medium 10 can be read at a high speed. Furthermore, the amount of charge accumulated in the ferroelectric layer 131 does not decrease, and accordingly, re-reading can be omitted.

The ferroelectric storage apparatus 100 can detect an atomic force with the piezoelectric element 27 provided between the probe slider 23 and the conductive probe 26. Accordingly, the ferroelectric storage apparatus 100 can increase the detection performance of an atomic force, and therefore, information stored in the ferroelectric recording medium 10 can be read at a higher speed.

The ferroelectric storage apparatus 100 includes the piezoelectric element 27 or an electrostrictive element and the control unit, not illustrated. In the ferroelectric storage apparatus 100, the control unit, not illustrated, causes the piezoelectric element 27 or the electrostrictive element to expand and shrink by controlling a voltage applied to the piezoelectric element 27 or the electrostrictive element on the basis of a read signal from the conductive probe 26. Accordingly, in the ferroelectric storage apparatus 100, the distance between the ferroelectric recording medium 10 and the conductive probe 26 can be adjusted, and therefore, the distance between the conductive probe 26 and the ferroelectric recording medium 10 can be controlled at a high degree of accuracy.

Figure 29:
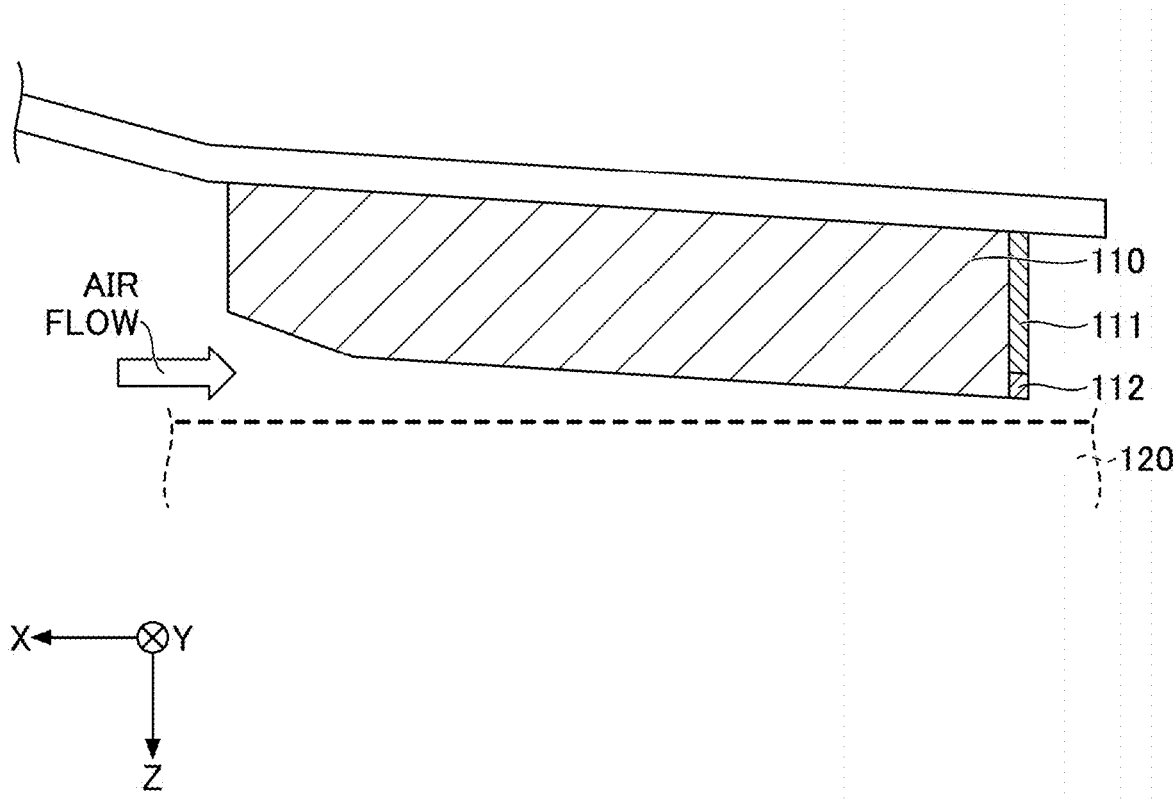
FIG. 29 is an explanatory diagram illustrating an example of a configuration of a conventional magnetic header slider.

In this case, FIG. 29 illustrates a cross-sectional view illustrating an example of a configuration of a conventional magnetic header slider 110. As illustrated in FIG. 29, the magnetic header slider 110 used for an HDD includes a heating body 111 provided in the magnetic header slider 110 and a magnetic header 112 provided below the heating body 111 to face the magnetic recording medium 120. The magnetic header slider 110 uses a technique for energizing the heating body 111 to generate heat and thermally expand the magnetic header slider 110, thereby adjusting the distance between magnetic header 112 and magnetic recording medium 120, i.e., DFH (for example, see Japanese Patent Laid-Open No. 2003-168274). The heating body 111 is referred to as a DFH heater, and the power applied to the heating body 111 is referred to as the DFH power. According to this technique for adjusting the DFH, while the amount of floating of the magnetic header slider 110 on the surface of the magnetic recording medium 120 is maintained in an order of nanometers, the distance between the surface of the magnetic recording medium 120 and the magnetic header 112 is reduced to an order of sub-nanometers. However, in a case where the heating body 111 is used, the heating range widely covers the magnetic header 112 and the magnetic header slider 110 on which the heating body 111 is mounted. Accordingly, it takes a long time to heat the magnetic header 112 with the heating body 111, and the response and the accuracy of the DFH control are not high. Furthermore, the leakage electric field in the ferroelectric recording medium 10 is smaller than the leakage magnetic field used for reading magnetic information in the magnetic recording medium 120, so that the ferroelectric storage apparatus 100 detecting the leakage magnetic field is required to have an adjusting technique of the DFH with a relatively higher degree of accuracy.

Furthermore, the conventional DFH technique as illustrated in FIG. 29 uses the heating body 111, and therefore, when this technique is used, the dielectric constant of the ferroelectric layer 131 may thermally vary. In contrast, the ferroelectric storage apparatus 100 does not have the heating body 111 as in the conventional DFH technique, and therefore, thermal variation of the dielectric constant of the ferroelectric layer 131 can be prevented.

In the ferroelectric storage apparatus 100, the control unit, not illustrated, can cause the piezoelectric element 27 or the electrostrictive element to expand and shrink by controlling the voltage applied to the piezoelectric element 27 or the electrostrictive element on the basis of a read signal from the conductive probe 26. Accordingly, the ferroelectric storage apparatus 100 can more readily control the distance between the ferroelectric recording medium 10 and the conductive probe 26 with a high degree of accuracy at a high speed.

In the ferroelectric storage apparatus 100, the ferroelectric recording medium driving unit 30 includes the housing 31, the bearing sleeve 32, the spindle shaft 33, the housing bottom portion 34, the permanent magnet 35, the stator 36, and the lubricant oil O. The curvature radius of at least one of the shaft end portion 331 of the spindle shaft 33 and the housing bottom portion 34 has a spherical surface in a convex shape or concave shape of 2 mm or more, and the lubricant oil O includes conductive powder of the inorganic matter. Accordingly, the ferroelectric recording medium driving unit 30 is a fluid dynamic bearing that is a type of plain bearing, and the spindle shaft 231 can be rotated stably in a non-contact manner by a dynamic pressure that occurs during rotation of the spindle shaft 231 with the lubricant oil O that fills the space between the spindle shaft 231 and the housing 31, and therefore, the ferroelectric recording medium 10 can be rotationally driven with less vibration and less axial runout. Furthermore, the conductive powder of the inorganic matter has a high heat resistance and volatility resistance, and does not increase the viscosity of the lubricant oil O even when the conductive powder is contained in the lubricant oil O. Therefore, the ferroelectric storage apparatus 100 can stabilize the torque of the ferroelectric recording medium driving unit 30 even when it is used for a long period of time, and a reduction in a conduction between the spindle shaft 231 and the housing 31 can be alleviated. Therefore, the ferroelectric storage apparatus 100 can stabilize reading and writing of information with respect to the ferroelectric recording medium 10.

Conventionally, the spindle shaft 33 does not come into contact with the housing 31 due to the intervention of the fluid layer of lubricant fluid that is non-conductive, and therefore, the spindle shaft 33 is an electrically floating state from the housing 31 of the ferroelectric recording medium driving unit. In this case, the spindle shaft 33 is connected to the ferroelectric layer 131 via the ferroelectric recording medium, and constitutes a portion of the circuit that writes information to the ferroelectric layer 131. Therefore, the state in which the spindle shaft 33 is electrically floating from the housing 31 causes a problem in applying a voltage across the ferroelectric recording medium 10 and the conductive probe 26 to write information.

Also, there is a method of using a lubricant fluid O containing a conductive material (for example, see Japanese Patent Laid-Open No. 2001-208069), but an addition of the conductive material increases the viscosity of the lubricant oil O, which leads to an increase in the bearing torque. When used over a long period of time, the conductive material deteriorates and the conduction decreases, and therefore, even if it is applied to the ferroelectric recording medium 10, the error rate during writing of information to the ferroelectric recording medium 10 is likely to increase.

Because the ferroelectric storage apparatus 100 includes the above-described configuration, the torque is stabilized even when the ferroelectric recording medium driving unit 30 is used over a long period of time, and a decrease of the conduction between the spindle shaft 231 and the housing 31 can be alleviated, and therefore, reading of information and writing of information with respect to the ferroelectric recording medium 10 can be performed stably.

In the ferroelectric storage apparatus 100, the curvature radius of at least one of the shaft end portion 331 of the spindle shaft 33 and the housing bottom portion 34 provided in the ferroelectric recording medium driving unit 30 can be made into a spherical surface in a convex shape or concave shape of 2 mm or more. Accordingly, in the ferroelectric storage apparatus 100, the torque is stabilized even when the ferroelectric recording medium driving unit 30 is used over a long period of time, and a decrease of the conduction between the spindle shaft 231 and the housing 31 can be alleviated.

The ferroelectric storage apparatus 100 can include a groove portion 231B in a V shape on the outer circumference of the spindle shaft 33. Accordingly, when the spindle shaft 33 rotates, the lubricant oil O can be readily collected at the vertex of the V shape of the groove portion 231B, and accordingly, a flow is likely to occur in the lubricant oil O. Therefore, a pressure is likely to be generated by the lubricant oil O, so that the spindle shaft 33 is likely to be supported.

In the ferroelectric storage apparatus 100, the permanent magnet 35 and the stator 36 can be provided to face each other in the cover 37. The spindle shaft 33 can be rotated by the attraction between the permanent magnet 35 and the electromagnet of the stator 36, and furthermore, in the spindle shaft 33, a thrust toward the lower side can be generated, and accordingly, the spindle shaft 33 can be reliably supported by the housing bottom portion 34.

In the ferroelectric storage apparatus 100, the recording-and-reproduction signal processing unit 50 can adjust a voltage waveform applied to the conductive probe 26 for writing information to the ferroelectric recording layer 13 to any one of a triangle wave, a sawtooth wave, and a trapezoidal wave. Accordingly, the ferroelectric storage apparatus 100 can alleviate damage to the conductive probe 26.

The ferroelectric storage apparatus 100 includes the housing 60, and the housing 60 may be filled with at least one of argon gas, nitrogen gas, and helium gas. The ferroelectric recording medium 10, the conductive probe 26, the probe slider 23, the ferroelectric recording medium driving unit 30, and the recording-and-reproduction signal processing unit 50 are accommodated in the housing 60, and the housing 60 is filled with these gasses, so that the ferroelectric storage apparatus 100 can alleviate triboelectric charging that occurs in the housing 60. Therefore, the ferroelectric storage apparatus 100 can alleviate loss of write information due to charge coupling with charge recorded in the ferroelectric recording medium 10 and adverse effects exerted on writing by the conductive probe 26.

<Data Management System>

Figure 30:
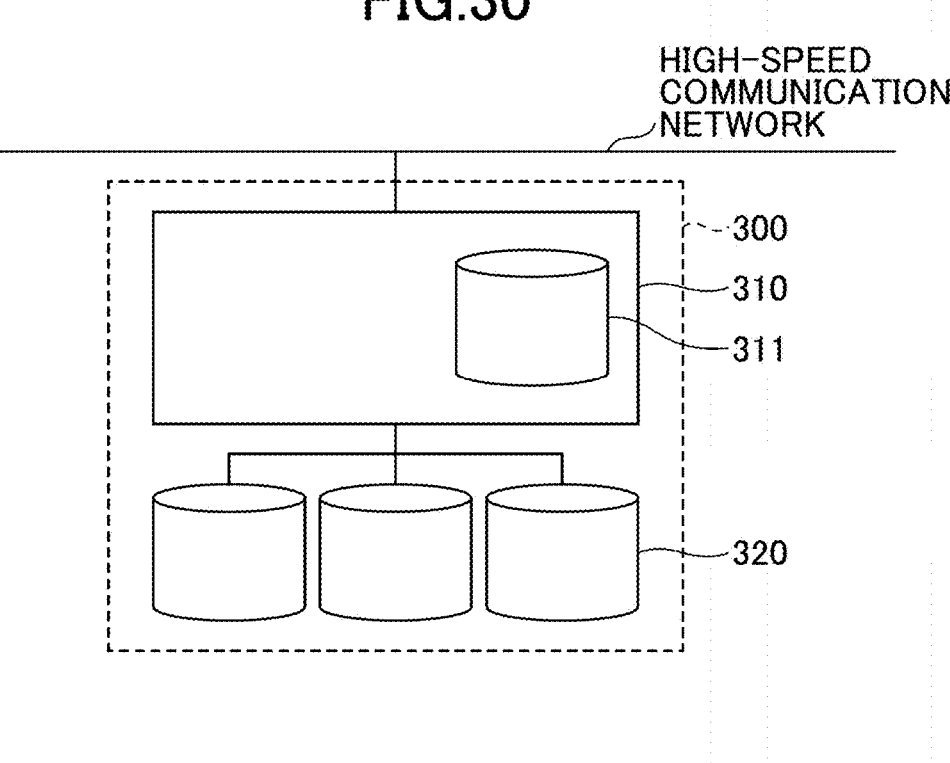
FIG. 30 is a drawing illustrating a configuration of a data management system according to an embodiment of the present invention.

A data management system including the above-described ferroelectric storage apparatus 100 as an external storage apparatus is explained. FIG. 30 is a drawing illustrating a configuration of a data management system. As illustrated in FIG. 30, the data management system 300 is a data management system for managing data on a high-speed communication network, and includes a data management unit 310 and at least one external storage apparatus 320.

As illustrated in FIG. 30, the data management unit 310 includes an internal storage apparatus 311.

The data management unit 310 stores, to the external storage apparatus 320, a large amount of data that flows at a high speed on a high-speed communication network as it is, and stores and saves, in the internal storage apparatus 311, metadata used for reading of saved data. Accordingly, the data management unit 310 can save, to the external storage apparatus 320, a large amount of data flowing on a high-speed communication network at a high speed. The external storage apparatus 320 can increase the expandability of the data management system because the external storage apparatus 320 can be more easily replaced than the internal storage apparatus 311. In addition, the data management unit 310 can readily read data saved in the external storage apparatus 320 by using metadata saved in the internal storage apparatus 311.

The metadata is data saved in the internal storage apparatus 311 and describing supplementary information of data saved in the external storage apparatus 320. Specifically, the metadata includes a type, a size, an attribute, a format, a title, an author, a publishing company, a related keyword of data, a time when data occurs, a location, and the like. Also, the metadata includes, for example, a position, a drive number, a track number, and a sector number in the external storage apparatus 320 that saves data.

As illustrated in FIG. 30, the external storage apparatus 320 is connected to the data management unit 310 via wires or wirelessly so that data can be transmitted to and received from the data management unit 310, and the external storage apparatus 320 stores data on the high-speed communication network transmitted from the data management unit 310.

Multiple external storage apparatuses 320 can be provided. The multiple external storage apparatuses 320 are preferably arranged and provided in parallel. The multiple external storage apparatuses 320 can save a large amount of data at a high speed, and reduce the load required for saving data in each of the external storage apparatuses 320. Also, the multiple external storage apparatuses 320 are arranged and provided in parallel, so that the multiple external storage apparatuses 320 have a high expandability, and therefore, the data capacity of data that can be saved can be increased.

Figure 31:
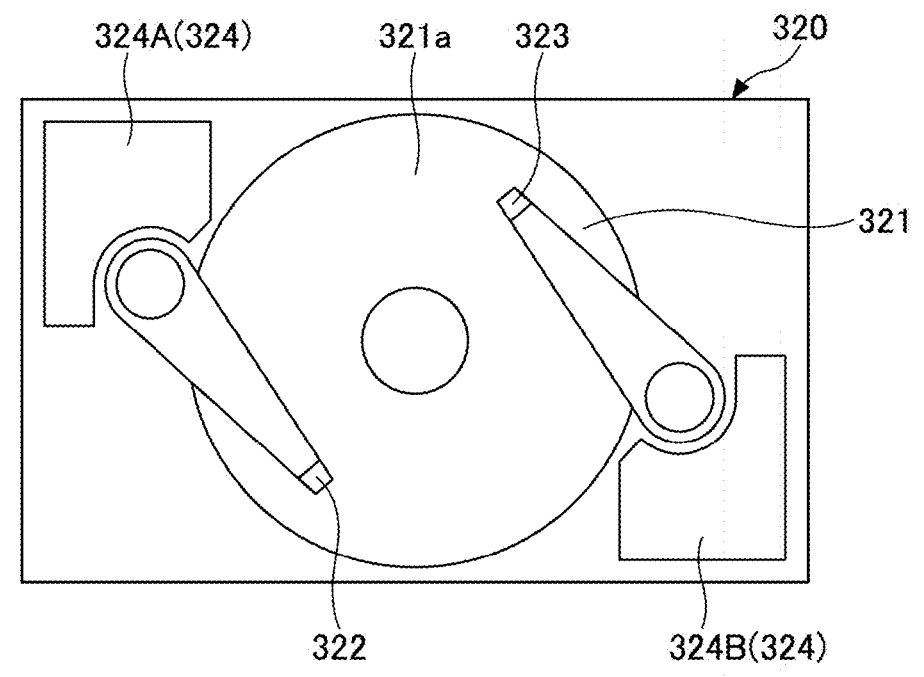
FIG. 31 is a drawing illustrating an example of a configuration of an external storage apparatus.

FIG. 31 illustrates an example of a configuration of the external storage apparatus 320. As illustrated in FIG. 31, the external storage apparatus 320 includes a ferroelectric recording medium 321, and preferably further includes a storage apparatus 322, a read device 323, and a driving unit 324.

The ferroelectric recording medium 321 is substantially the same as the above-described ferroelectric recording medium 10 (see FIG. 8), and the details thereof are omitted.

The storage apparatus 322 is a device for saving data to the ferroelectric recording medium 321.

The read device 323 is a device for reading data from the ferroelectric recording medium 321.

The storage apparatus 322 and the read device 323 are substantially the same as the above-described conductive probe 26 (see FIG. 15) and the like, and the details thereof are omitted.

The driving unit 324 includes a first driving unit 324A that drives the storage apparatus 322 on a storage surface 321a of the ferroelectric recording medium 321 and a second driving unit 324B that drives the read device 323 on the storage surface 321a. The first driving unit 324A and the second driving unit 324B are substantially the same as the above-described probe driving unit 40 (see FIG. 8), and the details thereof are omitted.

The storage apparatus 322 and the read device 323 may independently drive, with the driving unit 324, the same storage surface 321a of the ferroelectric recording medium 321.

The external storage apparatus 320 may save new data on the high-speed communication network upon deleting old data saved in the past without updating the old data, or may save new data by overwriting old data.

Specifically, data saved in the external storage apparatus 320 is preferably not data saved by overwriting old data saved in the past, and is rather preferably new data on the high-speed communication network that is saved by deleting or overwriting old data saved in the past.

The ferroelectric recording medium 321 is a rotating medium, and information is read from and information is written to the ferroelectric recording medium 321 by moving a read-and-write device (the storage apparatus 322 and the read device 323) in the sector direction (the circumferential direction) and the track direction (the radius direction) while the ferroelectric recording medium 321 is rotated at a high speed. In this method, it is most efficient to read information from and write information to continuous sectors and continuous tracks. When information is read from or information is written to another non-continuous track or sector, it takes time to move the read-and-write device to another track, another sector, or the like. Therefore, in order to update old data saved in the past, it takes time to move the write device to the track and sector where the data is stored.

The external storage apparatus 320 saves new data on the high-speed communication network upon deleting old data saved in the past without updating the old data, or may save new data by overwriting old data, so that the external storage apparatus 320 can write information to the continuous sector and the continuous track, and therefore, the external storage apparatus 320 can save data at a high speed.

Figures 32A, 32B:
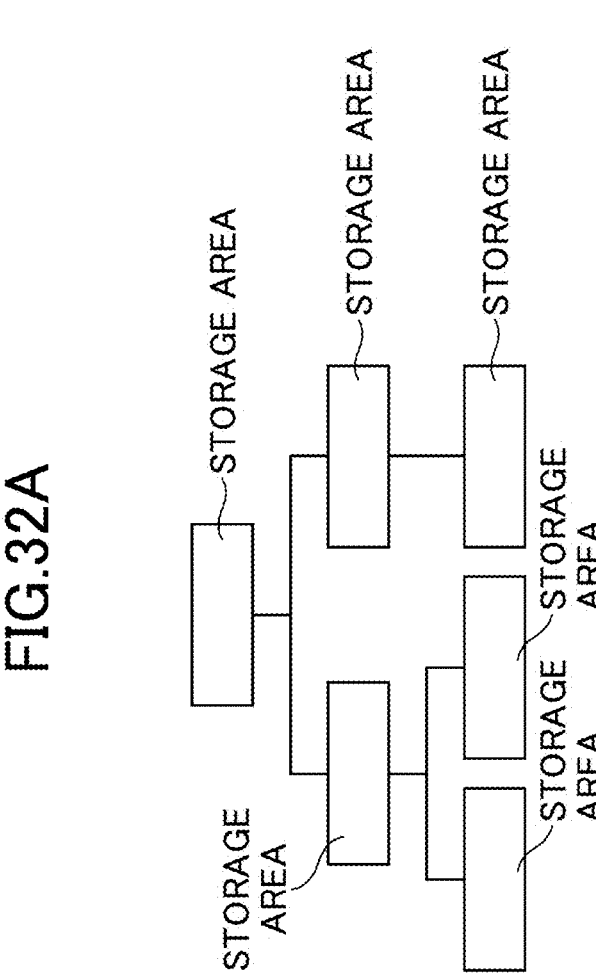
FIGS. 32A and 32B are explanatory diagrams illustrating an example of a connection relationship of data saved in a ferroelectric recording medium.

FIGS. 32A and 32B illustrate an example of a connection relationship of data saved in the ferroelectric recording medium 321. As illustrated in FIG. 32A, the data saved in the external storage apparatus 320 is not saved in a storage area having a hierarchical structure, but as illustrated in FIG. 32B, is saved in a centralized storage area that does not have a hierarchical structure. Accordingly, the external storage apparatus 320 can reduce the time required to move the storage apparatus to another hierarchical position of the ferroelectric recording medium 321 during writing of information, and therefore, the external storage apparatus 320 can store data to the ferroelectric recording medium 321 at a high speed.

The hierarchical structure is a structure arranged in such a state that multiple pieces of data located at a lower hierarchical level of the ferroelectric recording medium 321 are branched from a single piece of data that belongs to a given hierarchical level of the ferroelectric recording medium 321.

In this manner, the data management system 300 includes the data management unit 310 and at least one external storage apparatus 320. The data management unit 310 saves data on the high-speed communication network to the external storage apparatus 320, and saves metadata to the internal storage apparatus 311. Multiple external storage apparatuses 320 may be provided. The data management system 300 saves a large amount of data flowing at a high speed on the high-speed communication network from the data management unit 310 to the external storage apparatus 320, and can easily read data saved in the external storage apparatus 320 by using metadata saved in the internal storage apparatus 311. Also, the external storage apparatus 320 can be readily replaced and added, and multiple external storage apparatuses 320 may be provided, so that the data capacity of data that can be saved can be increased, and the burden required to save data of the external storage apparatus 320 can be reduced. Accordingly, the data management system 300 can perform writing with a high record density at a high speed, and can have a high expandability. Therefore, the data management system 300 can efficiently save data on the high-speed communication network, and can increase the convenience.

The data management system 300 can be configured by connecting the data management unit 310 to the high-speed communication network and can connect the external storage apparatus 320 to the data management unit 310. Accordingly, the data management system 300 can save data on the high-speed communication network via the data management unit 310 to the external storage apparatus 320, and can reliably save, to the internal storage apparatus 311, metadata used for reading data stored in the external storage apparatus 320. Therefore, the data management system 300 can efficiently save data on the high-speed communication network, and can read data saved in the external storage apparatus 320 at a higher speed.

In the data management system 300, multiple external storage apparatuses 320 can be arranged in parallel. Accordingly, the data management system 300 can write data on the high-speed communication network to respective external storage apparatuses 320 in an evenly distributed manner. Therefore, the data management system 300 can more efficiently save a large amount of data to the multiple external storage apparatuses 320 at a high speed, and can improve the expandability more greatly. Therefore, the data management system 300 can more greatly increase the convenience while the data capacity of data that can be saved can be increased.

In the data management system 300, the external storage apparatus 320 saves new data on the high-speed communication network upon deleting old data saved in the past without updating the old data, or saves new data by overwriting old data. Accordingly, the data management system 300 can facilitate writing of data to the ferroelectric recording medium 321 of the external storage apparatus 320, and facilitates reading of data saved in the external storage apparatus 320. Therefore, the data management system 300 can reliably save data to or read data from the external storage apparatus 320 at a high speed while maintaining the data.

In the data management system 300, the external storage apparatus 320 includes the storage apparatus 322, the read device 323, and the driving unit 324. Accordingly, the data management system 300 can perform writing and reading of information in continuous sectors and continuous tracks on the same storage surface 321a of the ferroelectric recording medium 321. Also, during writing of information in continuous sectors and continuous tracks, sporadic read requests of information can be handled. Therefore, the data management system 300 can save data to the ferroelectric recording medium 321 at a high speed, and can read saved data.

EXAMPLES

Hereinafter, the embodiment is specifically explained by showing Examples and Comparative Examples, but the embodiment is not limited by these Examples and Comparative Examples.

Example 1

[Production of Target for Forming Ferroelectric Layer]
(Production of $Hf_{0.5}Zr_{0.5}O_2$ Target)

A mixture obtained by mixing $HfO_2$ powder and $ZrO_2$ powder at a ratio of 1:1 was made into a slurry using water as a solvent, and was thereafter spray-dried to manufacture a mixed powder. A molded product obtained by pressing this mixed powder was baked in an inert atmosphere to manufacture a target. The density of the manufactured target was about 96% of the theoretical value of $Hf_{0.5}Zr_{0.5}O_2$.

(Production of 4($Y_2O_3$)-96($HfO_2$) Target)

The 4($Y_2O_3$)-96($HfO_2$) target was manufactured in the same manner as the above-described $Hf_{0.5}Zr_{0.5}O_2$ target was manufactured, except that the $Y_2O_3$ powder and the hafnium oxide ($HfO_2$) powder were mixed at a ratio of 4:96. The density of the manufactured target was about 95% of the theoretical value of 4($Y_2O_3$)-96($HfO_2$).

[Production of Ferroelectric Recording Medium]

The ferroelectric recording medium was manufactured according to the following method. A non-doped monocrystalline silicon with a plane (001) was used as a substrate. The shape of the substrate was a disk shape having an opening portion at the center, and the substrate had an outer diameter of 65 mm, an inner diameter of 20 mm, and a thickness of 0.8 mm. The substrate in the disk shape was put into a deposition apparatus (by CANON ANELVA CORPORATION), and gold (Au) as an electrode layer was deposited at 30 nm on the surface of the substrate by using an RF sputtering method with a substrate temperature of 200° C. using Ar as the sputter gas Ar at a pressure of 1 Pa. Subsequently, using an RF sputtering method, $CeO_2$ as a paraelectric layer was deposited at 30 nm with a substrate temperature of 350° C. using Ar and $O_2$ (mixing ratio of 3:1) as the sputter gas at a pressure of 1 Pa. Subsequently, using an RF sputtering method, $Hf_{0.5}Zr_{0.5}O_2$ as a ferroelectric layer was deposited at 30 nm with a substrate temperature of 400° C. using Ar and $O_2$ (mixing ratio of 3:1) as the sputter gas at a pressure of 1 Pa. On top of $Hf_{0.5}Zr_{0.5}O_2$ as the ferroelectric layer, a diamond-like carbon (DLC) film as a protection layer was deposited at 5 nm by an ion beam method with a substrate temperature of 150° C. The electrode layer is deposited on the entire surface of the substrate, but a width 10 mm of the inner circumferential portion was masked, so that the electrode layer was not deposited on a portion around the opening portion in the center of the paraelectric layer, the ferroelectric layer, and the protection layer. Finally, on the protection layer, a lubricant layer was formed by applying a perfluoropolyether-based lubricant with a film thickness of 1.5 nm using a dip method. As a result, a ferroelectric recording medium was obtained.

Tables 1 to 4 illustrate the configuration of each layer constituting the ferroelectric recording medium.

[Evaluation of Properties of Ferroelectric Layer]

With respect to the ferroelectric layer, diffraction strength of the (111) plane measured by X-ray diffraction (XRD), smoothness, a density of current leakage, and a density of current leakage due to deterioration over time were evaluated as the properties of the ferroelectric layer of the ferroelectric recording medium.

(Evaluation of Diffraction Strength of (111) Plane of Ferroelectric Layer, Measured by XRD)

After the electrode layer, the paraelectric layer, and the ferroelectric layer were deposited according to the above-described [Production of ferroelectric recording medium], the substrate was taken out from the deposition apparatus. With respect to the substrate taken out, the diffraction strength of the (111) plane of $Hf_{0.5}Zr_{0.5}O_2$ was measured using an x-ray diffraction (XRD) apparatus with the incident X-ray being 8 and the detection angle being 28. As a result, the diffraction strength was 1200 cps. Table 5 illustrates a measurement result.

(Evaluation of Smoothness of Ferroelectric Layer)

After the electrode layer, the paraelectric layer, and the ferroelectric layer were deposited according to the above-described [Production of ferroelectric recording medium], the substrate was taken out from the deposition apparatus. A surface roughness (Ra) on the side of the ferroelectric layer of the substrate taken out was measured, and the surface roughness of the ferroelectric layer was evaluated on the basis of the evaluation criteria below. For the measurement, an atomic force microscope (by BRUKER) was used.

((Evaluation Criteria))

A: The surface roughness of the substrate was less than 0.5 nm.

B: The surface roughness of the substrate was 0.5 nm to less than 1.0 nm.

C: The surface roughness of the substrate was 1.0 nm or more.

(Evaluation of Density of Current Leakage in Ferroelectric Layer)

Similar to the above-described (Evaluation of smoothness of ferroelectric layer), after the electrode layer, the paraelectric layer, and the ferroelectric layer were deposited according to the above-described [Production of ferroelectric recording medium], the substrate was taken out from the deposition apparatus. An evaluation sample was manufactured by forming an Au electrode pad (a film thickness 200 nm) having a size of 0.5 mm by 0.5 mm on surface of the ferroelectric layer of the substrate taken out. The density of current leakage between an electrode layer and an Au electrode pad of this evaluation sample was measured. As a result, the density of current leakage was about $5 \times 10^{-6}$ $A/cm^2$ when 5 V was applied. Table 5 shows the measurement result.

(Evaluation of Density of Current Leakage in Ferroelectric Layer Due to Deterioration Over Time)

A ferroelectric recording medium manufactured according to the above-described [Production of ferroelectric recording medium] was maintained under an environment at a temperature of 80° C. and a humidity of 80% for two weeks. After the ferroelectric recording medium taken out was dried, an evaluation sample was manufactured by forming Au electrode pad (a film thickness 200 nm) having a size of 0.5 mm by 0.5 mm at a position of a radius of 40 mm. This evaluation sample was attached to the spindle shaft of the ferroelectric storage apparatus, and the density of current leakage between the spindle shaft and the Au electrode pad of this evaluation sample was measured. As a result, the density of current leakage was about $5 \times 10^{-6}$ $A/cm^2$ when 5 V was applied. Table 5 shows the measurement result.

The density of current leakage, due to deterioration over time, of the ferroelectric recording medium according to Example 13 explained later was about $1 \times 10^{-5}$ $A/cm^2$ when 5 V was applied. Table 5 shows the measurement result (see Example 13).

Table 5 illustrates evaluation results of each of the above-described properties of the ferroelectric layer.

[Manufacture of Ferroelectric Storage Apparatus]

(Manufacture of First Conductive Probe)

The first conductive probe was manufactured according to the following method. Using a sputtering method, molybdenum was deposited at a thickness of 1 μm on a quartz substrate having a thickness of 0.2 mm and a plane (0001). A photoresist pattern having an opening portion in an equilateral triangle with a side of 0.3 μm was formed on a molybdenum surface by a photoresist method. Subsequently, by wet etching, molybdenum in a portion that is not covered by a photoresist pattern was etched to a depth of about 0.3 μm. As an etching liquid, a mixed liquid including phosphoric acid ($H_3PO_4$), nitric acid ($HNO_3$), acetic acid ($CH_3COOH$), and water was used. Thereafter, molybdenum was deposited at a thickness of 1 μm by a sputtering method. Thereafter, a chip of a first conductive probe having a needle-shaped electrode of molybdenum was formed on a quartz substrate by cutting a quartz substrate including a probe formation portion into a square with a size of 0.5 mm by 0.5 mm and thereafter removing the photoresist. The needle-shaped electrode of this chip was surrounded and covered by the molybdenum layer, and the tip portion of the needle slightly protruded from the molybdenum layer.

(Manufacture of First Probe Slider)

The first probe slider constituted by $Al_2O_3$—TiC(AlTiC) was manufactured. The outer shape of the first probe slider was such that the upper surface was 2 mm×1.5 mm, the thickness was 0.5 mm, a width of a leading end face that is an inflow end face of air flow was 0.2 mm, and a recessed portion of 0.2 mm for attaching the chip of the first conductive probe was provided on an outflow end face. In addition, Au wires for the conductive probe and an Au electrode and wires for applying a voltage to a piezoelectric element (quartz) were provided on an outflow end face.

(Manufacture of Second Conductive Probe and Second Probe Slider)

A monocrystalline silicon substrate (plane (001)) having a thickness of 0.2 mm was heated to 550° C., and on the surface thereof, an electrode layer (first electrode) of Au having a thickness of 200 nm, a PZT layer (electrostrictive element) having a thickness of 500 nm, an electrode layer (second electrode) of Au having a thickness of 200 nm, a PZT layer (piezoelectric element) having a thickness of 500 nm, and an electrode layer (third electrode) of Au having a thickness of 200 nm were deposited by an RF sputtering method. In each electrode layer, a circuit pattern connected to an electrode layer outside of the laminate structure was provided by photolithography. By a method similar to the method used for the first conductive probe, a needle-shaped electrode of molybdenum was formed on these layers. Thus, the chip of the second conductive probe was manufactured.

Using the chip of the second conductive probe, the second probe slider was manufactured by a method similar to the method used for the first probe slider. Wires connected to the first electrode, the second electrode, and the third electrode were provided in the second probe slider. In this case, the first electrode and the second electrode were used for voltage application to the electrostrictive element, the second electrode and the third electrode were used for detection of an output signal from the piezoelectric element, and the third electrode was used for application of a write signal to the ferroelectric recording medium.

(Manufacture of Ferroelectric Recording Medium Driving Unit)

A spindle motor having a structure as illustrated in FIG. 26 was manufactured for rotation driving of the ferroelectric recording medium. An aluminum alloy was used as the housing, the shaft member was S45C hardened steel with a diameter of 3 mm, the shaft end portion was in a protruding shape with a curvature radius of 6 mm. Cylindrical 50Cu-47Fe-3Sn sintered metal was used for the bearing sleeve, and flat 50Cu-47Fe-3Sn sintered metal was used for the housing bottom portion. ISO VG100 was used for the lubricant oil, and a conductive carbon fiber (VGCF-H, Showa Denko K.K., fiber diameter of 150 nm) was added by 2% by mass.

(Manufacture of Probe Driving Unit)

As a probe driving unit, a probe driving unit having the structure as illustrated in FIG. 8 was manufactured. The probe driving unit was manufactured using a conventional HDD driving unit.

(Manufacture of Control Unit)

As a control unit, a control unit having a structure as illustrated in FIG. 8 was manufactured. The control unit was manufactured using a generally-available power source and a control device.

(Manufacture of Recording-and-Reproduction Signal Processing Unit)

A recording-and-reproduction signal processing unit was manufactured. A write signal is generated by a bipolar power source for generating a positive or negative voltage corresponding to write information, and reading is performed by an amplifier for amplifying a weak tunnel current flowing between the conductive probe and the ferroelectric recording layer and an A/D conversion apparatus converting this into digital data. A waveform generated by the bipolar power source was a triangle wave. In addition, a DC power source that causes the piezoelectric element provided between the conductive probe and the header slider to expand and shrink was also provided.

(Housing)

As a housing, a housing having a structure as illustrated in FIG. 8 was manufactured.

(Manufacture of Ferroelectric Storage Apparatus 1)

The ferroelectric storage apparatus 1 having the structure as illustrated in FIG. 8 was manufactured using the ferroelectric recording medium, the first conductive probe, the first probe slider, the ferroelectric recording medium driving unit, the probe driving unit, the control unit, the recording-and-reproduction signal processing unit, and the housing that have been manufactured. The conductive probe was mounted on the lower surface of the tip of the probe slider, this probe slider was attached to the suspension arm, and a structure for driving the surface of the ferroelectric recording medium with a voice coil motor was provided. The housing of the ferroelectric storage apparatus was sealed, and the inside was filled with argon gas at the atmospheric pressure. In addition, 1 g of silica gel was sealed in the housing as a desiccant.

(Manufacture of Ferroelectric Storage Apparatus 2)

A ferroelectric storage apparatus 2 was manufactured in the same manner as the above-described ferroelectric storage apparatus 1 was manufactured, except that the conductive probe and the probe slider of the ferroelectric storage apparatus 1 were replaced by a second conductive probe and a second probe slider, respectively.

[Performance of Ferroelectric Storage Apparatus 1]

As the performance of the ferroelectric storage apparatus 1, a recording-and-reproduction test 1 of the ferroelectric storage apparatus 1, a measurement of a tunnel current difference during reading, and a measurement of the amount of charge of triboelectric charging were conducted.

(Recording-and-Reproduction Examination)

Recording-and-reproduction test of manufactured ferroelectric storage apparatus 1 was conducted. The ferroelectric recording medium was rotated at 5400 rpm, the probe slider is caused to travel by floating above the ferroelectric recording medium surface, and the position of the probe slider was fixed to a track position at a radius of 40 mm of the ferroelectric recording medium. Thereafter, the conductive probe was switched to an information read circuit, a bias voltage of +500 mV was applied across the ferroelectric recording medium and the conductive probe, and a tunnel current from the conductive probe was monitored. Then, by applying a DC voltage to the piezoelectric element, the conductive probe was gradually brought closer to the ferroelectric recording medium, and the voltage applied to the piezoelectric element was fixed at the position where the average value of the tunnel current becomes 2 pA.

Thereafter, the conductive probe was switched to the information write circuit, and information of 255 sectors is written to this track position. Each sector is constituted by a data area and a servo information area, and the servo information area is constituted by a burst information area and an address information area. Writing of information was performed with a triangle wave of which the peak voltage is ±5V, and the write frequency was 2.3 GHz. Information is written once, and the write time was about 10 milliseconds. This is the length of a single bit, i.e., 10 nm, in the circumferential direction on the surface of the ferroelectric recording medium.

After information was written to the ferroelectric recording medium, the conductive probe was switched to the information read circuit, and the tunnel current was monitored. At this occasion, the voltage applied to the piezoelectric element was adjusted so as to make the SNR 3 dB or more. The amplitude of the tunnel current was about 3 pA, and the length of time from the end of writing of information to the ferroelectric recording medium to reading was about 0.1 milliseconds.

According to the above method, it was confirmed that information can be written to the ferroelectric storage apparatus 1 and written information can be read.

When the above-described reading of information was repeated 10 times, the SNR during reading of information became less than 3 dB, and therefore, the same data was rewritten to the same track position. As a result, the SNR during reading of information recovered to 3 dB or more. (Measurement 1 of Tunnel Current Difference During Reading)

When information is read from the ferroelectric recording medium, a tunnel current difference between a positively charged bit of the ferroelectric layer and a negatively charged bit of the ferroelectric layer was measured. The bias voltage across the ferroelectric recording medium and the conductive probe was 500 mV. On the surface layer side of the ferroelectric layer, the tunnel current of the positively charged bit decreases, and the tunnel current of the negatively charged bit increases. In this case, specifically, a tunnel current from the negatively charged bit was measured, when the distance between the conductive probe and the ferroelectric recording medium was adjusted so that the tunnel current of the positively charged bit on the surface layer side became 1 pA. As a result, the tunnel current from the negatively charged bit was about 3 pA, and a tunnel current difference therebetween was about 2 pA. Table 6 shows the result. (Measurement 2 of Tunnel Current Difference During Reading)

When information is read from the ferroelectric recording medium, a bias voltage of ±500 mV was applied across the ferroelectric recording medium and the conductive probe. The bias voltage was a square wave of 1 GHz, and the read speed was 500 Mbit/second.

The distance between the conductive probe and the ferroelectric recording medium was adjusted so as to make the tunnel current of the positively charged bit on the surface layer side of the ferroelectric layer 5 pA on average when the bias voltage to the conductive probe was −500 mV. In this case, when the bias voltage to the conductive probe was +500 mV, the average value of the tunnel current has decreased to 1 pA. This is considered to be that because there is a rectifying effect in the bonding portion between the ferroelectric layer and the paraelectric layer. When the negatively charged bit on the surface layer side of the ferroelectric layer was evaluated in the same manner, the tunnel current in the forward direction was 25 pA on average, and the tunnel current in the reverse direction was 5 pA. According to the above-described measurement, in a case where the bias voltage to the conductive probe was changed to positive and negative, the tunnel current difference between the positively charged bit and the negatively charged bit was 20 pA at most. Table 6 illustrates the result. (The Amount of Charge of Triboelectric Charging)

The static electricity of the ferroelectric storage apparatus (specifically, the ferroelectric storage apparatus the inside of which was filled with argon gas at the atmospheric pressure and of which the housing is sealed with a desiccant placed therein) manufactured according to the above-described "Manufacture of ferroelectric storage apparatus" was removed. Thereafter, the ferroelectric recording medium was rotated at 5600 rpm, and the probe slider performed seek operations once in every 4 Hz (an operation for returning to the innermost circumference after performing a seek operation to the outermost circumference from the innermost circumference is defined as one cycle). Thereafter, the seek operation was stopped, and the amount of charge between the housing and the conductive probe was measured at one second after the stop of the seek operation. As a result, the amount of charge of triboelectric charging was 0.1 nC.

As a reference ferroelectric storage apparatus, a first reference ferroelectric storage apparatus (Example 11) of which the inside is filled with nitrogen gas at atmospheric pressure is filled and of which the housing is sealed with a desiccant placed therein was manufactured, and a second reference ferroelectric storage apparatus (Example 12) in the inside of which a desiccant is placed and the inside of which is brought to the atmosphere through a filter was manufactured. With respect to these reference ferroelectric storage apparatuses, the amount of charge is measured in the same manner as the measurement of the ferroelectric storage apparatus according to the Example 1. As a result, in the first reference ferroelectric storage apparatus, the amount of charge of triboelectric charging was 3 nC, and in the second reference ferroelectric storage apparatus, the amount of charge of triboelectric charging was 4 nC.

Therefore, with respect to the ferroelectric storage apparatus of the Example 1, it was confirmed that the triboelectric charging was alleviated due to the argon gas filling the housing.

[Performance of Ferroelectric Storage Apparatus 2]

As the performance of the ferroelectric storage apparatus 2, for reading of information from the ferroelectric recording medium, reading using an atomic force was performed. The reading using the atomic force was performed by measuring an amplitude of a signal of read information obtained from a piezoelectric element during the recording-and-reproduction test of the ferroelectric storage apparatus 2. (Measurement 3 of Amplitude of Signal of Read Information Obtained from Piezoelectric Element when Reading is Performed Using Atomic Force Recording-and-reproduction test of manufactured ferroelectric storage apparatus was conducted. The ferroelectric recording medium was 5400 rpm, the probe slider was caused to travel by floating above the ferroelectric recording medium surface, and the position of the probe slider was fixed to a track position at a radius of 40 mm of the ferroelectric recording medium. Thereafter, while the output voltage from the piezoelectric element across the second electrode and the third electrode was monitored, a DC voltage applied to the electrostrictive element across the first electrode and the second electrode is gradually increased, so that the conductive probe is brought closer to the ferroelectric recording medium, and the voltage applied to the electrostrictive element was controlled so that the average value of the output voltage from the piezoelectric element became about +5 µV.

In this state, an information write signal was applied from the third electrode to the conductive probe, and information of 255 sectors is written to this track position. Each sector is constituted by a data area and a servo information area, and the servo information area is constituted by a burst information area and an address information area. Writing of information was performed with a triangle wave of which the peak voltage is ±5V, and the write frequency was 2.3 GHz. Information is written once, and the write time was about 10 milliseconds. This is the length of a single bit, i.e., 10 nm, in the circumferential direction on the surface of the ferroelectric recording medium.

After information was written to the ferroelectric recording medium, while the output voltage from the piezoelectric element was monitored, the voltage applied to the piezoelectric element was adjusted so as to make the SNR of the output voltage from the piezoelectric element 3 dB or more. As a result, information of 255 sectors that are the same as the written information were read from the ferroelectric recording medium. The amplitude of the signal of read information from the piezoelectric element was about 3 µV, and the length of time from the end of writing of information to the ferroelectric recording medium to reading was about 0.1 milliseconds. Table 6 illustrates a measurement result of amplitudes of signals of read information obtained from the piezoelectric elements.

Examples 2 to 6

Ferroelectric recording media according to Examples 2 to 6 were manufactured in the same manner as in the Example 1 explained in the above-described [Production of ferroelectric recording medium] except that the materials included in the electrode layers were changed to Ge, Pb, Al, Cu, and Cr as shown in Table 2. With respect to each Example, a test of a diffraction strength of (111) plane of $Hf_{0.5}Zr_{0.5}O_2$ of the ferroelectric layer and a recording-and-reproduction test of the ferroelectric storage apparatus were conducted. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Examples 7 to 9

Ferroelectric recording media according to Examples 7 to 9 were manufactured in the same manner as in the Example 1 explained in the above-described [Production of ferroelectric recording medium] except that the materials included in the paraelectric layers were changed to $10(Y_2O_3)$-$90(ZrO_2)$, $Al_2O_3$, and $TiO_2$ as shown in Table 3. With respect to each Example, a test of a diffraction strength of (111) plane of $Hf_{0.5}Zr_{0.5}O_2$ of the ferroelectric layer and a recording-and-reproduction test of the ferroelectric storage apparatus were conducted. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Example 10

A ferroelectric recording medium according to Example 10 was manufactured in the same manner as in the Example 1 explained in the above-described [Production of ferroelectric recording medium] except that the paraelectric layer was not provided. With respect to each Example, a test of a diffraction strength of (111) plane of $Hf_{0.5}Zr_{0.5}O_2$ of the ferroelectric layer, a recording-and-reproduction test of the ferroelectric storage apparatus, and a measurement of the amount of charge of triboelectric charging were conducted. In this Example 10, the density of current leakage between the electrode layer and the Au electrode pad of the substrate on which the electrode layer, the paraelectric layer, and the ferroelectric layer were deposited was about $1 \times 10^{-5}$ $A/cm^2$ when 5 V was applied. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Examples 11 and 12

Ferroelectric recording media according to Examples 11 and 12 were manufactured in the same manner as in the Example 1 explained in the above-described [Production of ferroelectric recording medium] except that the inside was filled with nitrogen gas or atmosphere of the atmospheric pressure and that the housing was sealed with a desiccant placed therein. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Example 13

A ferroelectric recording medium according to Example 13 was manufactured in the same manner as in the Example 1 explained in the above-described [Production of ferroelectric recording medium] except that deposition was performed without masking a width 10 mm of the inner circumferential portion of the substrate, and the ferroelectric recording medium according to Example 13 having the electrode layer, the paraelectric layer, the ferroelectric layer, and the protection layer deposited on the entire surface of the substrate was manufactured. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Example 14 and Comparative Examples 1 to 4

Ferroelectric recording media according to Example 14 and Comparative Examples 1 to 4 were manufactured in the same manner as in the Example 1 explained in the above-described [Production of ferroelectric recording medium] except that the material used for the substrate was changed to an A-plane sapphire substrate (Example 14), an electroless NiP-plated 5000-series aluminum alloy substrate (Comparative Example 1), an amorphous glass substrate (Comparative Example 2), an MgO substrate of (100) plane (Comparative Example 3), and a C-plane sapphire substrate (Comparative Example 4) as shown in Table 1, and that, in the Comparative Example 1, the electrode layer was not provided. With respect to the Example 14 and the Comparative Examples 1 to 4, a test of a diffraction strength of (111) plane of $Hf_{0.5}Zr_{0.5}O_2$ of the ferroelectric layer of and a recording-and-reproduction test of the ferroelectric storage apparatus were conducted. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Example 15

A ferroelectric recording medium according to Example 15 was manufactured in the same manner as in the Example 1 explained in the above-described [Production of ferroelectric recording medium] except that the substrate temperature during deposition of the ferroelectric layer was reduced by 80° C. to 320° C. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Example 16

A ferroelectric recording medium according to Example 16 was manufactured in the same manner as in the Example 1 explained in the above-described [Production of ferroelectric recording medium] except that the ferroelectric recording medium according to Example 16 has the configuration of Example 5 and that the substrate temperature during deposition of the ferroelectric layer was reduced by 80° C. to 320° C. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

Example 17

A ferroelectric recording medium according to Example 17 was manufactured in the same manner as in the Example 1 explained in the above-described [Production of ferroelectric recording medium] except that the ferroelectric recording medium according to Example 17 has the configuration of Example 6 and that the substrate temperature during deposition of the ferroelectric layer was reduced by 80° C. to 320° C. Table 1 to Table 4 show configurations of the layers constituting each of the ferroelectric recording media, Table 5 shows formation conditions of ferroelectric layers and evaluation results of properties, and Table 6 shows test results of dielectric storage apparatuses.

In all of the Examples 15 to 17, halo was observed in XRD (111) diffraction patterns, and the diffraction strength decreased, but when the substrate was heated to 520° C. (+200° C. with reference to the deposition temperature), the halo pattern changed to a signal having a sharp peak, and the diffraction strengths became 1800 (Example 15), 1600 (Example 16), and 1600 (Example 17). As a result, based on the electron microscope observation and the electron diffraction result, it is assumed that the ferroelectric layers according to Examples 15 to 17 were made into an amorphous structure with short-range order of which the length, the width, and the height were 2 nm or less. Therefore, when Examples 15 to 17 are compared with Examples 1, 5, and 6, the density of current leakage did not change, but the smoothness on the growth surface of the ferroelectric layer has improved in any of the Examples 15 to 17.

Example 18 to 23

Ferroelectric recording media according to Examples 18 to 23 were manufactured in the same manner as in the Example 1 explained in the above-described [Production of ferroelectric recording medium] except that the film thicknesses of the paraelectric layer and the ferroelectric layer were changed to values as shown in Table 3 and Table 4.

TABLE 1

| | | Substrate | | |
| | Material | Crystal System and Structure | Difference in Lattice Constant from Ferroelectric Layer [%] | Lattice Constant [Å] |
| --- | --- | --- | --- | --- |
| Example 1 | Si(001) | Cubic Crystal System Diamond Structure | 4 | 5.4 |
| Example 2 | Si(001) | Cubic Crystal System Diamond Structure | 4 | 5.4 |
| Example 3 | Si(001) | Cubic Crystal System Diamond Structure | 4 | 5.4 |
| Example 4 | Si(001) | Cubic Crystal System Diamond Structure | 4 | 5.4 |
| Example 5 | Si(001) | Cubic Crystal System Diamond Structure | 4 | 5.4 |
| Example 6 | Si(001) | Cubic Crystal System Diamond Structure | 4 | 5.4 |
| Example 7 | Si(001) | Cubic Crystal System Diamond Structure | 4 | 5.4 |
| Example 8 | Si(001) | Cubio Crystal System Diamond Structure | 4 | 5.4 |
| Example 9 | Si(001) | Cubic Crystal System Diamond Structure | 4 | 5.4 |
| Example 10 | Si(001) | Cubic Crystal System Diamond Structure | 4 | 5.4 |

TABLE 1-continued

| | | Substrate | | |
|---|---|---|---|---|
| | Material | Crystal System and Structure | Difference in Lattice Constant from Ferroelectric Layer [%] | Lattice Constant [Å] |
| Example 11 | Si(001) | Cubic Crystal System Diamond Structure | 4 | 5.4 |
| Example 12 | Si(001) | Cubic Crystal System Diamond Structure | 4 | 5.4 |
| Example 13 | Si(001) | Cubic Crystal System Diamond Structure | 4 | 5.4 |
| Example 14 | A-plane Sapphire | Hexagonal Crystal System Corundum Type Structure | 8 | 4.8 |
| Example 15 | Si(001) | Cubic Crystal System Diamond Structure | 4 | 5.4 |
| Example 16 | Si(001) | Cubic Crystal System Diamond Structure | 4 | 5.4 |
| Example 17 | Si(001) | Cubic Crystal System Diamond Structure | 4 | 5.4 |
| Example 18 | Si(001) | Cubic Crystal System Diamond Structure | 4 | 5.4 |
| Example 19 | Si(001) | Cubic Crystal System Diamond Structure | 4 | 5.4 |
| Example 20 | Si(001) | Cubic Crystal System Diamond Structure | 4 | 5.4 |
| Example 21 | Si(001) | Cubic Crystal System Diamond Structure | 4 | 5.4 |
| Example 22 | Si(001) | Cubic Crystal System Diamond Structure | 4 | 5.4 |
| Example 23 | Si(001) | Cubic Crystal System Diamond Structure | 4 | 5.4 |
| Comparative Example 1 | NiP-plated 5000 Series Aluminum Alloy | Amorphous Structure (NiP Film) | — | — |
| Comparative Example 2 | Amorphous Glass | Amorphous Structure (NiP Film) | — | — |
| Comparative Example 3 | MgO(100) | Cubic Crystal System Sodium Chloride Type Structure | 19 | 4.2 |
| Comparative Example 4 | C-plane Sapphire | Hexagonal Crystal System Corundum Type Structure | 150 | 13 |

TABLE 2

| | | Electrode Layer | | |
|---|---|---|---|---|
| | Material | Crystal System and Structure | Difference in Lattice Constant from Ferroelectric Layer [%] | Lattice Constant [Å] |
| Example 1 | Au | Cubic Crystal System, Face-Centered Cubic Lattice Structure | 21 | 4.1 |
| Example 2 | Ge | Cubic Crystal System, Diamond Structure | 10 | 5.7 |
| Example 3 | Pb | Cubic Crystal System, Face-Centered Cubic Lattice Structure | 4 | 5.0 |
| Example 4 | Al | Cubic Crystal System, Face-Centered Cubic Lattice Structure | 23 | 4.0 |
| Example 5 | Cu | Cubic Crystal System, Face-Centered Cubic Lattice Structure | 31 | 3.6 |
| Example 6 | Cr | Cubic Crystal System, Body-Centered Cubic Lattice Structure | 44 | 2.9 |
| Example 7 | Ge | Cubic Crystal System, Diamond Structure | 10 | 5.7 |
| Example 8 | Ge | Cubic Crystal System, Diamond Structure | 10 | 5.7 |
| Example 9 | Ge | Cubic Crystal System, Diamond Structure | 10 | 5.7 |
| Example 10 | Au | Cubic Crystal System, Face-Centered Cubic Lattice Structure | 21 | 4.1 |
| Example 11 | Au | Cubic Crystal System, Face-Centered Cubic Lattice Structure | 21 | 4.1 |
| Example 12 | Au | Cubic Crystal System, Face-Centered Cubic Lattice Structure | 21 | 4.1 |

TABLE 2-continued

| | | Electrode Layer | | |
|---|---|---|---|---|
| | Material | Crystal System and Structure | Difference in Lattice Constant from Ferroelectric Layer [%] | Lattice Constant [Å] |
|---|---|---|---|---|
| Example 13 | Au | Cubic Crystal System, Face-Centered Cubic Lattice Structure | 21 | 4.1 |
| Example 14 | Au | Cubic Crystal System, Face-Centered Cubic Lattice Structure | 21 | 4.1 |
| Example 15 | Au | Cubic Crystal System, Face-Centered Cubic Lattice Structure | 21 | 4.1 |
| Example 16 | Cu | Cubic Crystal System, Face-Centered Cubic Lattice Structure | 31 | 3.6 |
| Example 17 | Cr | Cubic Crystal System, Body-Centered Cubic Lattice Structure | 44 | 2.9 |
| Example 18 | Au | Cubic Crystal System, Face-Centered Cubic Lattice Structure | 21 | 4.1 |
| Example 19 | Au | Cubic Crystal System, Face-Centered Cubic Lattice Structure | 21 | 4.1 |
| Example 20 | Au | Cubic Crystal System, Face-Centered Cubic Lattice Structure | 21 | 4.1 |
| Example 21 | Au | Cubic Crystal System, Face-Centered Cubic Lattice Structure | 21 | 4.1 |
| Example 22 | Au | Cubic Crystal System, Face-Centered Cubic Lattice Structure | 21 | 4.1 |
| Example 23 | Au | Cubic Crystal System, Face-Centered Cubic Lattice Structure | 21 | 4.1 |
| Comparative Example 1 | — | — | — | — |
| Comparative Example 2 | Au | Cubic Crystal System, Face-Centered Cubic Lattice Structure | 21 | 4.1 |
| Comparative Example 3 | Au | Cubic Crystal System, Face-Centered Cubic Lattice Structure | 21 | 4.1 |
| Comparative Example 4 | Au | Cubic Crystal System, Face-Centered Cubic Lattice Structure | 21 | 4.1 |

TABLE 3

| | | Paraelectric Layer | | | |
|---|---|---|---|---|---|
| | Material | Crystal System, Structure | Difference in Lattice Constant from Ferroelectric Layer [%] | Lattice Constant [Å] | Thickness Film [nm] |
|---|---|---|---|---|---|
| Example 1 | $CeO_2$ | Cubic Crystal System, Fluorite Type Structure | 4 | 5.4 | 30 |
| Example 2 | $CeO_2$ | Cubic Crystal System, Fluorite Type Structure | 4 | 5.4 | 30 |
| Example 3 | $CeO_2$ | Cubic Crystal System, Fluorite Type Structure | 4 | 5.4 | 30 |
| Example 4 | $CeO_2$ | Cubic Crystal System, Fluorite Type Structure | 4 | 5.4 | 30 |
| Example 5 | $CeO_2$ | Cubic Crystal System, Fluorite Type Structure | 4 | 5.4 | 30 |
| Example 6 | $CeO_2$ | Cubic Crystal System, Fluorite Type Structure | 4 | 5.4 | 30 |
| Example 7 | $10(Y_2O_3)$—$90(ZrO_2)$ | Cubic Crystal System, Fluorite Type Structure | 2 | 5.1 | 30 |
| Example 8 | $Al_2O_3$ | Trigonal Crystal System, Corundum Type Structure | 8 | 4.8 | 30 |
| Example 9 | $TiO_2$ | Tetragonal Crystal System, Rutile Type Structure | 12 | 4.6 | 30 |
| Example 10 | — | — | — | — | — |
| Example 11 | $CeO_2$ | Cubic Crystal System, Fluorite Type Structure | 4 | 5.4 | 30 |
| Example 12 | $CeO_2$ | Cubic Crystal System. Fluorite Type Structure | 4 | 5.4 | 30 |
| Example 13 | $CeO_2$ | Cubic Crystal System, Fluorite Type Structure | 4 | 5.4 | 30 |
| Example 14 | $CeO_2$ | Cubic Crystal System, Fluorite Type Structure | 4 | 5.4 | 30 |
| Example 15 | $CeO_2$ | Cubic Crystal System, Fluorite Type Structure | 4 | 5.4 | 30 |

TABLE 3-continued

| | | Paraelectric Layer | | | |
| | Material | Crystal System, Structure | Difference in Lattice Constant from Ferroelectric Layer [%] | Lattice Constant [Å] | Thickness Film [nm] |
|---|---|---|---|---|---|
| Example 16 | CeO$_2$ | Cubio Crystal System, Fluorite Type Structure | 4 | 5.4 | 30 |
| Example 17 | CeO$_2$ | Cubic Crystal System, Fluorite Type Structure | 4 | 5.4 | 30 |
| Example 18 | CeO$_2$ | Cubic Crystal System, Fluorite Type Structure | 4 | 5.4 | 30 |
| Example 19 | CeO$_2$ | Cubic Crystal System, Fluorite Type Structure | 4 | 5.4 | 20 |
| Example 20 | CeO$_2$ | Cubic Crystal System. Fluorite Type Structure | 4 | 5.4 | 10 |
| Example 21 | CeO$_2$ | Cubic Crystal System, Fluorite Type Structure | 4 | 5.4 | 5 |
| Example 22 | CeO$_2$ | Cubic Crystal System. Fluorite Type Structure | 4 | 5.4 | 1 |
| Example 23 | CeO$_2$ | Cubic Crystal System, Fluorite Type Structure | 4 | 5.4 | 1 |
| Comparative Example 1 | CeO$_2$ | Cubic Crystal System. Fluorite Type Structure | 4 | 5.4 | 30 |
| Comperative Example 2 | CeO$_2$ | Cubic Crystal System. Fluorite Type Structure | 4 | 5.4 | 30 |
| Comparative Example 3 | CeO$_2$ | Cubic Crystal System. Fluorite Type Structure | 4 | 5.4 | 30 |
| Comparative Example 4 | CeO$_2$ | Cubic Crystal System, Fluorite Type Structure | 4 | 5.4 | 30 |

TABLE 4

| | | Ferroelectric Layer | | |
| | Material | Crystal System and Structure | Lattice Constant [Å] | Thickness Film [nm] |
|---|---|---|---|---|
| Example 1 | Hf$_{0.5}$Zr$_{0.5}$O$_2$ | Orthorhombic Crystal System(*), Fluorite Type Structure | 5.1-5.3 | 30 |
| Example 2 | Hf$_{0.5}$Zr$_{0.5}$O$_2$ | Orthorhombic Crystal System(*), Fluorite Type Structure | 5.1-5.3 | 30 |
| Example 3 | Hf$_{0.5}$Zr$_{0.5}$O$_2$ | Orthorhombic Crystal System(*), Fluorite Type Structure | 5.1-5.3 | 30 |
| Example 4 | Hf$_{0.5}$Zr$_{0.5}$O$_2$ | Orthorhombic Crystal System(*), Fluorite Type Structure | 5.1-5.3 | 30 |
| Example 5 | Hf$_{0.5}$Zr$_{0.5}$O$_2$ | Orthorhombic Crystal System(*), Fluorite Type Structure | 5.1-5.3 | 30 |
| Example 6 | Hf$_{0.5}$Zr$_{0.5}$O$_2$ | Orthorhombic Crystal System(*), Fluorite Type Structure | 5.1-5.3 | 30 |
| Example 7 | Hf$_{0.5}$Zr$_{0.5}$O$_2$ | Orthorhombic Crystal System(*), Fluorite Type Structure | 5.1-5.3 | 30 |
| Example 8 | Hf$_{0.5}$Zr$_{0.5}$O$_2$ | Orthorhombic Crystal System(*), Fluorite Type Structure | 5.1-5.3 | 30 |
| Example 9 | Hf$_{0.5}$Zr$_{0.5}$O$_2$ | Orthorhombio Crystal System(*), Fluorite Type Structure | 5.1-5.3 | 30 |
| Example 10 | Hf$_{0.5}$Zr$_{0.5}$O$_2$ | Orthorhombic Crystal System(*), Fluorite Type Structure | 5.1-5.3 | 30 |
| Example 11 | Hf$_{0.5}$Zr$_{0.5}$O$_2$ | Orthorhombic Crystal System(*), Fluorite Type Structure | 5.1-5.3 | 30 |
| Example 12 | Hf$_{0.5}$Zr$_{0.5}$O$_2$ | Orthorhombic Crystal System(*), Fluorite Type Structure | 5.1-5.3 | 30 |
| Example 13 | Hf$_{0.5}$Zr$_{0.5}$O$_2$ | Orthorhombic Crystal System(*), Fluorite Type Structure | 5.1-5.3 | 30 |
| Example 14 | Hf$_{0.5}$Zr$_{0.5}$O$_2$ | Orthorhombic Crystal System(*), Fluorite Type Structure | 5.1-5.3 | 30 |
| Example 15 | Hf$_{0.5}$Zr$_{0.5}$O$_2$ | Orthorhombic Crystal System(*), Fluorite Type Structure | 5.1-5.3 | 30 |
| Example 16 | Hf$_{0.5}$Zr$_{0.5}$O$_2$ | Orthorhombic Crystal System(*), Fluorite Type Structure | 5.1-5.3 | 30 |
| Example 17 | Hf$_{0.5}$Zr$_{0.5}$O$_2$ | Orthorhombic Crystal System(*), Fluorite Type Structure | 5.1-5.3 | 30 |
| Example 18 | Hf$_{0.5}$Zr$_{0.5}$O$_2$ | Orthorhombic Crystal System(*), Fluorite Type Structure | 5.1-5.3 | 40 |

TABLE 4-continued

| | | Ferroelectric Layer | | |
| | Material | Crystal System and Structure | Lattice Constant [Å] | Thickness Film [nm] |
| --- | --- | --- | --- | --- |
| Example 19 | $Hf_{0.5}Zr_{0.5}O_2$ | Orthorhombic Crystal System(*), Fluorite Type Structure | 5.1-5.3 | 20 |
| Example 20 | $Hf_{0.5}Zr_{0.5}O_2$ | Orthorhombic Crystal System(*), Fluorite Type Structure | 5.1-5.3 | 10 |
| Example 21 | $Hf_{0.5}Zr_{0.5}O_2$ | Orthorhombic Crystal System(*), Fluorite Type Structure | 5.1-5.3 | 5 |
| Example 22 | $Hf_{0.5}Zr_{0.5}O_2$ | Orthorhombic Crystal System(*), Fluorite Type Structure | 5.1-5.3 | 1 |
| Example 23 | $Hf_{0.5}Zr_{0.5}O_2$ | Orthorhombic Crystal System(*), Fluorite Type Structure | 5.1-5.3 | 5 |
| Comparative Example 1 | $Hf_{0.5}Zr_{0.5}O_2$ | Orthorhombic Crystal System(*), Fluorite Type Structure | 5.1-5.3 | 30 |
| Comparative Example 2 | $Hf_{0.5}Zr_{0.5}O_2$ | Orthorhombic Crystal System(*), Fluorite Type Structure | 5.1-5.3 | 30 |
| Comparative Example 3 | $Hf_{0.5}Zr_{0.5}O_2$ | Orthorhombic Crystal System(*), Fluorite Type Structure | 5.1-5.3 | 30 |
| Comparative Example 4 | $Hf_{0.5}Zr_{0.5}O_2$ | Orthorhombic Crystal System(*), Fluorite Type Structure | 5.1-5.3 | 30 |

(*Stable phase is a monoclinic, tetragonal, or cubic crystal systems.)

TABLE 5

| | | Ferroelectric Layer | | | |
| | Substrate Temperature during Deposition [° C.] | Diffraction Intensity of (111) Plane (Any given value) | Smoothness | Density of Current Leakage [A/cm²] | Density of Current Leakage due to Deterioration Over Time [A/cm²] |
| --- | --- | --- | --- | --- | --- |
| Example 1 | 400 | 1200 | A | $5 \times 10^{-6}$ | $5 \times 10^{-6}$ |
| Example 2 | 400 | 1450 | A | $5 \times 10^{-6}$ | — |
| Example 3 | 400 | 1500 | A | $5 \times 10^{-6}$ | — |
| Example 4 | 400 | 1000 | A | $5 \times 10^{-6}$ | — |
| Example 5 | 400 | 800 | B | $1 \times 10^{-5}$ | — |
| Example 6 | 400 | 700 | B | $1 \times 10^{-5}$ | — |
| Example 7 | 400 | 1450 | A | $5 \times 10^{-6}$ | — |
| Example 8 | 400 | 1000 | A | $5 \times 10^{-6}$ | — |
| Example 9 | 400 | 900 | A | $1 \times 10^{-5}$ | — |
| Example 10 | 400 | 1100 | A | $1 \times 10^{-5}$ | — |
| Example 11 | 400 | 1200 | A | $5 \times 10^{-6}$ | — |
| Example 12 | 400 | 1200 | A | $5 \times 10^{-6}$ | — |
| Example 13 | 400 | 1200 | A | $5 \times 10^{-6}$ | $1 \times 10^{-5}$ |
| Example 14 | 400 | 500 | B | $1 \times 10^{-5}$ | — |
| Example 15 | 320 | 900 | A | $5 \times 10^{-6}$ | — |
| Example 16 | 320 | 600 | A | $1 \times 10^{-5}$ | — |
| Example 17 | 320 | 600 | A | $1 \times 10^{-5}$ | — |
| Example 18 | 400 | 1200 | A | $5 \times 10^{-6}$ | $5 \times 10^{-6}$ |
| Example 19 | 400 | 1200 | A | $5 \times 10^{-6}$ | $5 \times 10^{-6}$ |
| Example 20 | 400 | 1200 | A | $5 \times 10^{-6}$ | $5 \times 10^{-6}$ |
| Example 21 | 400 | 1200 | A | $5 \times 10^{-6}$ | $5 \times 10^{-6}$ |
| Example 22 | 400 | 1200 | A | $5 \times 10^{-6}$ | $5 \times 10^{-6}$ |
| Example 23 | 400 | 1200 | A | $5 \times 10^{-6}$ | $5 \times 10^{-6}$ |
| Comparative Example 1 | 400 | 0 | C | $1 \times 10^{-4}$ | — |
| Comparative Example 2 | 400 | 0 | C | $1 \times 10^{-4}$ | — |
| Comparative Example 3 | 400 | 400 | B | $1 \times 10^{-4}$ | — |
| Comparative Example 4 | 400 | 200 | C | $1 \times 10^{-4}$ | — |

TABLE 6

| | | | Measurement 1 (Tunnel Current Difference [pA]) | Measurement 2 (Tunnel Current Difference [pA]) | Measurement 3 (Amplitude of Signal from piezoelectric element [μV]) | Amount of Charge of Triboelectric Charging [nC] |
|---|---|---|---|---|---|---|
| | | | Ferroelectric Storage Device | | | |
| | Filling Gas | Recording and Reproduction | | | | |
| Example 1 | Argon Gas | Successful | 2 | 20 | 3 | 0.1 |
| Example 2 | Argon Gas | Successful | 3 | 20 | 3 | 0.1 |
| Example 3 | Argon Gas | Successful | 3 | 20 | 3 | 0.1 |
| Example 4 | Argon Gas | Successful | 2 | 20 | 3 | 0.1 |
| Example 5 | Argon Gas | Successful | 1 | 10 | 2 | 0.1 |
| Example 6 | Argon Gas | Successful | 1 | 10 | 2 | 0.1 |
| Example 7 | Argon Gas | Successful | 3 | 20 | 3 | 0.1 |
| Example 8 | Argon Gas | Successful | 2 | 20 | 3 | 0.1 |
| Example 9 | Argon Gas | Successful | 2 | 20 | 3 | 0.1 |
| Example 10 | Argon Gas | Successful | 1 | 5 | 2 | 0.1 |
| Example 11 | Nitrogen Gas | Successful | 1 | 5 | 2 | 3.0 |
| Example 12 | Air | Successful | 1 | 5 | 2 | 4.0 |
| Example 13 | Argon Gas | Successful | 1 | 5 | 2 | 0.1 |
| Example 14 | Argon Gas | Successful | 1 | 5 | 2 | 0.1 |
| Example 15 | Argon Gas | Successful | 1 | 5 | 2 | 0.1 |
| Example 16 | Argon Gas | Successful | 1 | 5 | 2 | 0.1 |
| Example 17 | Argon Gas | Successful | 1 | 5 | 2 | 0.1 |
| Example 18 | Argon Gas | Successful | 1 | 10 | 2 | 0.1 |
| Example 19 | Argon Gas | Successful | 4 | 30 | 2 | 0.1 |
| Example 20 | Argon Gas | Successful | 10 | 50 | 2 | 0.1 |
| Example 21 | Argon Gas | Successful | 10 | 50 | 2 | 0.1 |
| Example 22 | Argon Gas | Successful | 6 | 40 | 2 | 0.1 |
| Example 23 | Argon Gas | Successful | 12 | 70 | 2 | 0.1 |
| Comparative Example 1 | Argon Gas | Unsuccessful | 0 | 0 | — | — |
| Comparative Example 2 | Argon Gas | Unsuccessful | 0 | 0 | — | — |
| Comparative Example 3 | Argon Gas | Unsuccessful | 0 | 0 | — | — |
| Comparative Example 4 | Argon Gas | Unsuccessful | 0 | 0 | — | — |

As shown in Table 6, it was confirmed that, in Examples 1, 2-1 to 2-3, and 3 to 23, information can be read, and there is a correlation between the atomic force and the tunnel current obtained from the ferroelectric recording medium during reading.

Therefore, according to a method for applying a voltage to the electrostrictive element, information can be written to the ferroelectric storage apparatus, and written information can be read.

Examples 2-1 to 2-3

Ferroelectric recording media according to Examples 2-1 to 2-3 were manufactured in the same manner as in the Example 1 explained in the above-described [Production of ferroelectric recording medium] except that the ferroelectric recording medium according to Examples 2-1 to 2-3 have the configuration of Example 2 and that the ferroelectric recording medium according to Examples 2-1 to 2-3 had the compositions of the ferroelectric layers deposited by the deposition methods as shown in Table 7. Specifically, the electrode layer, the paraelectric layer, and the ferroelectric layer were deposited in the same manner as Example 2, the substrate was taken out from the deposition apparatus, and a diffraction strength of (111) plane of hafnium oxide of the ferroelectric layer was measured with respect to each Example. Using the manufactured ferroelectric layers, ferroelectric storage apparatuses were manufactured in the same manner as the Example 1, and a recording-and-reproduction test of the manufactured ferroelectric storage apparatuses and a measurement of a tunnel current difference during reading were performed. Table 7 shows test results.

In all of the Examples 2-1 to 2-3, the substrate temperature during deposition was 400° C. In the microwave plasma MOCVD method, as source gases, tetrakis (ethylmethylamide) hafnium was used as a hafnium source, and tetrakis (ethylmethylamide) zirconium was used as a zirconium source, and oxygen and argon were added with a ratio of 1:1. The reaction pressure was 100 Pa, and the input power was 800 W (2.45 GHz). In the MOCVD method, microwaves were not applied, and the substrates were heated only. With respect to the substrates taken out, XRD θ-2θ scan was performed, and the diffraction strength of (111) plane of hafnium oxide was measured. Table 7 shows the measurement results.

TABLE 7

| | Material | Crystal System and Structure | Lattice Constant [Å] | Deposition Method | Diffraction Intensity of (111) Plane (Any given value) | Recording and Reproduction | Measurement 1 (Tunnel Current Difference [pA]) | Measurement 2 (Tunnel Current Difference [pA]) | Measurement 3 (Amplitude of Signal from piezoelectric element [μV]) |
|---|---|---|---|---|---|---|---|---|---|
| | | | | | | Ferroelectric Storage Device | | | |
| Example 2 | $Hf_{0.5}Zr_{0.5}O_2$ | Orthorhombic Crystal System (*), Fluorite Type Structure | 5.1-5.3 | RF Sputter Method | 1450 | Successful | 3 | 20 | 3 |
| Example 2-1 | $4(Y_2O_3)$-$96(HfO_2)$ | Orthorhombic Crystal System (*), Fluorite Type Structure | 5.1-5.3 | RF Sputter Method | 1300 | Successful | 3 | 20 | 3 |
| Example 2-2 | $Hf_{0.5}Zr_{0.5}O_2$ | Orthorhombic Crystal System (*), Fluorite Type Structure | 5.1-5.3 | Microwave Plasma MOCVD Method | 1400 | Successful | 3 | 20 | 3 |
| Example 2-3 | $Hf_{0.5}Zr_{0.5}O_2$ | Orthorhombic Crystal System (*), Fluorite Type Structure | 5.1-5.3 | MOCVD Method | 800 | Successful | 1 | 10 | 3 |

(* Stable phase is a monoclinic, tetragonal, or cubic crystal systems.)

As shown in Table 7, it was confirmed that when the reaction field during deposition was assisted by plasma, the crystallinity of the ferroelectric layer was improved.

As shown in Table 7, it was confirmed that, in the Examples 2-1 to 2-3, information can be read, and there is a correlation between the atomic force and the tunnel current obtained from the ferroelectric recording medium during reading, similar to the Example 1. Therefore, in the Examples 2-1 to 2-3, according to a method for applying a voltage to the electrostrictive element, information can be written to the ferroelectric storage apparatus, and written information can be read.

Although the embodiment has been hereinabove explained, the above-described embodiment is presented as an example, and the present invention is not limited by the above-described embodiment. The above-described embodiment can be carried out in various other forms, and various combinations, omissions, replacements, changes, and the like can be made without departing from the subject matter of the invention. These embodiments and modifications are included in the subject matter of the invention, and are included in the invention described in claims and the scope equivalent thereto.

DESCRIPTION OF SYMBOLS 10 ferroelectric recording medium
11 substrate
12 electrode layer
13 ferroelectric recording layer
131 ferroelectric layer
131A data area
131B servo information area
131B-4 reference signal information
132 paraelectric layer
14 protection layer
15 lubricant layer
100 ferroelectric storage apparatus
23 probe slider
26, 26A, 26B, 26C conductive probe 261 base body
261a recessed portion
261b, 263b surface (principal surface)
262 needle-shaped electrode
263 insulating layer
263a through hole
27 piezoelectric element
27A first piezoelectric element
27B second piezoelectric element
30 ferroelectric recording medium driving unit
31 housing (bearing cylinder)
33 shaft member (spindle shaft)
332 groove portion
34 housing bottom portion
40 probe driving unit
50 recording-and-reproduction signal processing unit
60 housing
83 metal
320 external storage apparatus
321a storage surface
322 storage apparatus
323 read device
324 driving unit
324A first driving unit
324B second driving unit

What is claimed is:
1. A manufacturing method of a conductive probe that is configured to write information to and read information from a ferroelectric recording medium, the manufacturing method comprising:
forming, on a conductive material, an insulating layer by oxidizing the conductive material;
forming an isolation layer on the insulating layer;
applying a photoresist on the isolation layer;
forming a hole in the photoresist;
etching in the hole to the conductive material;
depositing metal on a surface of the conductive material in the hole, thereby obtaining a needle-shaped electrode; and
removing the isolation layer, wherein a portion of the needle-shaped electrode protrudes from the surface of the insulating layer.

2. The manufacturing method according to claim 1, wherein the hole is formed in a circular shape, a triangular shape, or a quadrangular shape.

\* \* \* \* \*